US009151868B2

(12) United States Patent
Levitan

(10) Patent No.: US 9,151,868 B2
(45) Date of Patent: *Oct. 6, 2015

(54) RESERVOIR ARCHITECTURE AND CONNECTIVITY ANALYSIS

(71) Applicant: BP Corporation North America Inc., Naperville, IL (US)

(72) Inventor: Michael M. Levitan, Dallas, TX (US)

(73) Assignee: BP Corporation North America Inc., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/284,552

(22) Filed: May 22, 2014

(65) Prior Publication Data

US 2014/0257775 A1 Sep. 11, 2014

Related U.S. Application Data

(63) Continuation of application No. 12/850,382, filed on Aug. 4, 2010, now Pat. No. 8,793,112.

(60) Provisional application No. 61/233,897, filed on Aug. 14, 2009.

(51) Int. Cl.
*G06G 7/48* (2006.01)
*G01V 99/00* (2009.01)
(Continued)

(52) U.S. Cl.
CPC .............. *G01V 99/005* (2013.01); *E21B 49/00* (2013.01); *G06F 17/5009* (2013.01)

(58) Field of Classification Search
CPC ... E21B 49/003; E21B 49/005; E21B 49/006; E21B 49/008; E21B 49/08; E21B 49/087; E21B 49/00; E21B 43/00; G01V 11/00; G06F 2217/16; G06F 17/5018

USPC ........................................................ 703/10
See application file for complete search history.

(56) References Cited

U.S. PATENT DOCUMENTS 4,969,130 A 11/1990 Wason et al.
5,247,829 A 9/1993 Ehlig-Economides
(Continued)

FOREIGN PATENT DOCUMENTS

CN 1898675 A 1/2007
WO 01/62603 A2 8/2001
(Continued)

OTHER PUBLICATIONS

PCT International Search Report and Written Opinion of the Searching Authority issued in related patent application No. PCT/US2010/044415, mailed Apr. 6, 2011, 12 pages.
(Continued)

*Primary Examiner* — Saif Alhija
(74) *Attorney, Agent, or Firm* — John L. Wood

(57) ABSTRACT

An interactive system and method of operating the system to define and evaluate a model of a hydrocarbon reservoir. The reservoir model is defined from extrinsic information such as seismic surveys, well logs, and the like, and is based on elements of formation regions, connections among the regions, wells, and perforations. A boundary-element method is used to determine pressure interference responses, corresponding to the pressure at a perforation in response to a single perforation producing fluid at a unit flow rate. These pressure interference responses are then convolved with measured well flow rates obtained during production to arrive at estimates of the wellbore pressure at one or more wells of interest. The estimated wellbore pressure can be compared with downhole pressure measurements to validate the reservoir model, or to provoke the user into modifying the model and repeating the evaluation of the model.

21 Claims, 24 Drawing Sheets

(51) Int. Cl.
*E21B 49/00* (2006.01)
*G06F 17/50* (2006.01)

(56) References Cited

U.S. PATENT DOCUMENTS

| | | | |
|---|---|---|---|
| 5,247,830 | A | 9/1993 | Goode |
| 5,992,519 | A | 11/1999 | Ramakrishnan et al. |
| 6,999,878 | B2 | 2/2006 | Manin |
| 7,079,952 | B2 | 7/2006 | Thomas et al. |
| 7,140,434 | B2 | 11/2006 | Chouzenoux et al. |
| 2004/0010374 | A1 | 1/2004 | Raghuraman et al. |
| 2009/0084545 | A1* | 4/2009 | Banerjee et al. ......... 166/250.15 |
| 2009/0164188 | A1 | 6/2009 | Habashy et al. |

FOREIGN PATENT DOCUMENTS

| | | |
|---|---|---|
| WO | 2005074592 A2 | 8/2005 |
| WO | 2009/075945 A1 | 6/2009 |

OTHER PUBLICATIONS

Kikani et al., "Pressure-Transient Analysis of Arbitrarily Shaped Reservoirs With the Boundary-Element Method", SPE Formation Evaluation (Mar. 1992), pp. 53-60.

Kikani et al., "Modeling Pressure-Transient Behavior of Sectionally Homogeneous Reservoirs by the Boundary Element Method", SPE Formation Evaluation (Jun. 1993), pp. 145-152.

Levitan et al., "General Heterogeneous Radial and Linear Models for Well Test Analysis", 70th Annual Technical Conference and Exhibition, Paper No. SPE 30554 (1995), pp. 225-238.

Bourgeois et al., "Additional Use of Well Test Analytical Solutions for Production Prediction", 1996 SPE European Petroleum Conference, Paper No. SPE 36820 (1996), pp. 1-14.

Levitan, "Practical Application of Pressure/Rate Deconvolution to Analysis of Real Well Tests", SPE Reservoir Evaluation and Engineering (Apr. 2005), pp. 113-121.

Levitan et al., "Practical Considerations for Pressure-Rate Deconvolution of Well-Test Data", SPE Journal (Mar. 2006), pp. 35-47.

Levitan, "Deconvolution of Multiwell Test Data", 2006 SPE Technical Conference and Exhibition, Paper No. SPE 102484 (2006), pp. 1-10.

Von Schroeter et al., "Deconvolution of Well-Test Data as a Nonlinear Total Least-Squares Problem", SPE Journal, Paper No. SPE 77688, (2004), pp. 375-390.

Whittle, "The Determination of Minimum Tested Volume from the Deconvolution of Well Test Pressure Transients", 2008 SPE Annual Technical Conference and Exhibition, Paper No. SPE 116575 (2008), pp. 1-9.

Landa, "Integration of Well Testing Into Reservoir Characterization", Transient Well Testing (Kamal, ed.) (SPE, 2009), pp. 787-813.

Houze, "Outer Boundaries", Transient Well Testing (Kamal, ed.) (SPE, 2009), pp. 133-178.

* cited by examiner

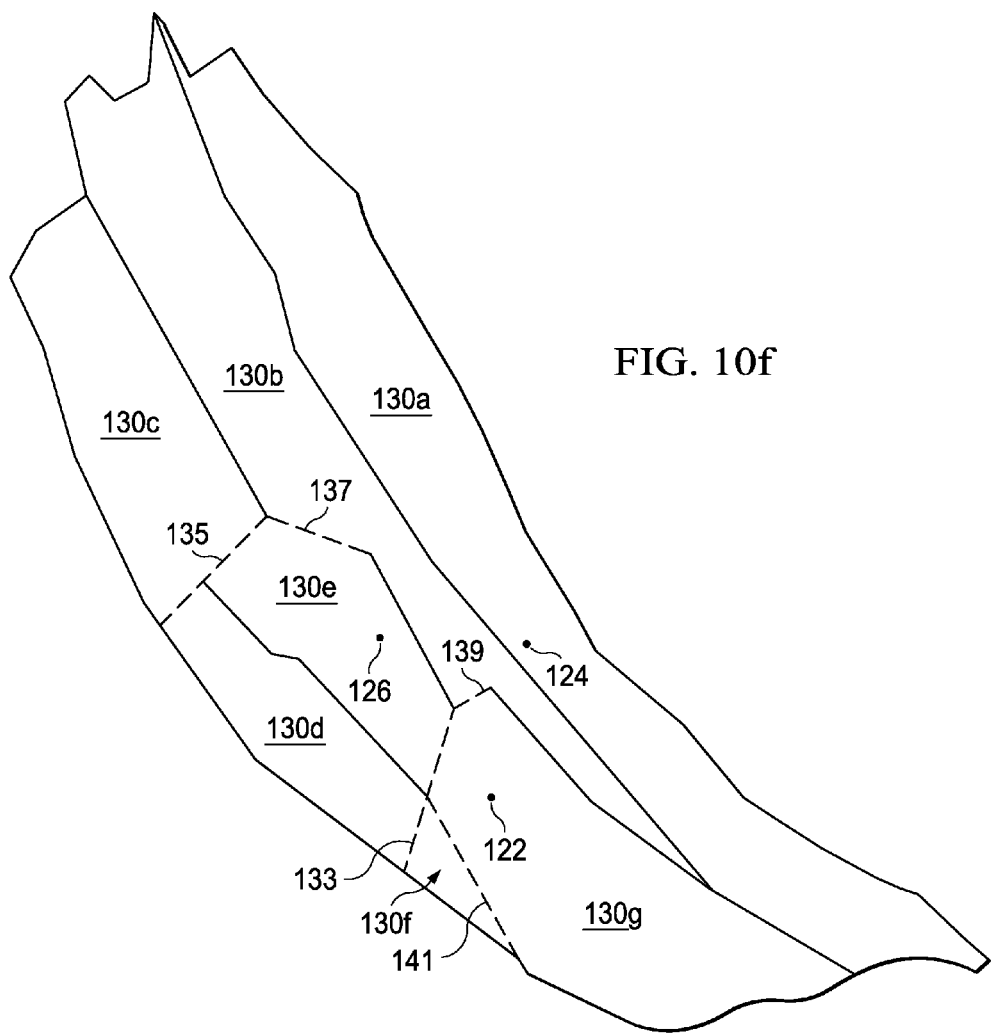

RESERVOIR ARCHITECTURE AND CONNECTIVITY ANALYSIS

CROSS-REFERENCE TO RELATED APPLICATIONS

This application is a continuation, under 35 U.S.C. §120, of application Ser. No. 12/850,382, filed Aug. 4, 2010, which claims priority, under 35 U.S.C. §119(e), of Provisional Application No. 61/233,897, filed Aug. 14, 2009, incorporated herein by this reference.

STATEMENT REGARDING FEDERALLY SPONSORED RESEARCH OR DEVELOPMENT

Not applicable.

BACKGROUND OF THE INVENTION

This invention is in the field of oil and gas production. Embodiments of this invention are more specifically directed to the analysis of production field measurements for purposes of well and reservoir management.

The current economic climate emphasizes the need for optimizing hydrocarbon production. Such optimization is especially important considering that the costs of drilling of new wells and operating existing wells are high by historical standards, largely because of the extreme depths to which new producing wells must be drilled and because of other physical barriers to discovering and exploiting reservoirs. These high economic stakes require operators to devote substantial resources toward effective management of oil and gas reservoirs, and effective management of individual wells within production fields.

For example, the optimization of production from a given field or reservoir involves decisions regarding the number and placement of wells, including whether to add or shut-in wells. Secondary and tertiary recovery operations, for example involving the injection of water or gas into the reservoir, require decisions regarding whether to initiate or cease such operations, and also how many wells are to serve as injection wells and their locations in the field. Some wells may require well treatment, such as fracturing of the wellbore if drilling and production activity have packed the wellbore surface to the extent that production has slowed. In some cases, production may be improved by shutting-in one or more wells for an extended period of time, in which case the optimization of production may require reconfiguring the entire production field. All of these actions are performed with an eye toward maximizing production at minimum cost. As evident from these examples and as known in the art, the optimization of a production field is a complex problem, involving many variables and presenting many choices.

This problem is exacerbated by the complexity and inscrutability of the sub-surface "architecture" of today's producing reservoirs. As mentioned above, current-day oil and gas reservoirs are often at extreme depths or in otherwise difficult geographical locations, both on land or offshore, because those reservoirs that are easy to reach have already been developed and produced. These extreme depths and relative inaccessibility limit the precision and accuracy of the necessarily indirect methods used to characterize the structure and location of the hydrocarbon-bearing reservoirs. In addition, the sub-surface structure of many reservoirs presents complexities such as variable porosity and permeability of the rock, and such as fractures and faults that compartmentalize formations in the reservoir and complicate sub-surface fluid flow. As known in the art, the ability of conventional exploration technologies of seismic prospecting, magnet surveying, and gravitational surveying to accurately portray the structure and contents of sub-surface strata becomes poorer as the depth of interest increases.

Accordingly, while seismic exploration and similar techniques provide important information from which the structure and properties of the sub-surface can be inferred, that information has, at best, a relatively coarse spatial resolution. The resolution of these surveys is even coarser for those regions in which salts and similar features or strata attenuate or distort seismic energy. As a result, the understanding of the structure and connectivity of sub-surface features provided by seismic and similar surveys is necessarily imprecise.

Conventional well logs provide important information regarding the location and properties of sub-surface strata during and after the drilling of exploratory, development, and production wells. These well logs yield direct information regarding depths, thicknesses, and material properties of sub-surface formations and strata. However, the information gained from well logs is valid only at the specific location of the well, and provides little visibility into the reservoir at any significant distance away from the well. Furthermore, as the depths of interest for newly developed formations increase, so does the cost of drilling and logging exploratory wells. For these reasons, well logs provide only limited insight into the sub-surface structure, architecture, and connectivity of many newly-developed and producing reservoirs.

In recent years, advances have been made in improving the measurement and analysis of parameters involved in oil and gas production, with the goal of improving production decisions. For example, surface pressure gauges and flow meters deployed at the wellhead, and also in surface lines interconnecting wellheads with centralized processing facilities, are now commonly monitored on virtually a continuous basis. Furthermore, reliable downhole pressure sensors are now often plumbed into the production string and left in the wellbore during production. The improved reliability of these sensors, even at elevated downhole temperatures and pressures, has enabled widespread deployment of real-time downhole pressure sensors that continuously monitor downhole pressure during production.

As known in the art, the manner in which downhole pressure and flow rate evolve over time provides insight into the reservoir pressure in the region around the well. Reservoir pressure is an important parameter in understanding the reservoir and how to optimize production, because the rate at which oil or gas will flow into the wellbore downhole (and thus out of the well at the surface) strongly depends on the difference between the reservoir pressure and the back pressure exerted by the fluid in the wellbore. Over time, the volume of oil or gas drawn out of the well will generally reduce the reservoir pressure and the rate of production will fall.

The evolution of well downhole pressure and flow rate over time depends on the rock properties (e.g., permeability, porosity, etc.) throughout the reservoir, on barriers to flow within the reservoir, and on the reservoir boundaries. As such, it is possible to obtain information about these properties by analyzing the transient behavior of downhole pressure and the rates of producing wells.

While these downhole pressure measurement data are theoretically valuable in understanding reservoir behavior, the ability of conventional techniques to characterize and evaluate reservoir architecture and connectivity remains somewhat limited. As known in the art and as mentioned above, the evolution of downhole measured pressure with time is closely related to the flow rate from the well, as well as dependent on the reservoir properties of permeability, reservoir heterogeneities, faults, boundaries, and dependent on the overall shape and volume of the reservoir compartment being drained by the well, as mentioned above. Because the goal of pressure analysis is to understand the reservoir properties, it is desirable to minimize the effects of flow rate variation on the well pressure behavior, which can be done by flowing the well at a constant well rate. In this case, the response of downhole pressure to a constant flow rate is a useful characteristic because it reflects the reservoir properties and is not affected by rate changes. Unfortunately, it is difficult to maintain the flow rate of a well precisely constant for an extended period of time. Rather, well flow rates typically change over time. Furthermore, the pressure response to changes in flow rate has a very long time constant, and as such long-ago periods in the flow rate history of a well affect its current downhole pressure.

One approach to obtaining constant-rate pressure response from a well, for the purpose of characterizing the reservoir, is to carry out a "shut-in" or "pressure build-up" test, after the well has produced for some significant time. This approach of recovering reservoir properties from bottomhole measured pressure data is more generally referred to as pressure transient analysis ("PTA"). According to this approach, the well under analysis is flowed at a reasonable constant non-zero flow rate for some time, and is then shut-in for a period of time while the downhole pressure is measured. Because the well flow rate is essentially constant, at zero, during the "shut-in" period, the transient behavior of bottomhole pressure during the shut-in period primarily reflects the reservoir properties. Several shut-in and draw-down intervals are typically included within a single well test. Techniques are known in the art for recovering the pressure response from these variable-rate data. One conventional approach considers the pressure response to a sequence of flow rates as the superposition of several constant-flow conditions; the resulting pressure response is then plotted over "superposition time", and can be readily analyzed. However, PTA well tests are costly from the standpoint of lost production, and also require significant operator involvement to carry out the shut-in and operation at a constant flow rate, especially given the time period required for such a test (which can extend over several days or weeks).

During an early period of time after flow starts, reservoir boundaries have no effect on dynamic pressure behavior, because the effects of the well production have not yet reached the reservoir boundaries. Analysis of the pressure response under this "infinite-acting" assumption is useful in characterizing properties of the formation near the well, and is valid for a radius of interest until the effects of the reservoir boundary appear. After such time as the effects of reservoir boundaries on the pressure response are observed, conventional pressure-transient analysis of the "boundary-dominated" response can provide some insight into those boundaries. For example, the time at which the pressure response deviates from that expected under the infinite-acting assumption can indicate the distance of a reservoir boundary from the wellbore. In addition, attributes of the pressure response under boundary-dominated conditions can indicate whether the boundary is of a "no-flow" type, or if instead the boundary is abutted by some other source of pressure, such as an aquifer. However, the ability of conventional pressure transient analysis to provide significant information regarding the detailed structure of the reservoir is limited by the absence of directionality in the pressure measurements. The extremely long well test time required to detect and analyze these boundary effects also limits the quantity of valid analyzable boundary-dominated pressure response data.

Pressure-rate deconvolution is another known approach to identifying the constant-rate pressure response of a given well, from downhole pressure measurements gathered during production or other time periods in which the flow rate is in fact not constant. A detailed discussion of pressure-rate deconvolution is presented in Levitan et al., "Practical Considerations for Pressure-Rate Deconvolution of Well-Test Data", *SPE Journal* (March 2006), pp. 35-47, incorporated herein by reference. Pressure-rate deconvolution is based on the relationship of time-varying pressure $p_i(t)$ at well i to the time-varying well flow rate $q_i(t)$, expressed in the form of a convolution integral:

$$p_i(t) = p_i^0 - \int_0^t q_i(\tau) \frac{dP(t-\tau)}{d\tau} d\tau \qquad (1)$$

In this convolution integral, $dP(t)/dt$ is the time-dependent behavior of downhole pressure in response to production at a unit flow rate, beginning from an initial pressure $p_i^0$ at time-zero. zero. It is this downhole pressure response $dP(t)/dt$ to an arbitrary unit of flow rate that is useful in characterizing the properties of the formation, as known in the art. The above-referenced Levitan et al. article describes a method for deconvolving the time-varying flow rate from the time-varying pressure behavior from the convolution integral, to yield this downhole pressure response. While pressure-rate deconvolution extends the time of analysis, and thus extends the radius of investigation, from that provided by superposition and other PTA approaches, the flow rate and pressure data are still subject to certain constraints on data quality and consistency in order to satisfy the assumptions underlying the convolution integral. The time over which data suitable for pressure-rate deconvolution can be gathered and reasonably deconvolved remains limited to that provided by a conventional well test, which typically does not run beyond two weeks or so. In typical production fields, this limited test duration limits the radius of investigation to about several thousand feet from the well.

As mentioned above, conventional well tests are performed on individual wells, one at a time. However, in typical production fields, multiple wells are producing from the same formation at the same time, and the flow from each well producing from a given formation not only affects the wellbore pressure for that well, but also affects the wellbore pressure in other wells producing from that same formation and from other formations connected to that well. Accordingly, for pressure-transient analysis or single-well pressure-rate deconvolution to be valid for a particular well, the well test must either be performed with all other nearby wells shut-in, or the radius of investigation must be sufficiently limited so that the effects of neighboring wells are not a factor. These constraints thus dramatically increase the cost of a well test (and thus reduce the frequency of such testing), and decrease the usefulness of the well test in exploring formation structure and connectivity.

As mentioned above, real-time downhole pressure measurements are now commonly acquired during production. To avoid the cost of well tests, it is desirable to use the large volume of pressure and rate data acquired during production from the field. However, conventional pressure transient analysis is limited in its ability to analyze these not-so-well-behaved pressure and rate data acquired during production. In addition, the complexity presented by the inter-well effects mentioned above also overwhelms these conventional approaches.

By way of further background, a more general expression of the pressure-rate convolution integral in the case of multiple wells drawing from the same formation or reservoir is provided in Levitan, "Deconvolution of Multiwell Test Data", 2006 *Annual Technical Conference and Exhibition*, Paper No. SPE 102484 (2006), incorporated herein by reference. That expression is:

$$p_i(t) = p_i^0 - \sum_j \int_0^t \frac{dP_{ij}(\tau)}{d\tau} q_j(t-\tau) d\tau \qquad (2)$$

where well i represents the well of interest, and where index j refers to each well in the production field (the set of j wells including well i itself). According to this convolution interval, a pressure response term $$\frac{dP_{ij}(\tau)}{d\tau}$$

refers to the pressure response at well i to a unit flow rate produced from well j, where well i is included in the set of wells j (i.e., $$\frac{dP_{ii}(\tau)}{d\tau}$$

corresponds to the single well pressure response used in conventional pressure-rate deconvolution for single well analysis). According to this approach, the generalization of pressure-rate deconvolution to the multi-well case allows reconstruction of the matrix $P_{ij}$ of constant-rate pressure interference responses from the pressure and rate data acquired from several producing wells in the field. Analysis of these responses enables one to draw conclusions about the reservoir properties in relation to each of the wells involved. This brings directionality into consideration, and thus enables the recovery of more detailed information about reservoir properties, including information regarding its connectivity, shape, architecture, and volume.

Despite all of the limitations to measurement of reservoirs and sub-surface properties, reservoir management decisions must still be made, and therefore will be made using the best available yet incomplete understanding of the structure of the reservoir. As mentioned above, these reservoir management decisions include whether and where to place additional production wells, whether and where to inject gas or other substances for secondary recovery operations, and the like. Well management decisions, such as whether, when, and how to workover an existing production well to improve its production output, must also be made, even if based on a limited understanding of the reservoir. And, of course, short-term and long-term economic analysis of the reservoir is also important to the operator and the financial backers of the project.

In order to make these decisions, reservoir engineers commonly develop models of reservoir behavior. Conventional reservoir models are based on seismic and other geological surveys of the production field, along with conclusions that can be drawn from well logs, pressure transient analysis, and the like. These models are applied to conventional reservoir "simulator" computer programs, by way of which the reservoir engineer can analyze the behavior of the reservoir under production conditions, and by way of which the engineer can simulate the behavior of the reservoir in response to potential reservoir management actions (i.e., "what-if" analysis). Some reservoir simulators approximate fluid flow in the reservoir on a grid of geometric elements, and numerically simulate fluid flow behavior using finite-difference or finite-element techniques to solve for pressure and flow conditions within and between elements in the grid. Simulation of the reservoir behavior is then attained by stepping in time and evolving the inter-element flows and the pressures at each grid element over a sequence of the time steps. However, serious limitations in these conventional finite-element and finite-difference models and simulator techniques preclude their ability to simulate the pressure transient behavior in the wellbore to an extent that could be directly compared with the actual pressure measurements obtained by downhole gates in the wells.

In order to optimize the management of a reservoir, it is desirable for reservoir engineers to validate the reservoir models and simulators based on measurements of the actual performance at the wells. Such validation of the reservoir models allows the reservoir engineer to modify and thus improve the model in response to discrepancies between expected and observed behavior, with the goal of improving the fidelity of the model to the reservoir as observed. However, given the limitations described above, it is difficult to correlate reservoir simulations with measurements of flow rate, temperatures, downhole pressure, and the like obtained during production and during shut-in and draw-down events. On one hand, as described above, the resolution of seismic and other conventional geological surveys is relatively coarse. Conventional finite-element and finite-difference simulators also have relatively coarse resolution, in that the pressure and flow estimates generated by the simulators are averages over each grid element. To maintain reasonable computing times for the simulators, even with today's high-speed computers, the resolution of the grid elements cannot be much smaller than 100 feet, considering that the number of computations required for such simulators typically scale with the cube of the number of grid elements. On the other hand, downhole pressure measurements obtained from the wellbore are spatially precise, in that the sensed pressure is the pressure only at the wellbore location (i.e., corresponding to the pressure within only a small radius of the wellbore, such as one foot), and are not necessarily representative of the average pressure of the surrounding volume at a radius of 100 feet. Therefore, even if the model were accurate, the simulated reservoir pressure for a grid element may not match the measured reservoir pressure at the precise location of the well within the grid volume.

To summarize, conventional reservoir modeling and data gathering and analysis techniques are limited in several ways. These conventional approaches are generally limited to the single-well situation, and thus cannot comprehend the real-world situation of multiple wells producing from the same formation. In addition, the time duration that can be analyzed using these conventional approaches is necessarily limited, especially considering that inter-well effects on pressure measurements must be avoided. Accordingly, the visibility of this analysis at significant distances from the wellbore into the formation is limited. In addition, only simple reservoir geometries are suitable for analysis by these conventional techniques.

Unfortunately, these complexities are in fact present in many reservoirs, especially in those oil and gas reserves that are currently being developed at extreme depths and at remote locations. As such, substantial differences between reservoir behavior as predicted by the model and reservoir behavior as observed via downhole pressure measurements and other measurements often result. Therefore, despite the availability of a large amount of real-time downhole pressure data from modern-day production fields, good correlation of that data with conventional reservoir models is seldom attained.

Conventional reservoir models and simulators are also not conducive to efficient reconfiguration and modification. Ideally, reservoir engineers would carry out multiple iterations of adjusting the reservoir model in response to discrepancies between observed performance and that predicted by the model, followed by verification of the modified model with the actual reservoir behavior as measured, to ultimately converging to an accurate reservoir model. But known numerical reservoir modeling and simulation techniques are not well-suited for iterative modification in this manner. For example, the numerical approaches of finite-element and finite-difference analysis require re-gridding of the entire reservoir in response to any change in reservoir shape or boundary geometry, no matter how small the change. In addition, long computing times are required to execute these conventional numerical simulators, reducing the ability to interactively modify the model to correspond to observed data, even if good correlation between model and measurements were achievable in the first place.

By way of further background, boundary-element formulations of the pressure-transient analysis problem are described in Kikani et al., "Pressure-Transient Analysis of Arbitrarily Shaped Reservoirs With the Boundary-Element Method", *SPE Formation Evaluation* (March 1992), pp. 53-60; and in Kikani et al., "Modeling Pressure-Transient Behavior of Sectionally Homogeneous Reservoirs by the Boundary-Element Method", *SPE Formation Evaluation* (June 1993), pp. 145-52, both incorporated herein by this reference.

By way of further background, an approach to pressure transient analysis that is useful in generalized radial and linear models with heterogeneities is described in Levitan et al., "General Heterogeneous Radial and Linear Models for Well Test Analysis", *70th Annual Technical Conference and Exhibition*, Paper No. SPE 30554 (1995), pp. 225-38, incorporated herein by this reference.

BRIEF SUMMARY OF THE INVENTION

Embodiments of this invention provide a computerized system and method of operating a computerized system that enable a user to efficiently and interactively develop and validate a reservoir model that closely matches the observed behavior of downhole well measurements.

Embodiments of this invention further provide such a system and method in which downhole well measurements, such as pressure, that are acquired over very long periods of time are useful in the development and validation of the reservoir model.

Embodiments of this invention further provide such a system and method in which the reservoir model so developed and validated can comprehend multiple layers or formations in the earth that are connected through sub-surface structures or via the wells themselves.

Embodiments of this invention further provide such a system and method in which the reservoir model so developed and validated can represent relatively complex reservoir geometry and interconnection.

Embodiments of this invention further provide such a system and method in which the effects of neighboring wells, and wells in connected formations, on the downhole well measurements can be accounted for in developing and validating the reservoir model.

Embodiments of this invention further provide such a system and method in which one or more of these benefits can be obtained for oil wells, and for gas wells.

Embodiments of this invention further provide such a system and method in which one or more of these benefits can be obtained in case of turbulent flow environments downhole.

Embodiments of this invention further provide such a system and method that can assist in the allocation of production among multiple formations produced by a common well.

Embodiments of this invention further provide such a system and method that can assist in the economic evaluation of a production field and of the sub-surface formations and reservoirs.

Other objects and advantages of embodiments of this invention will be apparent to those of ordinary skill in the art having reference to the following specification together with its drawings.

Embodiments of this invention may be implemented into a computerized system programmed to interactively derive and validate a model of a sub-surface hydrocarbon reservoir, relative to downhole measurements. A model of the reservoir is defined by a user, based on seismic or other survey information. This model defines the reservoir as a plurality of different classes of elements, including regions of sub-surface formations and associated properties, connections between the regions and the properties of those connections, networks of the regions according to the connections, and wells intersecting the formation regions, each well including one or more perforations corresponding to the intersection by that well with a formation region. The system solves a fluid flow problem defined by the reservoir construction established by the elements to evaluate inter-well pressure responses $P_{ij}$ between each well j in the model and a well of interest i. Measurements of actual flow rate over time at each of the wells are then applied, by way of superposition, to yield a model estimate of downhole pressure over time at the well of interest, for comparison with actual downhole pressure measurements. The user can interactively modify the reservoir model, in response to that comparison, and then evaluate the modified reservoir model.

According to another aspect of the invention, if turbulent flow exists in the formation in close proximity to the well, the pressure and rate responses $P_{ij}$ at the perforation level are determined and applied by superposition to compute the bottomhole pressure, and the rate contributions from each perforation in the well.

The principle of superposition is not directly applicable in gas wells, because of non-linearities introduced by the dependence of compressibility and viscosity of gas on pressure. According to another aspect of the invention, the principle of superposition is applied to the gas flow problem, formulated in terms of a pseudo-pressure variable, in combination with material balance correction.

BRIEF DESCRIPTION OF THE SEVERAL VIEWS OF THE DRAWING

FIGS. 10a through 10i are maps and plots illustrating an example of the operation of an embodiment of the invention.

DETAILED DESCRIPTION OF THE INVENTION

This invention will be described in connection with one or more of its embodiments. More specifically, this description refers to embodiments of this invention that are implemented into a computer system programmed to carry out various method steps and processes, corresponding to a sub-surface hydrocarbon-bearing reservoir, because it is contemplated that this invention is especially beneficial when used in such an application. However, it is also contemplated that this invention may be beneficially applied in other systems and processes. Accordingly, it is to be understood that the following description is provided by way of example only, and is not intended to limit the true scope of this invention as claimed.

Figure 1A:
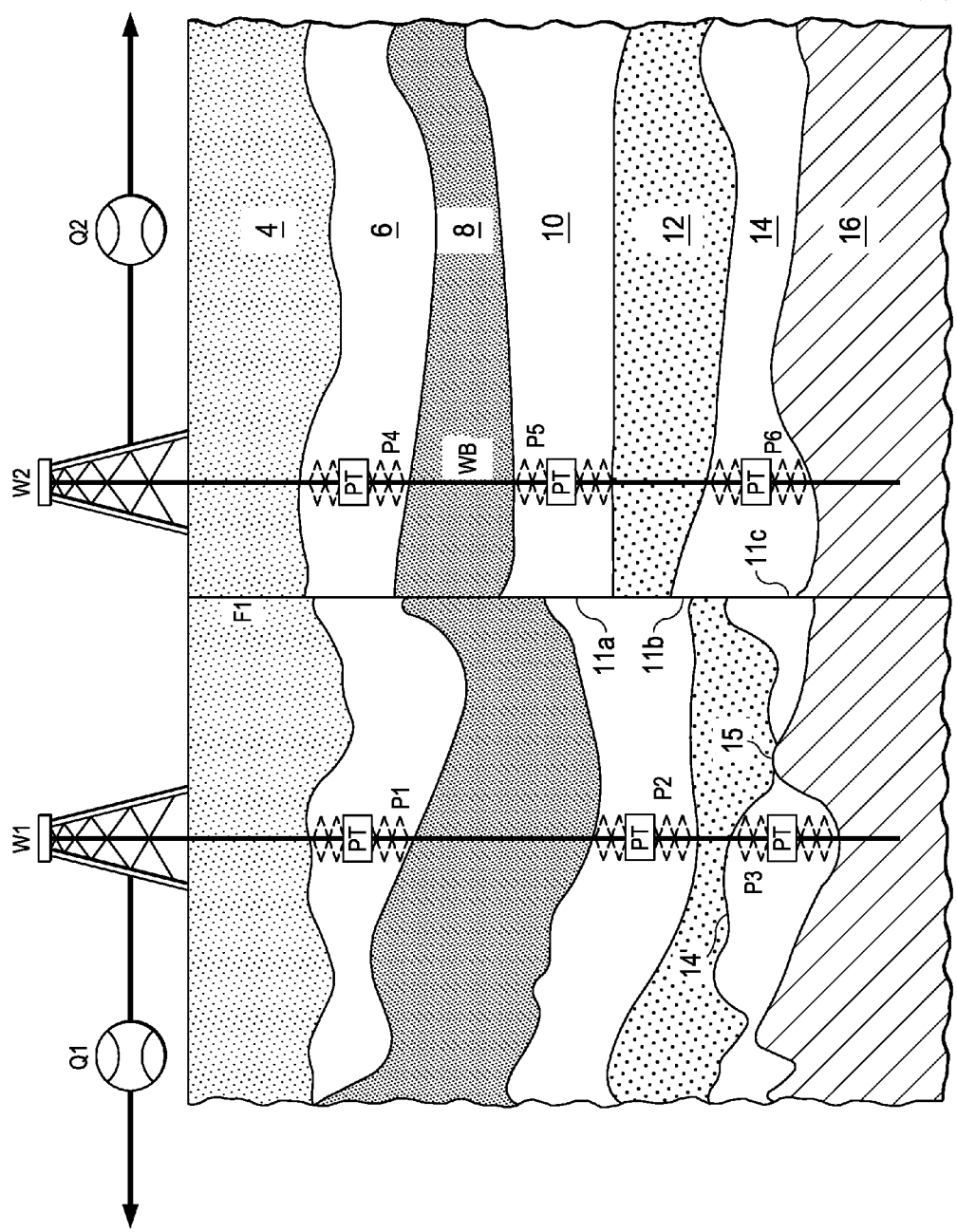
FIG. 1a is an elevation view and FIG. 1b is a plan view of a portion of a production field in connection with which embodiments of the invention can be implemented.

For purposes of providing context for this description, FIG. 1a illustrates, in cross-section, a small portion of a production field in connection with which embodiments of this invention are utilized. In this example, multiple wells W1, W2 are deployed in a terrestrial environment, and extend into the earth through multiple sub-surface strata. In this example, the reservoir being exploited includes strata 6, 10, 14, which are hydrocarbon-bearing formations and as such are capable of producing oil, gas, or both (and perhaps also water) into wells W1, W2. Non-producing strata include surface formation 4, and formations 8, 12, 16 that are at depths between producing formations 6, 10, 14 in this example. Each of wells W1, W2 is in communication with these producing formations 6, 10, 14 by way of perforations. In this example, hydrocarbons from formation 6 flow into well W1 via perforation P1, and into well W2 via perforation P4; hydrocarbons from formation 10 flow into well W1 via perforation P2, and into well W2 via perforation P5; and hydrocarbons from formation 14 flow into well W1 via perforation P3, and into well W2 via perforation P6.

In this example, downhole transducers are deployed into each of wells W1, W2, for measuring such parameters as downhole pressure, downhole temperature, and the like. Examples of these transducers are illustrated in FIG. 1a by way of pressure transducers PT, each deployed at a corresponding one of perforations P1 through P6. The number and location of pressure transducers PT, and any other downhole measurement equipment (not shown) can of course vary from that shown in FIG. 1a. For purposes of embodiments of this invention, however, at least periodic measurements of downhole pressure from at least one depth in at least one well of interest are acquired and retained in connection with the reservoir modeling and evaluation system and process of this invention. Of course, additional visibility into the architecture and connectivity of the reservoir will be provided by obtaining additional downhole pressure measurements at multiple depths and from multiple wells.

Surface measurements are also obtained from wells W1, W2 in this example. These surface measurements can include measurement of such parameters as temperature, pressure, valve settings, and the like. For purposes of embodiments of this invention, the surface measurements include measurements of the flow rate output by wells W1, W2, which in this example are obtained by way of surface flow meters Q1, Q2. At least periodic measurements of the flow rate output from wells W1, W2 as a whole (i.e., without necessarily obtaining measurements from each individual perforation P1 through P6 producing into wells W1, W2) are acquired and retained in connection with the reservoir modeling and evaluation system and process of this invention.

As evident in the example shown in FIG. 1a, fault F1 is present between wells W1, W2. Fault F1 in this case disrupts hydrocarbon-bearing formations 10, 14, effectively shifting downward boundaries of formations 10, 12, 14 in the region of well W1, relative to those formations in the region of well W2. Indeed, fault F1 has the effect of establishing connection 11a of reduced cross-section (relative to the thickness of formation 10) between two portions of formation 10 (i.e., the portions produced by wells W1, W2, respectively), establishing connection 11b between formation 10 and formation 14, and establishing connection 11c of reduced cross-section between portions of formation 14. In addition, whether due to fault F1 or otherwise present, well W1 produces from formation portion 14' that is not in communication with the portion of formation 14 produced by well W2, due to interface 15 between formations 12, 16.

Figure 1B:
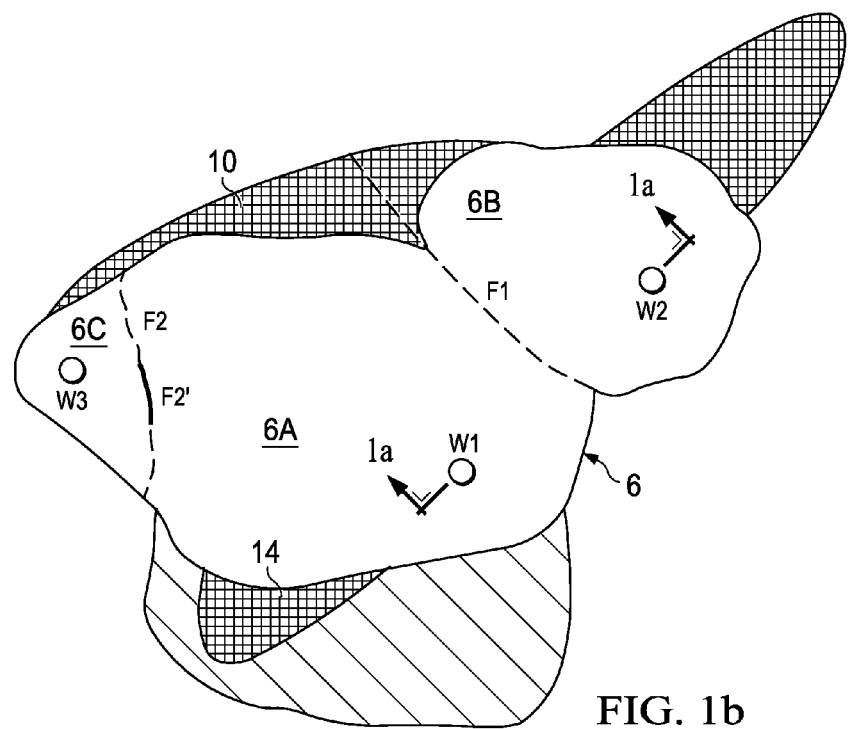

FIG. 1b illustrates hydrocarbon-bearing formations 6, 10, 14 of this portion of the production field in plan view, including wells W1, W2 and also well W3. As evident from FIG. 1b, hydrocarbon-bearing formations 6, 10, 14 do not necessarily align with one another geographically. The presence of fault F1 is shown in FIG. 1b, as located between wells W1, W2. In addition, FIG. 1b illustrates fault F2 at another location of the production field, disposed in formation 6 between wells W1 and W3. Fault F2 includes portion F2' through which flow is completely blocked within formation 6; the remainder of fault F2 outside of portion F2' allows fluid communication, although perhaps the cross-section of formation 6 along that length of fault F2 may be of reduced cross-section (relative to the thickness of formation 6).

As evident from even this relatively simple region of the production field shown in FIGS. 1a and 1b, the architecture and connectivity of the reservoir including hydrocarbon-bearing formations 6, 10, 14 defines a relatively complex fluid flow problem, insofar as the behavior of actual flowing oil and gas is concerned. As fundamental in the art, the flow rate of hydrocarbons from a well depends on such factors as the reservoir pressure, hydrostatic pressure in the well at the depths of the producing formations, porosity and permeability of the formation rock, and viscosity of the fluid, to name a few. However, the reservoir pressure at the specific location of a particular well depends on various factors, including the flow rate from that well over time (and thus the remaining fluid volume in the reservoir), but also including the flow rate over time from other wells in communication with the well of interest. The communication of fluid within a formation is affected by faults and the like. As discussed above, fluid communication can occur between formations because of faults, and also occurs within the wellbore of those wells producing from multiple formations. Other complicating fluid effects include turbulence in the wells, wellbore storage, and the like. Modeling of fluid movement within a producing hydrocarbon reservoir can therefore become quite complicated, even in the presence of relatively few features in a relatively small domain.

This relationship between downhole pressure and flow rate is useful in analyzing the performance of a specific well, such as the "skin" at the borehole, and also in determining reservoir-wide parameters, such as reservoir pressure and permeability of the surrounding reservoir formation. This relationship is typically characterized, for a given well of interest, by way of a pressure transient test, either in the form of a "shut-in" (or "build-up") test, or a "drawdown" test. In the shut-in test, the downhole pressure is measured over time, beginning prior to shutting-in the well and continuing after shut-in. The reservoir pressure is determined from the measurement of the downhole pressure at such time as the time-rate-of-change of pressure stabilizes, following the shut-in event. Conversely, a well can be characterized in a drawdown test, which is the opposite of a shut-in test in that the flow is measured before, during, and after a dramatic increase in well flow, such as opening the choke from a shut-in condition, preferably to a setting that produces a constant flow rate from the well.

Figure 1C:
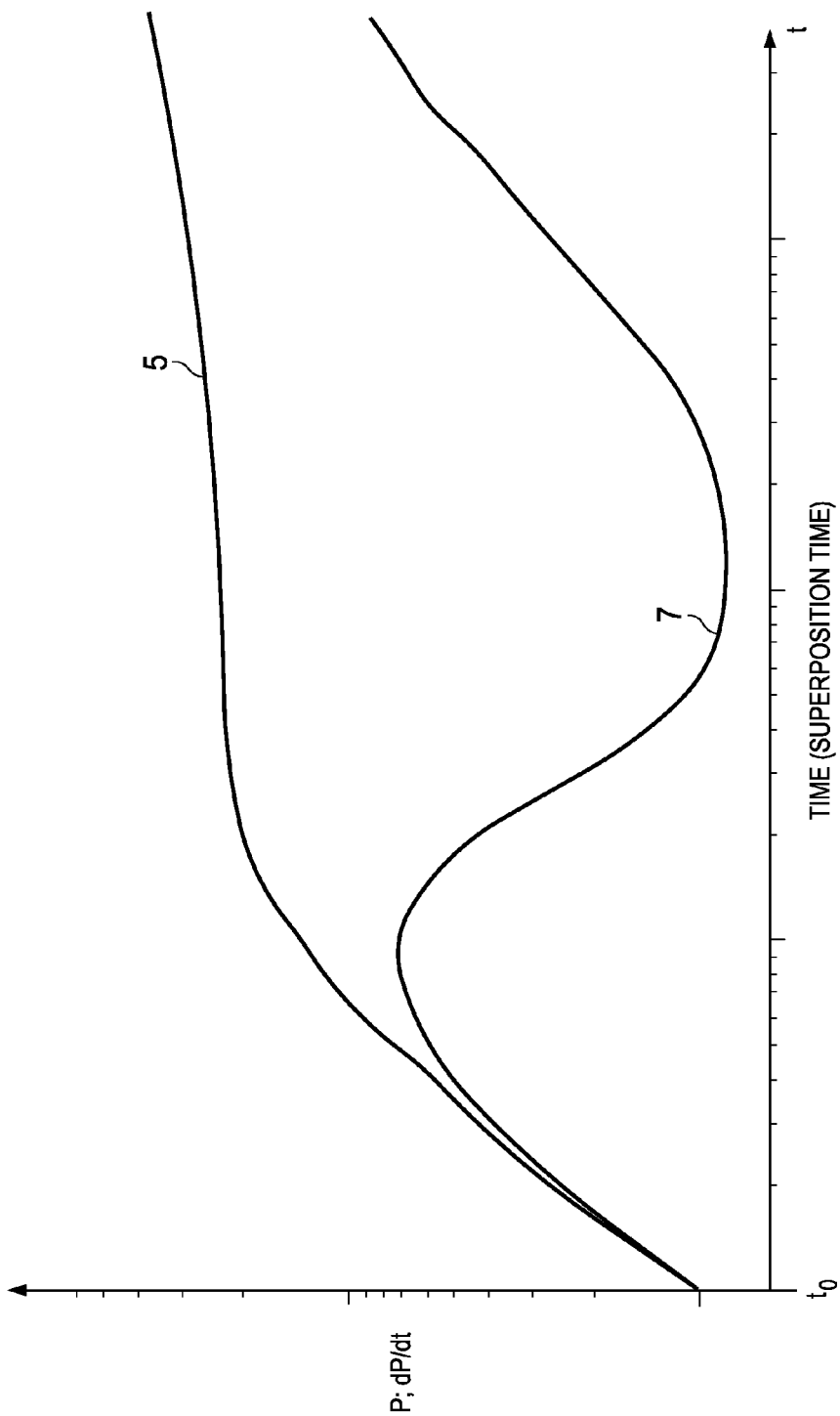
FIG. 1c is a plot of pressure change and of the derivative of pressure with respect to superposition time after shut-in of a well in the production field of FIGS. 1a and 1b.

FIG. 1c illustrates a typical shut-in test result, expressed in the usual form as pressure and its derivative with respect to the time measure commonly referred to in the art as "superposition time", plotted on a log-log scale versus elapsed time after the most recent flow rate change. In FIG. 1c, curve 5 corresponds to the change in downhole pressure measured at the well of interest beginning with shut-in of the well at time $t_0$, while curve 7 is the derivative (dP/dt) of this pressure change with respect to superposition time over that same time scale. As known in the art and as evident in FIG. 1c, downhole pressure increases upon the closing of the choke at the top of a well completion string as the well is shut-in. If the well is located in a closed reservoir compartment, and if the pressure buildup continues for a sufficiently long time, pressure change curve 5 develops a horizontal stabilized trend that indicates equilibration of the reservoir pressure throughout the entire reservoir compartment. The downhole pressure measured during such a stable period provides a measure of reservoir pressure.

Also as known in the art, the downhole pressure of a well depends not only on current flow rate from the well, but also depends on the flow rate history of that well. The "time constant" defining the previous time duration required to be analyzed in performing this pressure-rate analysis can be quite long, for example on the order of days or weeks. As known in the art, the concept of "superposition time" is used in conventional pressure-rate analysis, and considers a rate history of time-varying flow rates, as the superposition of multiple constant flow rates extended forward in time to the current time. This allows the overall solution for a given well $W_j$ over time to be broken up into several constant rate problems, rendering the solution substantially easier than would be a solution of the more complex variable flow rate problem.

As is also known in the art, however, the actual flow rates from the well of interest and from other wells in the production field are not as well-behaved as those involved in a conventional shut-in or drawdown test, even using superposition analysis or other conventional techniques such as pressure-rate deconvolution. As fundamental in the art, boundaries in the producing formation will affect the pressure behavior of a well at longer times after a change in flow rate at the well. For example, in the shut-in test, the pressure buildup will exhibit different behavior once the effects of the rate change reach the formation boundary. In addition, as mentioned above, production from wells that are also exploiting the reservoir will change the pressure behavior at the well of interest, especially over longer durations of time. Changes in the flow rate at each of the wells producing from the same reservoir, such changes occurring at different and various points in time, thus complicate the behavior of the downhole pressure being measured at a given well of interest.

During production, as mentioned above in connection with FIG. 1a, a large amount of data are obtained corresponding to measurements of the flow rate output from each well, and also corresponding to measurements of downhole pressure at one or more depths along the wellbore of one or more wells. These data potentially contain important information regarding the behavior of the overall reservoir. For example, this pressure vs. rate behavior can theoretically be used to derive and validate models of the reservoir, so that a human user such as a reservoir engineer can evaluate the fidelity with which a reservoir model matches actual reservoir behavior, and so that human user can evaluate the benefit of actions taken based on such models. Embodiments of this invention include system and process approaches to realizing this potential of the real-world pressure and flow measurements, as will be described in this specification.

Computerized Modeling System

Figure 2:
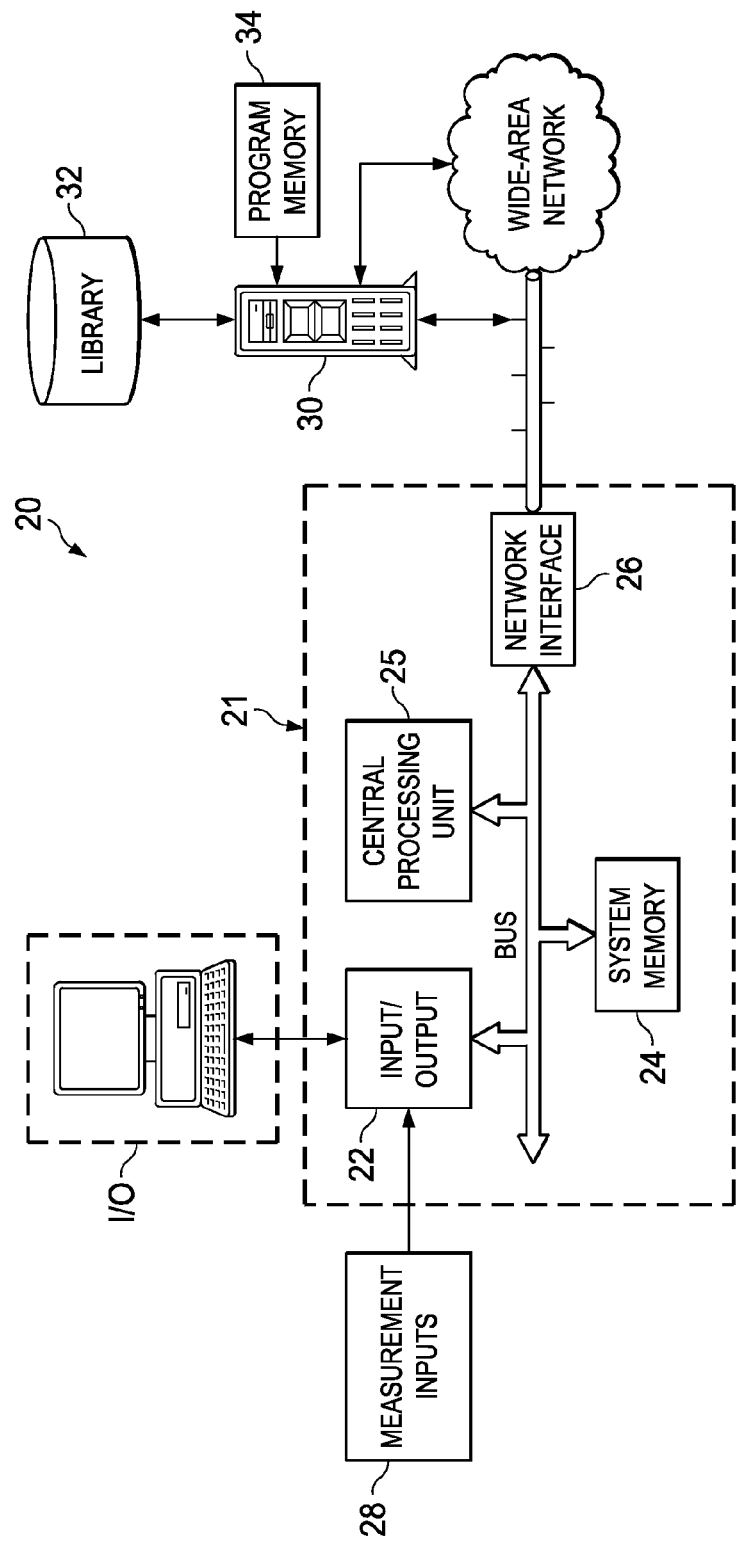
FIG. 2 is an electrical diagram, in block form, of a computer system constructed according to embodiments of the invention.

According to embodiments of this invention, a computerized system is constructed, programmed, and operated to accomplish the task of deriving a model of producing reservoirs, and of validating that model against actual pressure and flow rate measurements as they are acquired from the field during production. FIG. 2 illustrates, according to an example of an embodiment of the invention, the construction of modeling and verification system ("system") 20, which performs the operations described in this specification to derive a reservoir model, including its architecture and connectivity, and to validate that model to permit its modification, based on measurements of pressure and flow rate acquired over time during production from production wells deployed in the reservoir. In this example, system 20 is as realized by way of a computer system including workstation 21 connected to server 30 by way of a network. Of course, the particular architecture and construction of a computer system useful in connection with this invention can vary widely. For example, system 20 may be realized by a single physical computer, such as a conventional workstation or personal computer, or alternatively by a computer system implemented in a distributed manner over multiple physical computers. Accordingly, the generalized architecture illustrated in FIG. 2 is provided merely by way of example.

As shown in FIG. 2 and as mentioned above, system 20 includes workstation 21 and server 30. Workstation 21 includes central processing unit 25, coupled to system bus BUS. Also coupled to system bus BUS is input/output interface 22, which refers to those interface resources by way of which peripheral functions P (e.g., keyboard, mouse, display, etc.) interface with the other constituents of workstation 21. Central processing unit 25 refers to the data processing capability of workstation 21, and as such may be implemented by one or more CPU cores, co-processing circuitry, and the like. The particular construction and capability of central processing unit 25 is selected according to the application needs of workstation 21, such needs including, at a minimum, the carrying out of the functions described in this specification, and also including such other functions as may be executed by computer system. In the architecture of system 20 according to this example, system memory 24 is coupled to system bus BUS, and provides memory resources of the desired type useful as data memory for storing input data and the results of processing executed by central processing unit 25, as well as program memory for storing the computer instructions to be executed by central processing unit 25 in carrying out those functions. Of course, this memory arrangement is only an example, it being understood that system memory 24 may implement such data memory and program memory in separate physical memory resources, or distributed in whole or in part outside of workstation 21. In addition, as shown in FIG. 2, measurement inputs 28 that are acquired from downhole and surface transducers at the production field, for example pressure transducers PT and flow meters Q1, Q2 shown in FIG. 1a, are input via input/output function 22, and stored in a memory resource accessible to workstation 21, either locally or via network interface 26.

Network interface 26 of workstation 21 is a conventional interface or adapter by way of which workstation 21 accesses network resources on a network. As shown in FIG. 2, the network resources to which workstation 21 has access via network interface 26 includes server 30, which resides on a local area network, or a wide-area network such as an intranet, a virtual private network, or over the Internet, and which is accessible to workstation 21 by way of one of those network arrangements and by corresponding wired or wireless (or both) communication facilities. In this embodiment of the invention, server 30 is a computer system, of a conventional architecture similar, in a general sense, to that of workstation 21, and as such includes one or more central processing units, system buses, and memory resources, network interface functions, and the like. According to this embodiment of the invention, server 30 is coupled to program memory 34, which is a computer-readable medium that stores executable computer program instructions, according to which the operations described in this specification are carried out by allocation system 30. In this embodiment of the invention, these computer program instructions are executed by server 30, for example in the form of an interactive application, upon input data communicated from workstation 21, to create output data and results that are communicated to workstation 21 for display or output by peripherals I/O in a form useful to the human user of workstation 21. In addition, library 32 is also available to server 30 (and perhaps workstation 21 over the local area or wide area network), and stores such archival or reference information as may be useful in system 20. Library 32 may reside on another local area network, or alternatively be accessible via the Internet or some other wide area network. It is contemplated that library 32 may also be accessible to other associated computers in the overall network.

Of course, the particular memory resource or location at which the measurements, library 32, and program memory 34 physically reside can be implemented in various locations accessible to system 20. For example, these data and program instructions may be stored in local memory resources within workstation 21, within server 30, or in network-accessible memory resources to these functions. In addition, each of these data and program memory resources can itself be distributed among multiple locations, as known in the art. It is contemplated that those skilled in the art will be readily able to implement the storage and retrieval of the applicable measurements, models, and other information useful in connection with this embodiment of the invention, in a suitable manner for each particular application.

According to this embodiment of the invention, by way of example, system memory 24 and program memory 34 store computer instructions executable by central processing unit 25 and server 30, respectively, to carry out the functions described in this specification, by way of which a computer model of the reservoir being exploited by one or more wells can be generated, and by way of which that model can be validated relative to actual measurements obtained from the wells exploiting that reservoir, and interactively modified and updated to ultimately derive a reservoir model that behaves in a manner that closely corresponds to the actual measured reservoir behavior. These computer instructions may be in the form of one or more executable programs, or in the form of source code or higher-level code from which one or more executable programs are derived, assembled, interpreted or compiled. Any one of a number of computer languages or protocols may be used, depending on the manner in which the desired operations are to be carried out. For example, these computer instructions may be written in a conventional high level language, either as a conventional linear computer program or arranged for execution in an object-oriented manner. These instructions may also be embedded within a higher-level application. For example, an executable web-based application can reside at program memory 34, accessible to server 30 and client computer systems such as workstation 21, receive inputs from the client system in the form of a spreadsheet, execute algorithms modules at a web server, and provide output to the client system in some convenient display or printed form. It is contemplated that those skilled in the art having reference to this description will be readily able to realize, without undue experimentation, this embodiment of the invention in a suitable manner for the desired installations. Alternatively, these computer-executable software instructions may be resident elsewhere on the local area network or wide area network, or downloadable from higher-level servers or locations, by way of encoded information on an electromagnetic carrier signal via some network interface or input/output device. The computer-executable software instructions may have originally been stored on a removable or other non-volatile computer-readable storage medium (e.g., a DVD disk, flash memory, or the like), or downloadable as encoded information on an electromagnetic carrier signal, in the form of a software package from which the computer-executable software instructions were installed by system 20 in the conventional manner for software installation.

Operation of the Computerized Modeling System

Figure 3:
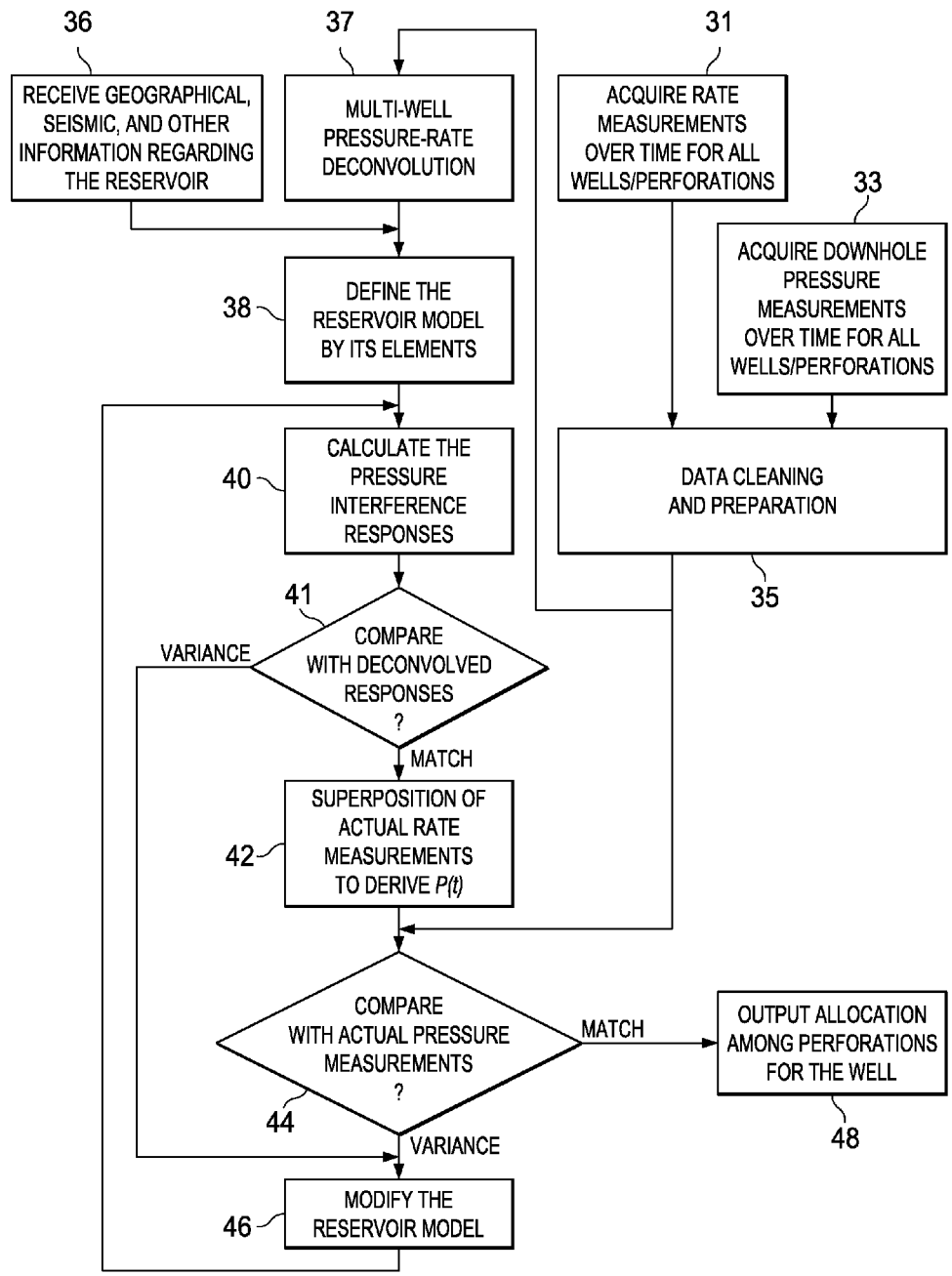
FIG. 3 is a flow diagram illustrating the operation of the computer system of FIG. 2 according to embodiments of the invention.

FIG. 3 illustrates the generalized operation of system 20 in interactively carrying out the modeling and validation functions according to an embodiment of the invention. This specification will provide a more detailed description of the theory of operation and the individual processes and steps presented in the overall operation illustrated in FIG. 3. However, it will be useful to summarize this overall operation at this point, so that the more detailed description will be better understood.

According to this embodiment of the invention, the overall modeling and validation process begins with process 36, in which a human user such as a reservoir engineer receives information about the reservoir to be modeled. In the context of system 20 of FIG. 2, this human user can be operating workstation 21, in which case retrieval process 36 can be carried out by retrieving seismic survey maps, geographical and topographical maps, well logs, and syntheses of those data and other data previously performed according to conventional geological survey techniques and tools, from library 32 via server 30, for example. This retrieved information regarding the reservoir provides the user with a starting point from which to define the reservoir model. Of course, the better the information (including syntheses) that is retrieved in process 36, the closer that this starting point can be to an accurate model.

During actual production, as discussed above, instrumentation is deployed in the field to acquire actual measurements of fluid flow from each of the active wells in the reservoir (e.g., via flow meters Q1, Q2 for wells W1, W2 in FIG. 1a); dynamic data corresponding to these measurements are acquired by system 20 in process 31, for example as measurement inputs 28 communicated via input/output functions 22 (FIG. 2). Similarly, downhole pressure transducers PT acquire bottomhole pressure measurements during the course of production from the field, and these dynamic data for the active wells in the reservoir are acquired by system 20 in process 33, for example also as measurement inputs 28 communicated via input/output functions 22. These flow rate and pressure measurements are each time-stamped or otherwise correlated in time with one another, by a computational function within system 20 (e.g., in server 30 so that the data are stored in library 32 in this time-correlated fashion, or alternatively by workstation 21 itself in carrying out the process shown in FIG. 3). In data cleaning and preparation process 35, these pressure and flow rate measurements acquired in processes 31, 33 are also organized by system 20 into data streams representing pressure vs. time and rate vs. time functions for each well involved. These pressure and rate data are plotted on different types of plots commonly used in pressure transient analysis to assess consistency and quality of the data, from which the user identifies erroneous and spurious measurements, inconsistent portions of the data and removes them. At the end of this data cleaning and data preparation process 35, a set of the pressure and rate data that is used in subsequent analysis has been prepared.

In process 37, under the control of the user, system 20 processes these cleaned pressure and rate data from several wells through a multi-well pressure-rate deconvolution algorithm, to reconstruct a set of pressure interference responses $P_{ij}(t)$. Each pressure interference response function represents the pressure at well i resulting from constant unit-rate production of well j, if well j were to be the only producing well in the reservoir. The set of these pressure interference responses can be viewed as another form of presentation of the original pressure and rate data. Because these pressure interference response functions are independent of well rate, these functions reflect reservoir properties, reservoir shape, heterogeneities, connectivity, and the reservoir volume. Conventional pressure transient analysis techniques applied to these pressure interference responses allow the user to develop some preliminary insights regarding the reservoir properties and the likely characteristics of the reservoir that define the dynamic pressure behavior observed during production from the field. At this stage, for each of the wells in the reservoir, it is possible to estimate the reservoir permeability in the regions around each of the wells and the distances from the wells to reservoir boundaries, and to develop an understanding of the likely shape of the reservoir compartment.

In process 38, the user defines an initial model for the reservoir, based on the information retrieved in process 36 and the insights into the reservoir characteristics learned from the deconvolved pressure interference responses $P_{ij}(t)$ generated in process 37. As will be described in detail below, the reservoir model realized according to this embodiment of the invention is defined by the model elements of:

Regions: Each region corresponds to a portion of a hydrocarbon-bearing formation of essentially uniform rock properties. Attributes are assigned to each region, such attributes including size and shape of the region, porosity, permeability, rock compressibility, water saturation, and the like.

Connections: Connections are defined between regions that are in fluid communication with one another. Attributes are assigned to each connection, such attributes including the resistivity across the connection, and the cross-sectional area of the connection.

Wells: The locations of wells in the reservoir, and the regions intersected by each well, are defined.

Perforations: Each perforation is associated with a well, and corresponds to a connection between the well and a region. As such, each well can be considered as a set of perforations. Attributes are assigned to each perforation, such attributes including resistivity of the connection between the well and the surrounding region (i.e., perforation skin factor), and the wellbore radius of the corresponding connection. In some embodiments of the invention, for example if turbulence is being modeled, the additional attribute of a turbulence coefficient will also be assigned to each perforation.

These elements of the model effectively define the reservoir model as a network of regions, in fluid communication with each other by the specified connections and by the specified wells and perforations, and in fluid communication with the world external to the network by way of the specified wells.

Other elements may additionally be defined in connection with process 38, as appropriate to the reservoir model being developed and according to the desired complexity of the eventual model. For example, the user of system 20 may compare the geometric characteristics of the model as derived from the seismic and geological information retrieved in process 36, with the corresponding characteristics inferred from the analysis of dynamic reservoir behavior resulting from deconvolution process 37. To the extent that these two sets of characteristics are inconsistent, one can conclude that some small scale features that affect fluid flow are present in the reservoir, but have not been (or cannot be) resolved from the seismic information. For example, barriers to fluid flow such as baffles and small through-faults may be evident in the deconvolution results but not visible in the seismic survey. Process 38, according to this embodiment of the invention, allows the user to incorporate these features inferred from dynamic analysis (process 37) into the reservoir model.

In process 40, system 20 operates to calculate pressure responses among the perforations of the wells in the reservoir model defined in process 38. As will be described in further detail below, this embodiment of the invention operates according to a fluid flow model in the network of regions being modeled, in which the pressure at a particular well of interest in the reservoir is modeled over time, in response to the flow rate of output from that well and from other wells in the production field. As mentioned above, not only does the flow from a well largely affect its own downhole pressure, but the flow rates of other wells, specifically those intersecting formations that are in fluid communication with the formation being produced by the well of interest, also affect the pressure over time at the well of interest. In process 40, system 20 derives the specific response of the pressure at each well in response to a unit flow rate produced from each of the wells in the modeled reservoir. These constant-rate pressure responses are derived in process 40 by solving a set of fluid flow problems in the reservoir model developed in process 38, as will be described in further detail below.

These pressure responses derived in process 40 are compared with the respective constant-rate pressure responses derived by multi-well pressure-rate deconvolution process 37 from the actual pressure and rate data acquired during production from the field, in decision 41. Decision 41 is carried out by the user in cooperation with system 20, essentially by determining whether the modeled interference pressure responses from process 40 adequately match the pressure responses derived in process 37. If decision 41 results in a significant variance (either relative to a pre-defined criterion or in the judgment of the user), process 46 is performed by the user in cooperation with system 20 to modify the reservoir model. It is contemplated that modification process 46 will involve the expertise of the human user (e.g., reservoir engineer), because the modifications applied to the reservoir model in this process 46 will be based on the way in which the modeled responses differ from the responses derived by the multi-well deconvolution algorithm based on original pressure and rate measurements. As known in the art, the interpretation of the effects of formation boundaries, neighboring wells, pressure sources such as aquifers, and the like on the pressure-vs.-time behavior of a well is both complicated and subtle. The modification of the model carried out in process 46 will therefore involve some changes in the attributes of the elements described above, or in some cases may involve the defining or re-defining of one or more of the elements, based on the observed differences in pressure behavior. Following modification process 46, control returns to process 40, in which the inter-well pressure responses are re-calculated for the reservoir model in its newly-modified form.

In process 42, system 20 applies the actual flow rate history for each well (or perforation) acquired in process 31, together with (in some cases, such as cross-flow situations) initial pressure measurements and well completion time data acquired in process 33, to the pressure interference responses $P_{ij}(t)$ calculated in process 40. In process 42, these flow rate measurements over time are applied to the pressure interference responses, via the superposition principle, to produce a modeled estimate P(t) of the pressure at one or more wells of interest, as affected by the actual measured flow rates of the wells producing from the reservoir. If the reservoir model is reasonably accurate, this modeled pressure behavior P(t) will closely match the actual measured downhole pressure at the wells of interest, over that same time duration for which the flow rates were applied to the pressure interference responses in process 42. Comparison process 44 is performed by system 20, in cooperation with the human user, by retrieving the downhole pressure measurements acquired in process 33, and comparing those measurements with the model output from process 42. This comparison can be performed in an automated manner by system 20, or by a visual comparison made by the human user by viewing a graphical or other output at workstation 21, or by some hybrid operation by way of which a computer-assisted comparison can be evaluated by the user.

If comparison process 44 determines that the modeled pressure behavior P(t) does not adequately match the actual pressure behavior over time at the wells of interest as measured and acquired in process 33 (either relative to a pre-defined criterion or in the judgment of the user), process 46 is performed by the user in cooperation with system 20 to modify the reservoir model, as discussed above. Again, following modification process 46, control returns to process 40, in which the inter-well pressure responses are re-calculated for the reservoir model in its newly-modified form.

Upon the modeled pressure interference responses adequately matching the corresponding deconvolved responses (process 41) and the pressure behavior P(t) adequately matching the actual pressure measurements (process 44), process 48 can then be performed, if appropriate, to output a modeled allocation of production from among the multiple perforations belonging to the well of interest. In embodiments of this invention, the allocation calculations are necessarily carried out in connection with the modeling processes 40, 42. Typically, in actual production, the allocation of well production among its perforations is not directly measured; as such, the calculated allocation provided in connection with embodiments of this invention (and validated by successful comparisons in processes 41, 44) is useful information to the production operator.

As will be described in further detail below, the manner in which processes 40, 42 are executed by system 20 according to embodiments of this invention provides great efficiencies in these operations and calculations, especially as compared with conventional numerical modeling approaches such as the gridded techniques of finite-element and finite-difference modeling. Accordingly, it is not only contemplated but has been observed that the iterative defining, validation, and adjustment of a reservoir model according to these embodiments of the invention can be carried out in a relatively efficient manner, even for relatively complex reservoir geometries involving multiple wells, and considering relatively long time periods. Indeed, it is not only contemplated but has been observed that each iteration to the process described above can be executed by modern workstations in a manner of minutes if not seconds. As such, the process according to these embodiments of the invention is truly a real-time interactive reservoir modeling approach, which not only improves its usability but enables a sufficient number of iterations to converge on an accurate model in a reasonable time, with reasonable effort on the part of the reservoir engineer.

As described generally above in connection with FIG. 3, this process is applied to all of the wells of interest in the reservoir. As such, it is contemplated that this modeling process is applied using the reservoir model of the entire reservoir, so that this multi-well model is refined, calibrated, and validated based on the observed production behavior of all of the wells in the field beginning from the time of field startup. Calibration of the reservoir model to the observed pressure and rate data from all of the wells of interest in the reservoir is contemplated to accurately identify reservoir boundaries, and barriers or other restrictions to flow that are located within the reservoir. This development of a reliable understanding of the reservoir internal "plumbing" as well as of the overall extent, boundaries, and volume of the reservoir is very important for optimizing reservoir development and exploitation.

Once the user completes the modeling and validating process described above and shown in FIG. 3, over the desired set of wells in the reservoir, the derived reservoir model is ready for use in the conventional manner. As known in the art, reservoir models are useful for such tasks as economic evaluation of the hydrocarbons to be produced, determination of the benefit of proposed well and reservoir actions such as secondary and tertiary recovery efforts, and evaluation of the decision of whether and where to place new wells. It is contemplated, however, that reservoir models derived and validated according to this invention will have dramatically improved accuracy relative to conventional reservoir models, because of the ability of this invention to correlate and validate these models with the actual pressure performance of the reservoir, and indeed to validate these models against the large amount of real-time and continuous measurement data now available from downhole pressure transducers and other modern instrumentation equipment.

Theory of Operation

The detailed description of embodiments of the invention will now be presented, to further assist those skilled in the art having reference to this specification to readily implement this invention, without undue experimentation. In providing this detailed description, however, it is believed useful to generally describe the theory behind the calculations performed and applied in the overall process of FIG. 3, so that the more detailed description of the manner in which system 20 executes those processes according to embodiments of the invention will be more readily and more clearly understood.

Pressure-Rate Relationship and the Fluid Flow Problem

As discussed above relative to FIG. 1c, a relationship exists between the pressure field in a fluid reservoir and the fluid flow within that reservoir. A well-known expression of that relationship is:

$$\frac{\partial \rho \phi}{\partial t} = \nabla \left( \rho \frac{k}{\mu} \nabla p \right) \tag{3}$$

where $\rho$ is the mass fluid density, $\phi$ is the rock porosity, k is the rock permeability, $\mu$ is the fluid viscosity, and p is the pressure in the reservoir. As such, the left-hand side of equation (3) represents the accumulation rate of the fluid mass in a unit reservoir volume, while the right-hand side of equation (3) represents the total mass of fluid leaving this unit reservoir volume through its outer boundaries, per unit time. As known in the art, other expressions of this governing pressure equation can be used, particularly if simplifications on the spatial or temporal variation of the parameters of equation (3) can be made or if specific information is available to express one or more of the parameters. In reservoirs for which a single phase of oil is flowing, equation (3) can be expressed more directly as the well-known linear diffusivity equation:

$$\phi c_t \mu \frac{\partial p}{\partial t} = \nabla [ k \ \nabla p ] \tag{3a}$$

where $c_t$ is an expression for total compressibility:

$$c_t = \frac{1}{\rho \phi} \frac{d \rho \phi}{d p} \tag{3b}$$

On the other hand, where gas is the fluid, the gas viscosity $\mu$, the gas density $\rho$, and the total compressibility $c_t$ may be functions of pressure, in which case the diffusivity equation becomes non-linear for cases in which the pressure changes are significant, and is expressed as:

$$c_t \rho \phi \frac{\partial p}{\partial t} = \nabla \left( k \frac{\rho}{\mu} \nabla p \right) \tag{3c}$$

The gas equation of state expresses gas density $\rho$ as a function of pressure:

$$\rho(p) = \frac{p m_w}{z(p) RT} \tag{3d}$$

where $m_w$ is the molecular weight of the gas, R is the universal gas constant, T is the absolute temperature, and z(p) is the gas "z-factor". One can then reduce the degree of non-linearity in the diffusivity equation (3c) by use of a pseudo-pressure function of pressure m(p):

$$m(p) = 2 \int_{p_0}^{p} \frac{\rho(p)}{\mu(p)} dp \tag{3e}$$

in which case the diffusivity equation (3c) becomes linear:

$$\phi c_t \mu \frac{\partial m(p)}{\partial t} = \nabla [ k \ \nabla m(p) ] \tag{3f}$$

In the strict sense, equation (3f) is non-linear because the total compressibility $c_t$ and the gas viscosity $\mu$ in the left-hand side are functions of pressure; however, equation (3f) becomes linear if one can validly neglect the dependence on pressure of these characteristic. An example of the use of the pseudo-pressure approach for pressure-rate analysis, including the appropriate material balance corrections and rate-dependent skin correction, is described in Bourgeouis et al., "Additional Use of Well Test Analytical Solutions for Production Prediction", SPE 36820, *SPE European Petroleum Conference* (1996), incorporated herein by this reference.

These diffusivity equations (3a) and (3f) for oil and gas phases, respectively, effectively express the "fluid flow problem" within a region of a formation in which the rock properties (and fluid properties, for that matter) are essentially uniform. To solve such a fluid flow problem in that region, boundary conditions must of course be defined. In the simple case of a single region surrounded by "no-flow" boundaries (i.e., the only fluid flowing is that within the boundary), the boundary conditions are simply that the normal pressure derivative at the boundary is zero:

$$\left. \frac{dp}{dn} \right|_\Gamma = 0 \tag{3g}$$

In practice, for the case of a well into a sub-surface formation in which the formation thickness is much smaller than the characteristic scale within the reservoir plain, this fluid flow problem is essentially described as a two-dimensional problem of radial flow into the well.

An example of this relationship between pressure and flow geometry is illustrated in FIG. 1c in connection with a typical shut-in (or "pressure build-up") test, in which the downhole pressure at the wellbore of a well is measured over time from a point in time beginning with the shutting-in of the well. The measured pressure and its derivative provide information regarding the properties of the rock and fluid in the reservoir, as well as the size of the reservoir considering the effect that reservoir boundaries (especially no-flow boundaries) have on the pressure characteristics, assuming that the shut-in time is sufficiently long.

As will be described in further detail below, embodiments of this invention convert the variables of pressure (oil) and pseudo-pressure (gas) into a "dimensionless" form for the reservoir model. This conversion to dimensionless variables scales the pressure and pseudo-pressure variables according to reference values for flow rate, permeability, thickness of the region, porosity, and total compressibility. Spatial coordinates are scaled by a length scaling factor corresponding to the wellbore radius. This conversion to dimensionless variables results in the fluid flow problem being identically formulated for both the oil (pressure) and gas (pseudo-pressure) cases. Detailed description of this conversion into dimensionless form is described in Levitan et al., "General Heterogeneous Radial and Linear Models for Well Test Analysis", SPE 30554, *SPE 70th Annual Technical Conference and Exhibition* (1995), pp. 225-38.

Figure 4:
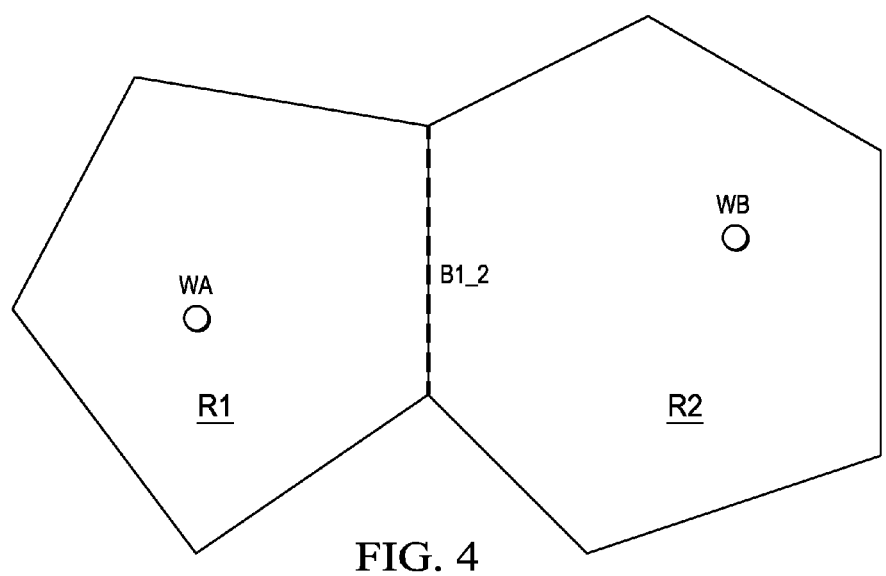
FIG. 4 is a plan view of regions of a formation in a reservoir model according to embodiments of the invention.

Non-trivial reservoir models to be developed according to embodiments of this invention, and validated relative to actual pressure and flow measurements, typically involve fluid flow between and among formation regions that are in fluid communication with the region or regions that are producing into a well of interest. FIG. 4 illustrates, in plan view, a relatively simple two-region formation of regions R1, R2, each of polygon shape, with boundary B1_2_ disposed between regions R1, R2. Wells WA, WB are deployed and are producing from regions R1, R2, respectively. It is contemplated that regions R1, R2 differ from one another regarding such attributes as rock properties, while within each region R1, R2 those attributes are assumed to be effectively constant.

Of course, more than two regions may communicate across a given single boundary, for example as may occur as a fault (e.g., fault F1 of FIG. 1a), where two or more formations or sands that are separated from one another on one side of the fault communicate with a single formation on the other side of the fault.

Referring back to FIG. 4, the fluid flow problem presented by regions R1, R2 is addressed, according to embodiments of this invention, by solving the fluid flow problem within each region R1, R2, while merging these solutions at boundary B1_2. This merging of the solutions along the connecting part of region boundary B1_2 requires that two physical conditions be satisfied. The first condition is associated with material balance, and requires that the fluid fluxes from all regions connecting at that boundary sum up to zero. Using the well-known Darcy expression for fluid flux, this condition is presented as:

$$\sum_i (kh)_i \frac{dp_i}{dn} = 0 \quad (4)$$

where i is an index of the regions that connect at the boundary. As conventional, the normal pressure derivative is taken in the outward direction for each region R1, R2. The second merging condition relates the pressures on either side of boundary B1_2. If there is no pressure change across the boundary B1_2 (i.e., the connection is effectively resistance-free), then $p_{R1}=p_{R2}$ in the case of FIG. 4. It is possible for an interface between regions to present some resistance to flow, however, which results in some pressure change across the interface. This pressure change is proportional to local flux across the boundary, with the merging condition taking the form:

$$p_{R1}=p_{R2}-R_{12}q_{R2} \quad (5a)$$

In this equation (5a), $R_{12}$ is the resistivity (per unit area) to fluid flow from region R2 to region R1 at boundary B1_2, and $q_{R2}$ is the fluid flux flowing from region R2 to region R1. In the case in which more than two regions connect at the same boundary segment, however, a more general form of the merging condition is necessary. Resistivity to flow across the interface in this case is characterized by two coefficients associate with each of the two regions involved in the connection:

$$p_i+R_i q_i=p_j+R_j q_j \quad (5b)$$

As noted above, the flow rates q can be expressed in terms of normal pressure derivative, rock permeability k, and fluid viscosity µ.

Analogously to the two-region case, internal no-flow boundaries within a region of uniform rock and fluid properties can be considered; an example of such an internal no-flow boundary is shown in FIG. 1b by fault F2. For purposes of modeling, a partial no-flow boundary within a region can be extended across the entirety of the region, effectively creating two sub-regions that communicate across a boundary of reduced cross-section (reduced by the length of the internal no-flow boundary). By establishing the appropriate merging boundary conditions between these two sub-regions, the fluid flow problem can be readily considered as a two region situation, in the manner described above.

Wells WA, WB also establish inner boundaries for their respective regions R1, R2. Boundary conditions at wells, or more specifically at the individual perforations within wells, bring well flow rate into the fluid flow problem formulation in respective regions, and lead to a pressure-rate characteristic useful in modeling and characterization of the reservoir in the production of oil and gas. Considering well WA in region R1, and at this point assuming that the measured well flow rate is due to production from region R1 only (i.e., well WA has only one connection or perforation in region R1), the volume of fluid V flowing across a unit area of wellbore surface in well WA is given by the Darcy equation:

$$V = -\frac{k}{\mu}\frac{dp}{dr} \quad (6)$$

For a given wellbore radius $r_w$, and a given formation thickness h, one can derive the volumetric fluid flow rate q as:

$$q = 2\pi r_w h \frac{k}{\mu}\frac{dp}{dr}\bigg|_{r=r_w} \quad (7)$$

The mass rate of well WA can be derived by multiplying this flow rate q by the fluid density ρ. In the case of oil production, the normal derivative of pressure at the wellbore can be expressed from this flow rate equation in terms of flow rate as:

$$\frac{dp}{dr}\bigg|_{r=r_w} = \frac{\rho_{sc}}{\rho}\frac{q_{sc}\mu}{2\pi kh r_w} = \frac{q_{sc}\mu B}{2\pi kh r_w} \quad (8a)$$

where B is the formation volume factor, typically defined as $\rho_{sc}/\rho$, the subscript "sc" indicating standard conditions (i.e., $q_{sc}$ is the flow rate under standard conditions). For the case in which well WA is producing gas, the pseudo-pressure transform described above can be used, in which case the respective expression becomes:

$$\frac{dm(p)}{dr}\bigg|_{r=r_w} = \frac{2\rho_{sc}q_{sc}}{2\pi kh r_w} \quad (8b)$$

In either of the oil or gas cases, it is the bottomhole pressure of the well of interest that is the unknown that is to be solved for in solving the fluid flow problem for the regions in the reservoir.

As known in the art, the sum of the flow rates from the perforations of a well does not necessarily equal the output flow rate of the well, because of the storage capacity of the wellbore. More specifically, changes in downhole pressure will change the volume of fluid retained in the wellbore, and such volume changes will be reflected in the behavior of the well flow rate. For an oil well, this wellbore storage effect can be expressed by:

$$\sum_i q_i - 24 C_w \frac{dp_{wf}}{dt} = q_{sc} B \quad (9a)$$

where $C_w$ is the wellbore storage coefficient (rb/psi), where $q_i$ is the so-called "sandface" flow rate contribution from perforation i, and where B is the formation volume factor. Pressure $p_{wf}$ is the flowing well pressure. This equation (9a) effectively states that the sum of the perforation flow rates, plus the effect of wellbore storage, amounts to a measure of the well output flow rate. For a gas well, this equation (9a) can be expressed in terms of pseudo-pressure m:

$$\sum_i q_i - 24 C_w \frac{\mu}{2\rho_{sc}} \frac{dm_{wf}}{dt} = q_{SC} \quad (9b)$$

An additional pressure drop at a perforation, between the theoretical reservoir pressure at the wellbore radius and the actual bottomhole pressure, is often present because of localized damage at the wellbore at that perforation. More specifically, the flowing pressure $p_{wfi}$ at well perforation i differs from the evaluated pressure $p_i$ because of this effect:

$$p_{wfi} = p_i|_{r=r_{wi}} - \Delta p_{i\text{-}skin} \quad (10a)$$

where $\Delta p_{i\text{-}skin}$ is the pressure drop at perforation i due to well damage. This pressure drop can be expressed in terms of a "skin factor" $S_i$:

$$p_{wfi} = p_i|_{r=r_{wi}} - \frac{q_i \mu B}{2\pi k_i h_i} S_i \quad (10b)$$

In the case of an oil well, the skin factor $S_i$ can be considered as a constant for perforation i, and is thus typically an input parameter into the fluid flow problem.

For the case of a gas well, the skin factor $S_i$ at a perforation i can depend on the flow rate of the well. For example, a common expression of skin factor $S_i$ at a perforation i in a gas well is the linear function:

$$S_i = S_m + Dq_i \quad (10c)$$

where $S_m$ represents a skin component due to mechanical well damage, and where the second term represents a turbulence or otherwise rate-dependent skin component, D being a turbulence coefficient. As mentioned above, to maintain the ability to apply superposition, the gas well situation utilizes a pseudo-pressure variable $m_i$ for perforation i. The pseudo-pressure $m_{ui}(t)$ resulting from unit-rate gas flow can be expressed (in a dimensionless form for pseudo-pressure $m_{di}$)

$$m_{ui}(t) = \frac{\rho_{sc}}{\pi k_i h_i} m_{di}(t) + S_m \quad (10d)$$

Generalizing a flowing bottomhole pseudo-pressure $m_{wfi}(t)$ by way of a convolution integral, including the effects of the skin factor, and incorporating this pseudo-pressure unit flow rate response, leads to:

$$m_{wfi}(t) = m_{oi} - \int_0^t q_i(t-\tau) \frac{dm_{ui}(\tau)}{d\tau} d\tau - \overline{D} q_i^2 \quad (10e)$$

The transform of pressure into and out of the "pseudo-pressure" domain serves to linearize the analysis of a gas well, as mentioned above.

Another complication presented by actual reservoirs, in connection with these well boundary conditions, is presented by wells having multiple perforations, because of fluid communication via the wellbore.

Ultimately, the well boundary conditions become a system of n equations, where n is the number of perforations. This system is constrained by the flow rate $q_{sc}$ measured at the surface for the commingled flow from all of the producing perforations, and is also constrained by the requirement that all perforations in the well produce against a common well bottomhole pressure. As will be evident from the following description, these constraints are used to arrive at such a system of n equations that has n unknowns, and is thus sufficiently specified so as to be solvable.

Pressure-Rate Deconvolution

Based on the foregoing description, the evolution of downhole (bottomhole) pressure of a well over time is seen to depend on the fluid flow rate of the well itself, potentially on the flow rates of other wells in the reservoir, on the reservoir rock and fluid properties and heterogeneities (variation of rock properties throughout the reservoir) thereof, on internal faults and other barriers to flow, on the shape of the reservoir boundary, and on the total reservoir volume. Therefore, it is possible to determine the reservoir properties and to develop an understanding of reservoir architecture through the analysis of well bottomhole pressure behavior with time. The key in doing so is to identify, and minimize or remove, the effects of well rate variation from the measured pressure data. As discussed above, the conventional approach for such analysis is to perform shut-in (or pressure build-up) tests, and to study the transient pressure behavior during such periods in which the well is closed and the well rate is zero. However, this approach inevitably limits the analysis to the duration of the pressure buildup test, and thus to a relatively small reservoir region near the well under investigation by the test. In addition, as mentioned above, these well tests are a costly exercise, and as such are infrequently performed.

It would therefore be useful to analyze the vast quantity of downhole pressure data and well flow rate data now being gathered during production, because analysis of these data would provide real-time and continuous insight into the properties of the well and the reservoir, theoretically in a very precise manner given the quantity of data. But because the flow rates from each well during production cannot be held constant, and indeed are not particularly well-behaved, the pressure-rate analysis is more difficult. Furthermore, the pressure response to changes in flow rate are relatively long-lived, such that the downhole pressure at any given point in time can depend on the flow rate history over a relatively long period of time, up to hundreds or even thousands of hours. These long pressure responses to flow rate history greatly complicate the analysis, as evident from FIGS. 5a and 5b.

Figure 5A:
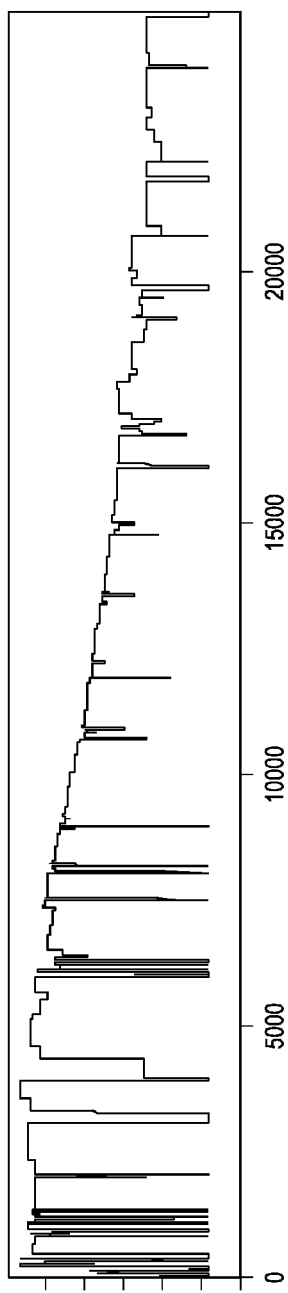
FIGS. 5a, 5b, and 5c are flow rate, pressure, and deconvolved pressure response derivative plots, respectively, from a well in a production field.
Figure 5B:
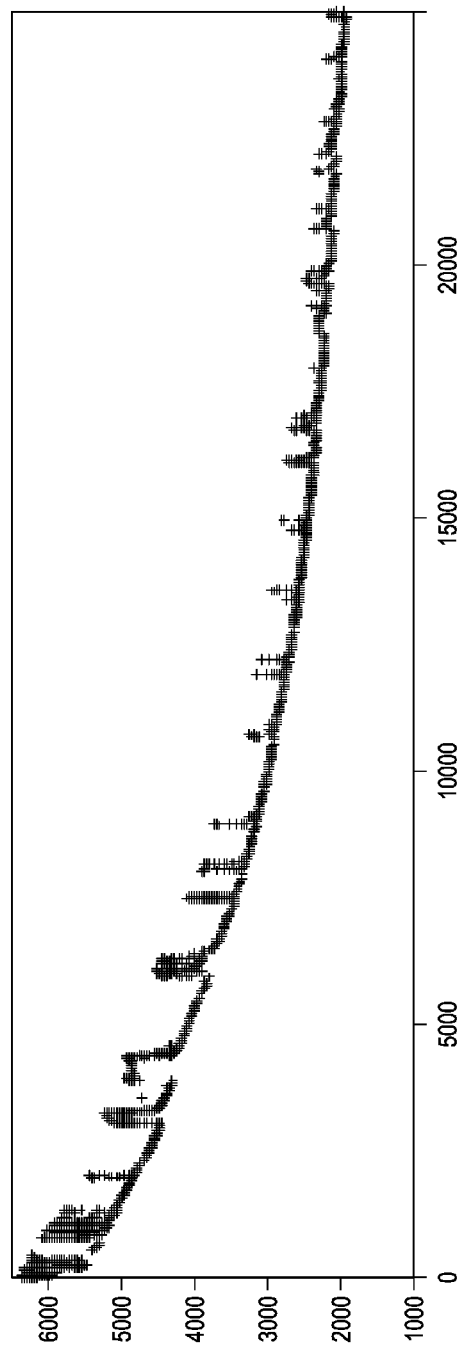

FIG. 5a illustrates a plot of flow rates from a typical production well over a relatively long period of time (over 25000 hours). As evident from FIG. 5a, the flow rate from this well generally declines over time, and a number of shut-in events of varying duration occur over that time period. As a result, the measured downhole pressure of this well (FIG. 5b) is not particularly well-behaved. While a generalized trend in pressure can be seen, a number of excursions are also present in the pressure plot over time, coinciding with and affected by the various shut-in periods.

As described above in connection with the background of the invention, these variations in flow rate from a well can be managed, in pressure-rate analysis, by way of pressure-rate deconvolution. As described in Levitan et al., "Practical Considerations for Pressure-Rate Deconvolution of Well-Test Data", *SPE Journal* (March 2006), pp. 35-47, incorporated herein by reference, one can consider the relationship of time-varying pressure $p_i(t)$ at well i to the time-varying well flow rate $q_i(t)$ from that well i as a convolution integral:

$$p_i(t) = p_i^0 - \int_0^t q_i(\tau) \frac{dP(t-\tau)}{dt} d\tau \qquad (1)$$

In this convolution integral, dP(t)/dt is the downhole pressure response to production at a unit flow rate, beginning from an initial pressure $p_i^0$ at time-zero. Accordingly, if one has time-varying pressure data, for example as plotted in FIG. 5b, and also the corresponding time-varying flow rate data, for example as plotted in FIG. 5a, a deconvolution of the flow rate data from the pressure data can yield the pressure response dP(t)/dt', from which the properties of the formation can be deduced in similar manner as from a shut-in or draw-down test.

Figure 5C:
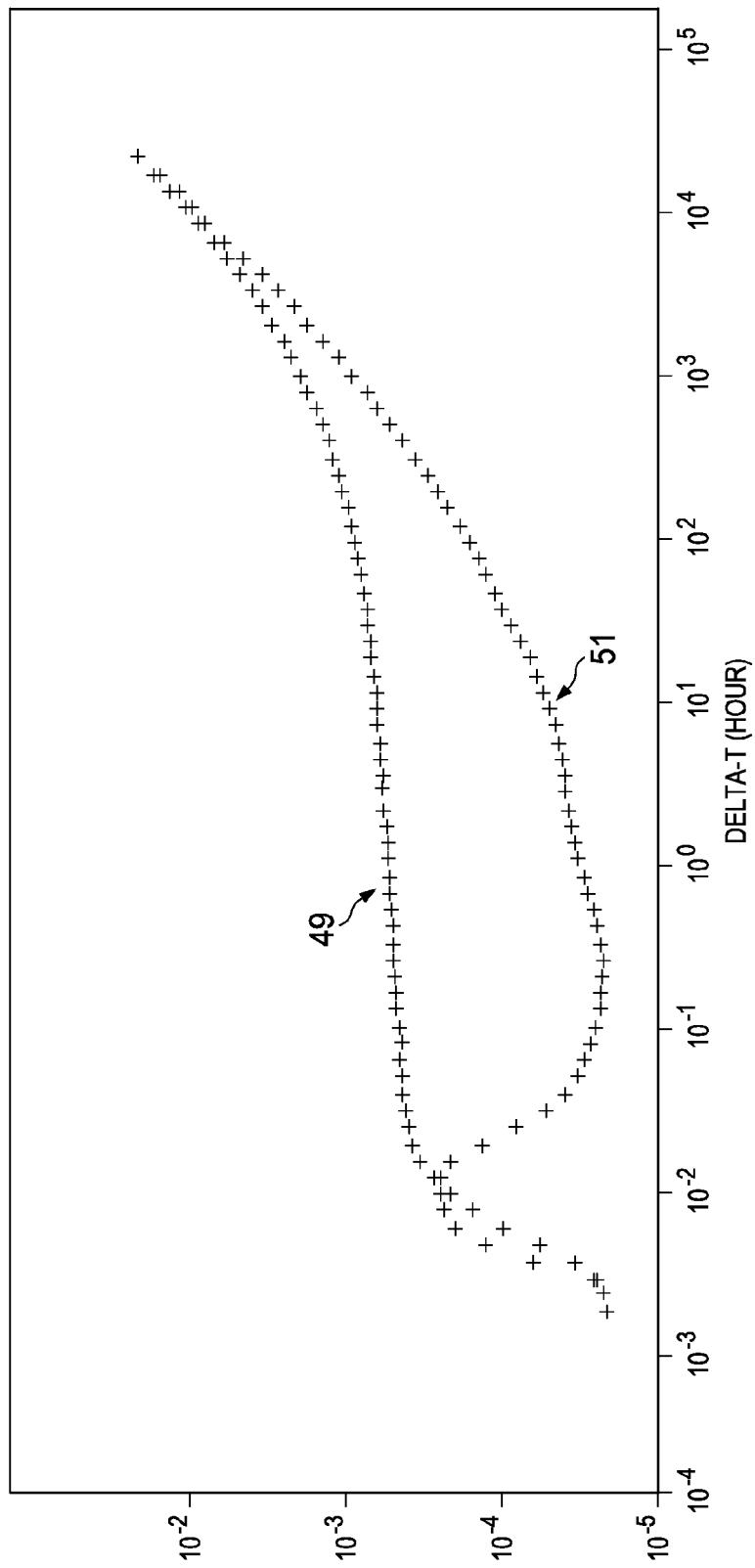

FIG. 5c presents the deconvolved pressure response P(t) in the form of a derivative plot, with plot 49 corresponding to the deconvolved pressure change over time, and plot 51 corresponding to the pressure derivative with respect to superposition time. This response is derived from the pressure and rate data in FIGS. 5a and 5b by using the pressure-rate deconvolution algorithm described in Levitan, "Practical Application of Pressure/Rate Deconvolution to Analysis of Real Well Tests", *Reservoir Evaluation & Engineering* (April 2005), pp. 113-121, incorporated herein by reference. The pressure response in FIG. 5c could be viewed as another form of presentation of the original pressure and rate data from FIGS. 5a and 5b. However, when presented in the deconvolved form as shown in FIG. 5c, the illustrated pressure behavior depends on reservoir properties only, because of the identification and removal of the effects of well rate variation on the pressure by the operation of the deconvolution algorithm, which transforms the pressure record into the corresponding unit-rate drawdown response of the same well. A remarkable feature of this response, as recovered through deconvolution, is that it is defined on the time interval of more than 25000 hours, which is the time span of the original data. As a result, the deconvolved response reflects not merely the reservoir properties near the well, but also reflects the properties and architecture of the entire reservoir compartment drained by the well. By applying standard techniques of pressure transient analysis to the response shown by plots 49 and 51, one can obtain estimates of reservoir permeability and well skin factor, and develop understanding of the shape of compartment and its volume. This information can then be incorporated into the reservoir model that is developed for simulation the fluid flow in the reservoir, and for prediction of well bottomhole pressure behavior.

Also as discussed above in connection with the background of this invention, in a multi-well case, the effects of flow from other neighboring wells to a well of interest must be accounted for in pressure-rate deconvolution. As described in Levitan, "Deconvolution of Multiwell Test Data", 2006 *Annual Technical Conference and Exhibition*, Paper No. SPE 102484 (2006), incorporated herein by reference, one can account for these inter-well interferences in the convolution integral expression:

$$p_i(t) = p_i^0 - \sum_j \int_0^t \frac{dP_{ij}(\tau)}{dt} q_j(t-\tau) d\tau \qquad (2)$$

where well i represents the well of interest, and where index j refers to each well in the production field (the set of j wells including well i itself). According to this convolution expression, a pressure response term $$\frac{dP_{ij}(\tau)}{d\tau}$$

refers to the pressure response at well i to a unit flow rate produced from well j.

These inter-well effects become significant factors at longer times in the analysis. It has therefore been discovered, in connection with this invention, that in order to accurately model and characterize a reservoir so that the modeled pressure behavior at a well can be validated by a comparison with actual production pressure measurements, these inter-well pressure responses are important factors in the solution of the overall fluid flow problem. Therefore, according to embodiments of this invention, the multi-region fluid flow problem presented by a model of the reservoir, as expressed in terms of its elements (regions, connections, wells, perforations), is addressed by using these inter-well pressure responses.

Solving the Fluid Flow Problem

According to embodiments of the invention, the solution of the fluid flow problem for the modeled reservoir is based on the superposition of pressure responses to unit-rate production from perforations of a multi-layer, multi-well, reservoir, as solved in light of certain bottomhole constraints on the wells and perforations. In this context, a "perforation" is defined as a connection between a well and a reservoir region. This superposition approach is valid for those situations in which the fluid flow problem is linear, and thus either assumes that fluid and rock properties do not depend on pressure, or that gas properties into are transformed into a pseudo-pressure domain in which linearity is satisfied.

A pressure interference response $P_{ij}^{prf}(t)$ between two perforations i and j is defined as the pressure response at perforation i to unit-rate production of fluid from perforation j, and is a function of time. For a given pair of perforations i, j, the pressure interference response $p_{ij}^{prf}(t)$ is non-zero only if the formation regions intersected by perforations i, j are in fluid communication. Once the pressure interference responses $P_{ij}^{prf}(t)$ are known, application of the superposition principle expresses the pressure $p_i(t)$ at a particular perforation i as a sum of convolution integrals:

$$p_i(t) = p_0 - \sum_{j=1}^{n} \int_0^t \frac{dP_{ij}^{prf}(\tau)}{d\tau} q_j(t-\tau) d\tau \qquad (11)$$

where $p_0$ is the initial reservoir pressure in the formation region intersected by perforation i. The sum of convolution integrals is taken over all n perforations in the reservoir (those n perforations including perforation i itself), with $q_j(t)$ representing the flow rate over time from perforation j.

Based on equation (11) and according to embodiments of this invention, the solution of the fluid flow problem involves the steps of:

1) Computation of the pressure interference responses $P_{ij}^{prf}(t)$;
2) Determining the rate contributions from individual perforations $q_j(t)$ necessary to satisfy the rate and bottomhole pressure constraints at the wells.

The nature of the reservoir for which these calculations are to be performed will dictate specific approaches to the solution of the fluid flow problem, as will be described below in further detail. In any case, these pressure interference responses and rate contributions effectively provide an overall solution for the fluid flow problem, and also provide a modeled pressure over time at a particular perforation i of interest. This modeled bottomhole pressure can be compared against the measured bottomhole pressure for that perforation or well, to validate the reservoir model for which the fluid problem was solved in this manner.

Superposition equation (11) takes a simpler form when transformed into the Laplace domain:

$$p_i(s) = \frac{p_0}{s} - \sum_{j=1}^{n} sP_{ij}^{prf}(s)q_j(s) \quad (11a)$$

Normally, the reservoir is produced with some constraints that are imposed on the wells, but not on perforations. For example, well rates are controlled by chokes, and flow rates are measured for the well as a whole and not for individual perforations. In addition, if a well has several perforations, the pressures at each of these perforations are not independent from one another. On the other hand, all perforations produce against one common bottomhole pressure, which is the well-flowing pressure.

Equations (11) and (11a) provide mathematical expressions of so-called "perforation-level" superposition. In the case in which the turbulence effect is negligible, and in which all reservoir layers initially exist at the same reservoir pressure, this perforation-level superposition reduces to a simpler and more efficient (for purposes of this invention) form of "well-level" superposition, as will be established in the following description. In addition, matrix equations for the computation of perforation rate contributions in response to rate constraints imposed on the wells will also be developed.

The practical constraints that the fluid production from all perforations in a well (accounting for wellbore storage) adds up to the total well rate, and that all perforations of the well produce against one common well-flowing pressure, are formulated using equation (11a) as follows:

$$\sum_{j \subset m} q_j(s) + \frac{24 C_w}{B} s \sum_{j=1}^{n} sP_{ij}^{prf}(s)q_j(s) = Q_m(s) \quad (12)$$

$$\sum_{j=1}^{n} sP_{ij}^{prf}(s)q_j(s) - \sum_{j=1}^{n} sP_{kj}^{prf}(s)q_j(s) = 0 \quad (12a)$$

In this case, equation (12) is written for a given well m, and $Q_m(s)$ is the well rate in Laplace space; equation (12) is the Laplace transform of equation (9a) described above. The first sum in the left-hand side of equation (12) is taken over all of the perforations of well m. The second sum in that left-hand side is taken over all of the perforations in the model, and index i in this second sum refers to any perforation of well m. In equation (12a), indices i and k refer to any two perforations of well m. For a well m that has l perforations, then l–1 independent equations (12a) can be formed, one for each pair of perforations in well m. Hence, the total number of equations (12) and (12a) for well m is equal to l, which as mentioned above is the number of perforations in that well alone.

Consider the case in which only one well m is producing at its flow rate $Q_m(s)$, while all other wells are closed. However, if a well is closed and its flow rate is zero, the flow rates of its individual perforations are not necessarily zero; rather, a cross-flow through the wellbore among perforations of a closed well can develop as a result of pressure interference from the producing well m. The well constraint equations for these closed wells are similar to equations (12) and (12a) for the producing well m, except that the right-hand side of the corresponding equation (12) for each of the closed wells is zero (because these wells are closed). One can then produce a system of matrix equations to determine the perforation rates for all perforations, in the case of a single well m that is producing at a flow rate $Q_m(s)$. The total number of these equations is equal to the number of perforations in the model. The left-hand sides of these equations form a matrix M having dimensions of n rows and n columns, n being the total number of perforations in the model. The right-hand side of this system is represented by a column vector $\bar{b}$ having a single non-zero term corresponding to the flow rate of the single producing well m. The resulting problem, or system of equations, is represented in matrix form as:

$$M \cdot \bar{q} = \bar{b} \quad (12b)$$

Solution of this matrix equation (12b) produces a column vector $\bar{q}$ having n rows representing the rates of each perforation in the model, for the specific case in which the single well m is producing at the flow rate $Q_m(s)$ and all other wells are closed.

A similar matrix equation can be constructed to compute flow rates for the individual perforations in the case in which a different single well produces. This similar matrix equation will have the same matrix M but a different right-hand side vector $\bar{b}$, different in that a different well m' will have a non-zero flow rate $Q_{m'}(s)$. If the number of wells in the reservoir model number $n_w$, then there are $n_w$ vectors $\bar{b}$ that define the well-rate constraints for each of these n, wells. Combining all of these vectors $\bar{b}$ into one matrix A of right-hand sides allows for all of these matrix problems to be solved at once:

$$M \cdot \bar{q} = A \quad (12c)$$

where matrix A has the form:

$$A = \begin{pmatrix} Q_1(s) & 0 & 0 & \ldots & 0 \\ 0 & Q_2(s) & 0 & \ldots & 0 \\ \ldots & \ldots & \ldots & \ldots & \ldots \\ 0 & 0 & 0 & \ldots & Q_{n_w}(s) \\ 0 & 0 & 0 & \ldots & 0 \\ \ldots & \ldots & \ldots & \ldots & \ldots \\ 0 & 0 & 0 & \ldots & 0 \end{pmatrix} \quad (12d)$$

The number of columns in this matrix A is equal to the number of wells $n_w$ and the number of rows is equal to the number of perforations n. This matrix A can in turn be presented as:

$$A = E \cdot \overline{Q} \quad (12e)$$

where matrix E and matrix $\overline{Q}$ are defined as:

$$E = \begin{pmatrix} 1/s & 0 & 0 & \ldots & 0 \\ 0 & 1/s & 0 & \ldots & 0 \\ \ldots & \ldots & \ldots & \ldots & \ldots \\ 0 & 0 & 0 & \ldots & 1/s \\ 0 & 0 & 0 & \ldots & 0 \\ \ldots & \ldots & \ldots & \ldots & \ldots \\ 0 & 0 & 0 & \ldots & 0 \end{pmatrix} \quad (12f.1)$$

$$\overline{Q} = \begin{pmatrix} sQ_1(s) \\ sQ_2(s) \\ \ldots \\ sQ_{n_w}(s) \end{pmatrix} \quad (12f.2)$$

which reduces the matrix problem of equation (12c) to:

$$M \cdot \overline{q}_e = \overline{E} \quad (12g)$$

The solution of equation (12g) produces the matrix $\overline{q}_e$ of perforation rate contributions for the case in which each well produces at a constant unit-rate. Matrix $\overline{q}_e$ has n rows (the total number of perforations), and $n_w$ columns (the total number of wells). This matrix $\overline{q}_e$ is the matrix of perforation rate responses (as opposed to pressure responses) to unit-rate production of individual wells in the reservoir model. In contrast, matrix $\overline{q}$ defined by equation (12c) defines the perforation rate contributions for the case in which each well is producing at its actual rate $Q_m(s)$.

Those skilled in the art having reference to this specification will recognize, from equations (12c) through (12g), that the rate contribution of perforation j when all wells produce according to their rates can be presented in terms of matrices $\overline{q}_e$ and $\overline{Q}$ as:

$$\overline{q}_j(s) = \Sigma_{k=1}^{n_w} \overline{q}_{e_{jk}}(s) s Q_k(s) \quad (12h)$$

Substituting this expression into equation (11a) allows solution of the pressure $p_i(s)$ at any perforation i:

$$p_i(s) = \frac{p_0}{s} - \sum_{j=1}^{n} sP_{ij}^{prf}(s) \sum_{k=1}^{n_w} \overline{q}_{e_{jk}}(s) s Q_k(s)$$

$$= \frac{p_0}{s} - \sum_{k=1}^{n_w} \left[ \sum_{j=1}^{n} sP_{ij}^{prf}(s) s \sum_{k=1}^{n_w} \overline{q}_{e_{jk}}(s) \right] Q_k(s) \quad (13)$$

But each perforation belongs to some well. If one assumes that perforation i belongs to well m, then under the well constraints imposed above, all of the perforations of well m have the same pressure. As a result, equation (13) can be re-interpreted as the pressure of well m (rather than as the pressure only at a perforation i within that well m). The term inside the brackets of equation (13) represents the pressure at perforation i of well m in response to unit-rate production of a well k. Hence, the term inside the brackets in equation (13) provides an expression of the pressure at the well m in response to unit-rate production of well k:

$$P_{mk}^{wl}(s) = \Sigma_{j=1}^{n} P_{ij}^{prf}(s) q_{e_{jk}}(s) \quad (14)$$

Using this notation for the well pressure interference response, equation (13) reduces to:

$$p_m(s) = \frac{p_0}{s} - \sum_{k=1}^{n_w} sP_{mk}^{wl}(s) Q_k(s) \quad (11b)$$

This equation (11b) is an expression for well-level superposition, and has the same structure as equation (11a), which expresses perforation-level superposition. The differences between equations (11a) and (11b) is that the perforation rates and perforation interference responses in equation (11a) are replaced by well rates and well interference responses in equation (11b), and that the summation over perforations in equation (11a) is replaced by a summation over wells in equation (11b). As evident from this derivation, in the case in which the turbulence effect is negligible and in which all reservoir layers have the same initial reservoir pressure at the start of production, perforation-level superposition reduces to well-level superposition.

Similarly, one can consider equation (12h) as an expression of the superposition principle for rate signals, as opposed to the superposition of pressure signals.

In addition, because wellbore storage effect is accounted for in equation (12), the pressure interference responses between wells given by equation (11b) also incorporate wellbore storage effect.

Typically, a well has several perforations (i.e., several connections of the well to surrounding reservoir regions). There are thus fewer wells than perforations in the model, and as a result, there are typically fewer well-level interference responses than perforation-level responses. The algorithm for solving the fluid flow problem based on well-level superposition is thus generally more efficient and robust than that based on perforation-level superposition. It is therefore preferable to use the well-level superposition approach whenever possible.

As evident from the above description, the well-level superposition pressure and rate equations (11b) and (12h), respectively, are expressed in the Laplace domain. One can convert these equations into the real time domain, in the form of convolution integrals, as follows:

$$p_m(t) = p_0 - \sum_{k=1}^{n_w} \int_0^t P_{mk}^{wl}(t-\tau) Q_k(\tau) d\tau \quad (14a)$$

and $$q_i(t) = \sum_{k=1}^{n_w} \int_0^t q_{ik}^{wl}(t-\tau) \frac{d}{d\tau} Q_k(\tau) d\tau \quad (14b)$$

where $P_{mk}^{wl}(t)$ is the well pressure interference response function in the real time domain, as obtained by Laplace inversion of the function $P_{mk}^{wl}(s)$, and where $q_{ik}^{wl}(t)$ is the Laplace inversion of the function $$\overline{q}_{e_{jk}}(s)/s.$$

Pressure Interference Response Calculation

The pressure interference response at any location within a formation region of a reservoir, to fluid outflow from another location of that reservoir, depends on many factors, including the relative locations of the points under consideration, properties of the rock bearing the hydrocarbon, the fluid viscosity and other fluid properties, the size, shape, and connectivity of the relevant formation regions, the presence and location of aquifers or other sub-surface structures that apply pressure (energy) to the hydrocarbon-bearing stratum, and the like. All of these parameters are defined in and by the reservoir model in which the fluid flow problem is being solved.

According to an embodiment of the invention, as described above, the reservoir model is defined according to various elements. One such element, specified above, is referred to as a "region", such regions being portions of hydrocarbon-bearing rock within which the rock properties can be considered constant. In deriving the pressure interference responses according to an embodiment of the invention, two types of regions are considered: one type of region is considered as a two-dimensional region, in which the fluid flow is two-dimensional; the other type of region includes those regions that do not have active perforations, and that have a length-to-width ratio that is very large, such that the effects of fluid flow from that region can be reasonably approximated as one-dimensional (and, if appropriate, extended to have an infinite length). This one-dimensional flow can be considered as a "channel" flow, or as radial flow.

To summarize, the solution of the fluid flow problem that determines the pressure interference responses is carried out in Laplace space, with numerical inversion used to transform the Laplace-space solution into the time domain. The fluid flow problem in two-dimensional regions is solved using a boundary element technique. A general description of a boundary element technique for reservoir applications is published in Kikani et al., "Pressure-Transient Analysis of Arbitrarily Shaped Reservoirs With the Boundary-Element Method", *SPE Formation Evaluation* (March 1992), pp. 53-60; and in Kikani et al., "Modeling Pressure-Transient Behavior of Sectionally Homogeneous Reservoirs by the Boundary-Element Method", *SPE Formation Evaluation* (June 1993), pp. 145-52, both incorporated herein by this reference. The flow problem in one-dimensional regions can be solved using a different and more efficient approach, as described in Levitan et al., "General Heterogeneous Radial and Linear Models for Well Test Analysis", 70*th Annual Technical Conference and Exhibition*, Paper No. SPE 30554 (1995), pp. 225-38, incorporated herein by this reference.

Figure 6A:
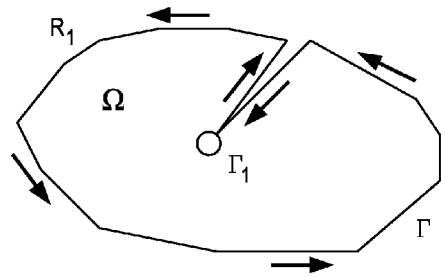
FIGS. 6a through 6h are each a plan view of regions of formations in examples of a reservoir model according to embodiments of the invention.

FIG. 6a illustrates a simple one-region reservoir R1, in which the fluid flow can be defined. The determination of the pressure response according to this embodiment of the invention is based on the transformation of the applicable pressure diffusivity equation (3a) or (3f) to an integral equation, and more specifically to an equation that involves an integral over an area $\Omega$ of the reservoir domain, and a contour integral along the boundary $\Gamma$ of that area $\Omega$. In the case of one or more perforations that are present within region R1, additional contour integrals $\Gamma_1$ over a small circle surrounding each of the perforations (e.g., contour $\Gamma_1$ in FIG. 6a) are also included:

$$\int_\Omega p_d[Gs\eta_d - \Delta G]d\Omega = \tag{15}$$
$$\int_\Gamma \left[G\frac{dp_d}{dn} - p_d\frac{dp_d}{dn}\right]d\Gamma + \sum \int_{\Gamma_1}\left[G\frac{dp_d}{dn} - p_d\frac{dp_d}{dn}\right]d\Gamma_1$$

where G is any differentiable function over domain W, where p is the Laplace transform of the pressure variable, where n refers to the normal direction at the contours $\Gamma$, where s is the Laplace variable, and where $\eta$ is the diffusivity coefficient. The function G, in embodiments of this invention, is selected to be the solution of fluid flow in the infinite domain from a point-source at a location $\zeta$:

$$G(\vec{x}-\vec{\zeta})=-K_0(\sqrt{s\eta}|\vec{x}-\vec{\zeta}|) \tag{15a}$$

where $K_0$ is a Modified Bessel function of order zero. The solution function $G(\vec{x}-\vec{\zeta})$ is associated with the point-source located at the point $\zeta$. This point-source may be placed anywhere inside of region R1 or on its boundary.

The integral in the left-hand side of equation (15) can be expressed in a reduced form as:

$$\int_\Omega p[Gs\eta - \Delta G]d\Omega = -\theta p(\zeta) \tag{15b}$$

If the point-source associated with the function $G(\vec{x}-\vec{\zeta})$ is located inside of region R1, then the coefficient $\theta$ in equation (15b) is equal to $2\pi$. If this point-source is located on the boundary of region R1, then coefficient $\theta$ is the angle subtended by the boundary at point $\zeta$. The contributions of the perforations located inside of region R1 are represented by the contour integrals in the right-hand side of equation (15) over the circles $\Gamma_1$ around each perforation. In the limit, as the radius of these circles $\Gamma_1$ are reduced to zero, these integrals are simplified so that equation (15) reduces to:

$$\theta p(\zeta) = -\int_\Gamma\left[G\frac{dp}{dn} - p\frac{dG}{dn}\right]d\Gamma + 2\pi\sum_i G(\vec{x}_{wi}-\vec{\zeta})q_i(s) \tag{15c}$$

where $q_i(s)$ is the Laplace transform of the rate function for perforation i located inside of region R1. If no perforations are present within region R1, then equation (15c) reduces to:

$$\theta p(\zeta) = -\int_\Gamma\left[G\frac{dp}{dn} - p\frac{dG}{dn}\right]d\Gamma \tag{15d}$$

These equations (15c) and (15d) thus provide an expression for the pressure at any point inside or on the boundary of region R1, in terms of a contour integral over the boundary of that domain. The contour integrals in the right-hand side of equations (15c) and (15d) represent the contributions of the region boundary to the pressure at the point $\zeta$, while the second term in equation (15c) represents the sum of the contributions of the well perforations located inside of region R1 (each such contribution being proportional to the perforation flow rate). As evident from these equations, this contour integral depends on the pressure and the normal derivative of the pressure at the boundary of region R1.

The perforation contribution terms in the right-hand side of equation (15c) are equivalent to line-source approximations of the wellbore. This equation can be written in a more general form, to account for a finite wellbore radius of the perforation, in case the pressure is to be computed at the location of the producing perforation itself. In this case, one can evaluate the pressure at the location of a perforation k by the equation:

$$p_k(s) = -\frac{1}{2\pi}\int_\Gamma\left[G\frac{dp}{dn} - p\frac{dG}{dn}\right]d\Gamma - \tag{15e}$$
$$\sum_{i\neq k} G(x_{wi}-\zeta_k)q_i(s) + \left[\frac{K_0(\sqrt{s\eta}\,r_w)}{\sqrt{s\eta}\,r_w K_1(\sqrt{s\eta}\,r_w)} + S\right]q_k(s)$$

where $r_w$ is the wellbore radius, S is the skin factor of perforation k, and $K_1$ is the modified Bessel function of order one.

Equations (15c), (15d), (15e) serve as the basis for the boundary-element approach used in connection with embodiments of this invention. More specifically, these equations (15c), (15d), (15e) are used for computation of perforation pressure interference responses $P_{ik}^{prf}$ that represent the pressure at a location i in response to unit-rate production from perforation k. This implies that, for a given pressure interference response, only one perforation k is producing; in that case, the sum in the right-hand side of equation (15c) reduces to just one term that is associated with perforation k. And because the Laplace transform of a unit-rate function is equal to 1/s, equation (15c) reduces to:

$$\theta p(\zeta) = -\int_\Gamma \left[ G \frac{dp}{dn} - p \frac{dG}{dn} \right] d\Gamma - \frac{2\pi}{s} G(\vec{x}_{wk} - \vec{\zeta}) \quad (15f)$$

Figure 6B:
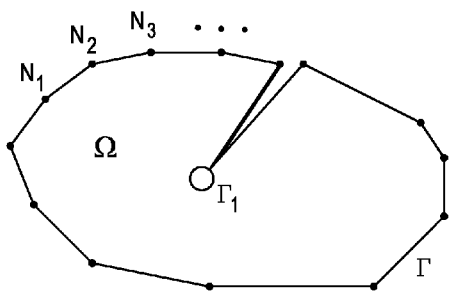

According to the boundary-element approach associated with this invention, a set of nodes are defined and distributed around the boundary of the region, for example as shown by nodes $N_j$ around region R1 in FIG. 6b, with a linear boundary segment defined between each adjacent pair of nodes $N_j$. The pressure at any selected point along the boundary is approximated, in embodiments of this invention, by linear interpolation of the pressure values at the nodes at the ends of its boundary segment. Similarly, the derivative of pressure in the direction normal to the boundary, at any given point along the boundary, is approximated by linear interpolation of the pressure derivative values at the nodes defining the boundary segment that contains the point of interest. Based on these linear approximations, according to embodiments of this invention, the contour integral in equation (15f) reduces to a simple linear combination of the pressure and pressure derivative terms associated with the segment nodes. For example, if the point-source is placed at the boundary node then equation (15f) becomes:

$$\theta_i p_i = \sum_{j=0}^{N-1} [a_j p_j + a_{j+1} p_{j+1} + b_j p n_j + b_{j+1} p n_{j+1}] - \frac{2\pi}{s} G(r_{wik}) \quad (16)$$

where $r_{wik}$ is the distance between a well perforation k and boundary node $N_i$, and $pn_j$ is the normal derivative of pressure at boundary node $N_j$. Also, the following notations are introduced for use in this equation (16):

$$b_j = \frac{\zeta_{j+1} D_1 - D}{\zeta_{j+1} - \zeta_j}; \quad (16a)$$

$$b_{j+1} = \frac{D - \zeta_j D_1}{\zeta_{j+1} - \zeta_j};$$

$$a_j = \frac{\zeta_{j+1} F_1 - F}{\zeta_{j+1} - \zeta_j};$$

$$a_{j+1} = \frac{F - \zeta_j F_1}{\zeta_{j+1} - \zeta_j},$$

$$D = \frac{1}{s\eta_d} \left[ \sqrt{s\eta_d}\, r_j K_1(\sqrt{s\eta_d}\, r_j) - \sqrt{s\eta_d}\, r_{j+1} K_1(\sqrt{s\eta_d}\, r_{j+1}) \right] \quad (16b)$$

$$F = \pm c \left[ K_0(\sqrt{s\eta_d}\, r_j) - K_0(\sqrt{s\eta_d}\, r_{j+1}) \right] \quad (16c)$$

$$D_1 = \int_{\zeta_j}^{\zeta_{j+1}} K_0(\sqrt{s\eta_d(c^2 + \zeta^2)})\, d\zeta \quad (16d)$$

$$F_1 = \pm c \sqrt{s\eta_d} \int_{\zeta_j}^{\zeta_{j+1}} K_1(\sqrt{s\eta_d(c^2 + \zeta^2)}) \frac{d\zeta}{\sqrt{c^2 + \zeta^2}} \quad (16e)$$

where the D and F expressions are the analytical reduction of corresponding integrals, and the $D_1$ and $F_1$ integrals are evaluated numerically.

Equation (16) is a linear algebraic expression that combines the values of pressure and normal pressure derivative at the nodes of the region R1 boundary. Placing the point-source alternatively at each of the boundary nodes produces N of these equations, where N is the total number of nodes in the region boundary. These N equations, when supplemented by additional equations describing the boundary conditions imposed at the boundary, produces a system of matrix equations that, when solved, determine the values of pressure and of normal pressure derivative at each node of the boundary of region R1.

After determining the values of pressure and of normal pressure derivative at all the nodes of the boundary from this system of matrix equations for the case of only one perforation k producing with constant unit-rate, equations (15e) and (15f) then enable computation of the pressure at the location of each perforation located inside of region R1. This is accomplished by successively placing the point-source at the location of each perforation, and computing the corresponding pressure at the perforation location as given by the right-hand-side of equation (15f) (or equation (15e) in the case of the pressure at the perforation k itself). The computation of the contour integral in the right-hand-side of these equations requires the pressure and the normal pressure derivative along the boundary of the region, which was computed earlier.

This process of computing the pressure responses at each of the perforations caused by constant unit-rate production of one perforation is repeated N times, by moving the location of the producing perforation (i.e., the point-source) among the N perforations located inside of region R1.

It is important to balance the number of unknowns (boundary node pressures and derivatives) and the number of matrix equations. The relatively simple examples of FIGS. 6a and 6b illustrate the situation of a single closed reservoir region R1, surrounded by a no-flow boundary. In this example, the boundary nodes number N, resulting in a system of N equations (16) with N unknowns, such that the system specifies a unique solution for the boundary node pressures (the normal derivatives of pressure at the no-flow boundary are all equal to zero).

Figure 6C:
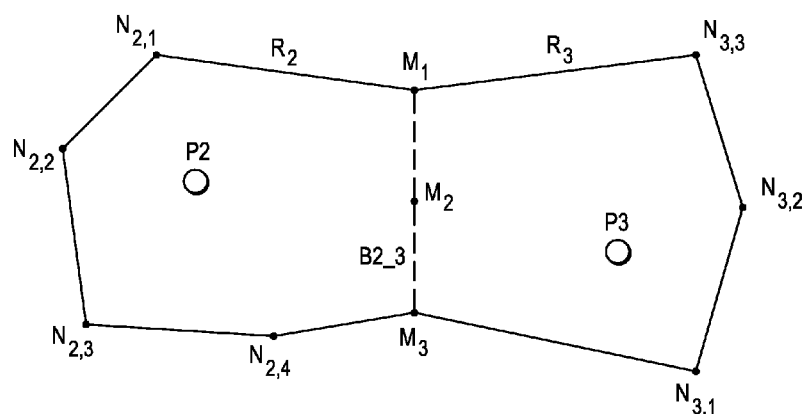

FIG. 6c illustrates the situation of two regions R2, R3 with fluid communication across common boundary B2_3. Perforations P2, P3 are located within regions R2, R3, respectively. Regions R2, R3 are defined as separate regions because they differ in rock properties, or because boundary B2_3 restricts fluid communication between the regions in some manner, or both. Boundary nodes $N_{2,i}$ are specific to the no-flow boundary of region R2, and boundary nodes $N_{3,i}$ are specific to the no-flow boundary of region R3; boundary nodes $M_1$, $M_2$, $M_3$ are defined as common boundary nodes between regions R2, R3, along boundary B2_3 in this example. The number of unknowns in the system of equations (16) for these two regions are thus the number of boundary nodes $N_2$ for region R2 plus the number of boundary nodes $N_3$ for region R3, at which only the pressures are unknown (i.e., pressure derivatives are zero), plus twice the number of common boundary nodes M, because both the pressure $p_j$ and the pressure derivatives $pn_j$ are unknown at these common boundary nodes, for each of the two regions. The number of equations (16) for the two regions equals the number of boundary nodes $N_2+N_3$. However, we also have two equations, for each of the common boundary nodes $M_1$ through $M_3$, that describe merging conditions for pressure and fluid flux as determined by expressions such as equations (4), (5a), (5b) described above, as extended for this particular situation). Accordingly, the system of equations (16) plus the merging conditions produce the total number of matrix equations $N_2+N_3+2M$, which is equal to the number of unknowns in the situation of FIG. 6c.

Figure 6D:
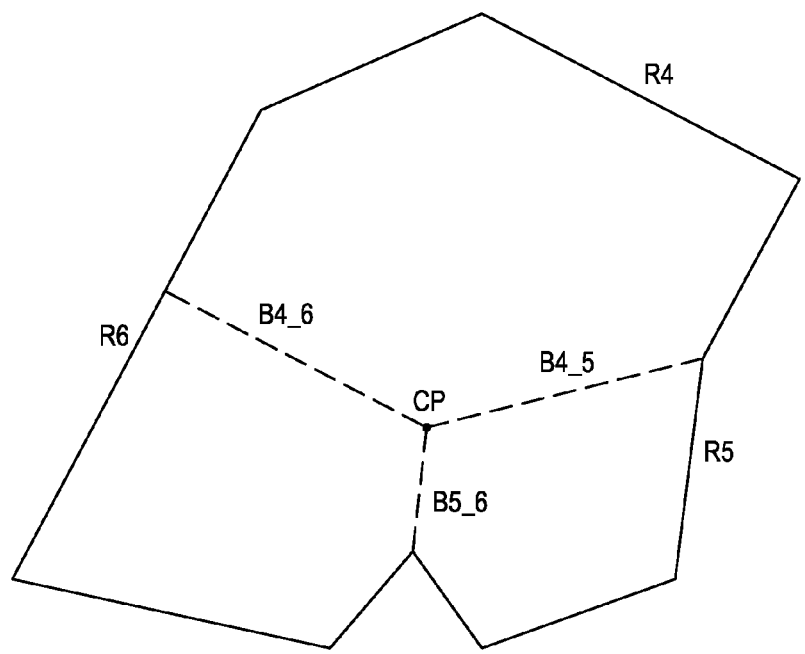
Figure 6E:
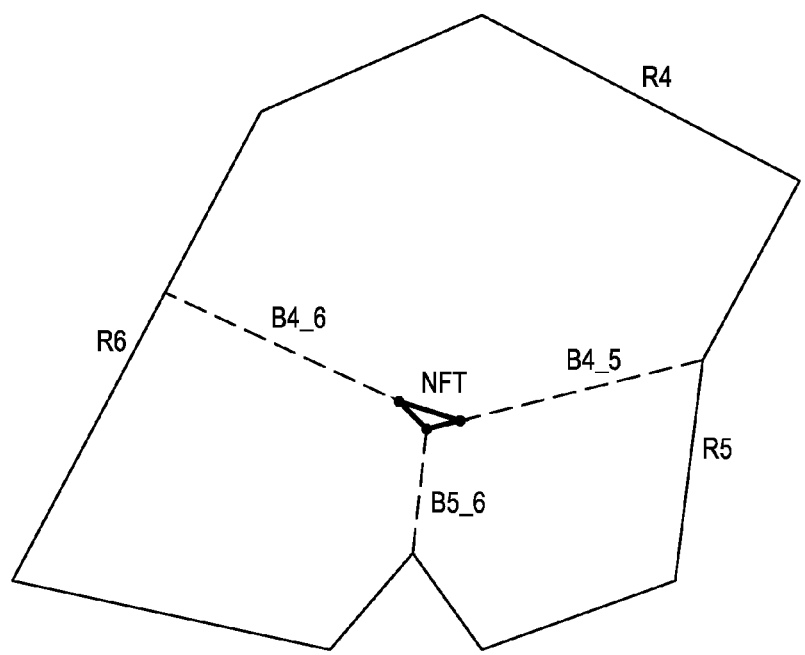

FIGS. 6d and 6e illustrate another potential situation, in which three regions R4, R5, R6 are in fluid communication with one another. In this example, boundaries B4_5, B5_6, B4_6 are boundaries between respective pairs of regions R4, R5, R6, across which fluid communicates between the regions. Pressures $p_j$ and derivatives $pn_j$ at nodes along the boundaries B4_5, B5_6, B4_6 and along the no-flow boundaries of regions R4, R5, R6 can be solved in the manner described above relative to FIGS. 6b and 6c. However, the three boundaries B4_5, B5_6, B4_6 meet at the common point CP; this common point CP will be a boundary node for each of the three regions, at which the merging conditions among the three regions R4, R5, R6 must be satisfied. However, the pressure merging equations (e.g., equations (4), (5a), (5b) described above) for this common point CP are not independent from one another, and as such the overall system defined according to FIG. 6d is under-specified (i.e., there are more unknowns than independent equations). This situation is resolved, in embodiments of this invention, by replacing this common node CP by an infinitesimally small no-flow triangle NFT, as shown in FIG. 6e. In effect, this triangle NFT defines two additional boundary nodes (compared to the single common point CP boundary node), such that the system of matrix equations (16) and the merging conditions are fully specified to yield a unique solution for the pressures and derivatives at the boundary nodes.

Figure 6F:
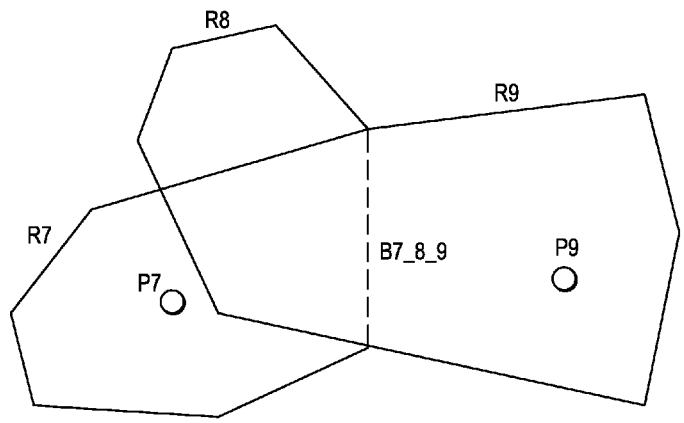

FIG. 6f illustrates a situation in which three (or more) regions R7, R8, R9 connect along a common part of a boundary B7_8_9, as shown. This situation can occur when boundary B7_8_9 is caused by a fault, such that regions R7, R8 are disposed at different depths along one side of the fault, and communicate with region R9 on the opposite side of that fault. Perforations P7, P9 are disposed within regions R7, R9, respectively, as shown. In this case, the number of equations (16) and the merging condition equations are equal to the number of unknowns, and thus can produce a unique solution. The number of pressure unknowns is the sum of boundary nodes $N_7+N_8+N_9$. If M boundary nodes are defined along the common boundary B7_8_9, these nodes will present 3M additional unknowns of normal pressure derivative; however, the merging equations along that boundary B7_8_9 also number three per node. The resulting system of matrix equations is thus adequately specified for a unique solution. In addition, it can similarly be seen that this relationship of equations and merging conditions holds for the more general case of n regions merging at a common boundary, in the manner shown in FIG. 6f and in similar situations.

Figure 6G:
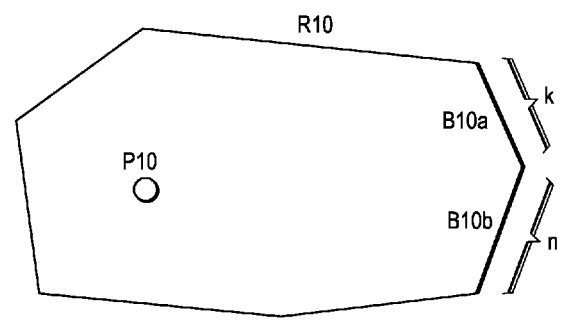
Figure 6H:
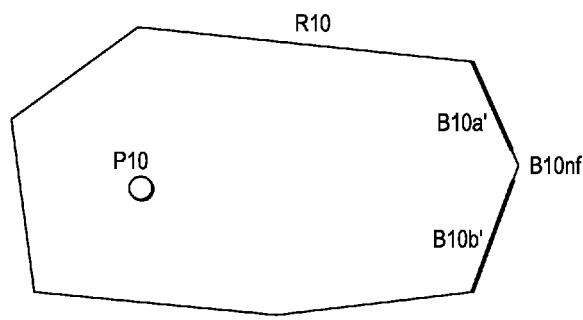

FIGS. 6g and 6h illustrate a somewhat more generalized situation from that shown in FIG. 6f. In FIG. 6g, region R10 (with perforation P10) has a two-part boundary B10a, B10b, but where boundary B10a is in communication with k other regions (not shown) and where boundary B10b is in communication with n (n≠k) other regions (not shown). In this situation, the system of equations (14) and the merging conditions will be underspecified relative to the number of pressure and pressure derivative unknowns. FIG. 6h illustrates an approach to addressing this case, in which a short no-flow boundary segment B10nf is defined between the boundary segments B10a' and B10b'. This correction in the reservoir model effectively inserts an additional boundary node, in a manner that balances the numbers of equations and unknowns, in the manner similar to the situation described above in connection with FIG. 6e.

It is contemplated that those skilled in the art having reference to this specification will be readily able to generate and apply the system of equations (16) and merging conditions to other reservoir region situations, and by extension to more complicated models of the reservoir, so that the pressures and normal derivatives of pressure at the various boundary nodes in the model can be determined, and the matrix of interference pressure responses between perforations $P_{ik}^{prf}(s)$ computed.

As evident from the foregoing description, the fluid flow problem is solved, and the perforation interference responses are computed, in Laplace transform space. In the case when the conditions for use of well-level superposition are satisfied, the computed perforation-level pressure interference responses are combined into the pressure interference responses between wells using equation (14). This requires solution of the matrix problem (12g). Each of the response functions is then converted into real time domain by the use of numerical inversion algorithm. This inversion requires the computation of each of the responses at several values of the Laplace parameter s. It is contemplated that those skilled in the art having reference to this specification will be readily able to implement such computation and inversion using conventional techniques.

Superposition of Flow Rates from Each Well/Perforation

Once the pressure interference responses $P_{ik}^{prf}(s)$ have been calculated for the reservoir model, then the principle of superposition can be applied to the fluid flow problem. More specifically, the simple pressure interference responses between wells or perforations are applied, by superposition, to construct a solution of the fluid flow problem under a set of bottomhole constraints on flow rate and pressure. These constraints enable the rate contributions $q_j(t)$ from individual perforations to be determined in a manner that satisfies the rate and pressure constraints on the wells. And once these perforation rate contributions $q_j(t)$ are determined, these rate contributions can then be applied to the pressure interference responses to derive a pressure signal at any one of the perforations in the reservoir. This enables the derived pressure signal to be compared with actual pressure measurements, to evaluate the fidelity of the reservoir model to the actual reservoir behavior as measured during production As mentioned above, the nature of the reservoir can dictate different approaches to the statement and solution of the reservoir model fluid flow problem. One such decision point involves the determination of whether the superposition can be expressed on a well level, or must instead be expressed on a perforation level. According to this embodiment of the invention, this determination is based on whether a turbulence skin effect at the wellbore is observable, and on whether the reservoir model includes multiple networks of formation regions having different initial reservoir pressure (e.g., if regions having different initial reservoir pressure have perforations into a common well). If either is the case, then the more general approach of superposition of perforation pressure responses should be followed, according to embodiments of the invention. However, if the turbulent skin effect at the wellbore is insignificant, or if all reservoir regions exist at the same initial pressure, then the more robust and efficient well-by-well superposition of pressure and rate interference responses can be used.

Well-Level Superposition

Accordingly, if the assumptions underlying well-level superposition are valid, the relative flow contributions from multiple perforations of a well, to the total production of that well, do not depend on the absolute rate of the well. As a result, the well constraints that all perforations of the same well produce against some common bottomhole pressure are incorporated in the well-level pressure interference responses in Laplace space. The computation of pressure and rate interference responses between wells in this case becomes relatively simple and accurate, and the variation of well rate with time is accounted for through the superposition equations (14a) and (14b).

Perforation-Level Superposition (a) Turbulence Effects

Turbulence effect is a near-wellbore phenomenon. While the fluid flow problem in the reservoir is still governed by linear equations and the superposition principle is valid when the turbulence effect is significant, the contributions of individual perforations to the well flow rate are non-linear and thus cannot be applied in the Laplace domain. This requires that the contributions of individual perforations to the well flow rate must instead be applied in the time domain. Another significant complication in this situation is that the wellbore storage effect must also be incorporated into the solution in the time domain.

In the turbulence case, the pressure $p_i(t)$ at a perforation i, in response to a set of flow rates $q_j(t)$ at other perforations j in the reservoir, is expressed as:

$$p_i(t) = p_0 - \sum_{j=1}^{n} \int_0^t \frac{dp_{ij}^{prf}(\tau)}{d\tau} q_j(t-\tau) d\tau - \overline{D} q_i^2(t) \quad (17)$$

where the normalized turbulence coefficient $$\overline{D} = \frac{\mu B}{2\pi k_i h_i} D,$$

D being the applicable turbulence coefficient (in units of inverse rate d/stb). In the gas case, the equation corresponding to equation (17) is:

$$m_i(t) = m_0 - \sum_{j=1}^{n} \int_0^t \frac{dP_{ij}^{prf}(\tau)}{d\tau} q_j(t-\tau) d\tau - \overline{D} q_i^2(t) \quad (17a)$$

where the notation $P_{ij}^{prf}$ represents the interference response between respective perforations i, j in terms of pseudo-pressure, and where the normalized turbulence coefficient is $$\overline{D} = \frac{\rho_{sc}}{\pi k_i h_i} D.$$

A flow rate history, or history of well production, may be defined as a sequence of flow periods. A transition from one flow period to the next occurs when the choke valve controlling the well is changed. At these transition times, the flow rate of the well, and of individual perforations in the well, may exhibit discontinuity. While the perforation flow rate may also change during a flow period because of wellbore storage afterflow, this rate variation is gradual and continuous. As a result, the integral in equation (17) can be validly presented as sum of integrals over the sequence of flow periods:

$$p_i(t) = p_i^0 - \sum_{j=1}^{n} \sum_{k} \left[ P_{ij}^{prf}(t-t_k)(q_k^+ - q_k^-) + \sum_{k'} \frac{q_{k'+1}^- - q_{k'}^+}{t_{k'+1} - t_{k'}} \int_{t-t_{k'+1}}^{t-t_{k'}} P_{ij}^{prf}(\tau) d\tau \right] - \overline{D} q_i^2(t) \quad (17b)$$

In this equation (17b), the sum with respect to index k is a summation over flow periods, while the sum over index k' is a summation within individual flow periods to approximate the perforation rate variation that is associated with wellbore storage effect.

To properly account for the wellbore storage effect, the time derivative of pressure $p_i(t)$ is required. Neglecting second-order effects, this derivative can be approximated as:

$$\frac{dp_i(t)}{dt} = -\sum_{k} \frac{dP_{ii}(t-t_k)}{dt}(q_k^+ - q_k^-) - \sum_{k}\sum_{k'} \frac{q_{k'+1}^- - q_{k'}^+}{t_{k'+1} - t_{k'}} [P_{ii}(t-t_{k'}) - P_{ii}(t-t_{k'+1})] \quad (17c)$$

With this expression of the pressure derivative, the conditions that define the rate contributions from individual perforations, for the case of a well operating at specified well rate, are given by:

$$\sum_{j \in w} q_j(t) - \frac{24 C_w}{B} \frac{dp_i(t)}{dt} = Q_w(t) \quad (18)$$

$$\sum_{j=0}^{n} \int_0^t \frac{dP_{ij}^{prf}(\tau)}{d\tau} q_j(t-\tau) d\tau + \overline{D} q_i^2(t) - \sum_{j=0}^{n} \int_0^t \frac{dP_{i+1,j}^{prf}(\tau)}{d\tau} q_j(t-\tau) d\tau - \overline{D} q_{i+1}^2 = 0 \quad (18a)$$

where perforations i and i+1 belong to the same well. These equations (18) and (18a) are analogous to equations (12) and (12a) in Laplace space, which as described above apply in the case of no turbulence. Each well defines one instance of equation (18), and m−1 instances of equation (18a), where m is the number of perforations associated with the well.

For a well that is being produced at a specified bottomhole pressure, the constraint of this bottomhole pressure is applied to equation (17b). There are m of these equations (17b), one for each perforation of the well, and the left-hand sides of these equations are prescribed by that well constraint. These equations (17b) are solved for perforation rates $q_i(t)$, using an iterative procedure because these equations are non-linear with respect to $q_i(t)$.

Equations (18) and (18a) are imposed at a set of time nodes $t_k$ of a rate time grid, those nodes associated with the times of pressure measurements. At the same time, these equations (18), (18a) define the rate contributions $q_i(t)$ at those nodes $t_k$ of the rate time grid. It is contemplated that the time-domain solution of these equations (18), (18a) will be performed in an iterative manner, satisfying the constraints in a least-squared sense. It is contemplated, for example, that an objective function in the form of a sum of the squares of residual error of these equations at the time nodes $t_k$ of pressure measurements can be minimized with respect to the perforation rates.

(b) Cross-Flow Caused by Different Initial Pressures

In a multi-layer reservoir with different initial layer pressures, a well connected to multiple reservoir layers will develop cross-flow between layers from the moment it is completed and put in operation. The flow rate of each perforation in such a well can be viewed as consisting of two components: the rate component $q_j^{xf}(t)$ associated with cross-flow due to different initial layer pressures, and the rate component $q_j^p(t)$ associated with well production:

$$q_j(t) = q_j^{xf}(t) + q_j^p(t) \tag{19}$$

By definition, the cross-flow rate component $q_j^{xf}(t)$ represents the flow rate of the perforation j when the well is closed, and thus when the well rate $Q_m(t)$ is equal to zero. Similarly, the production rate component $q_j^p(t)$ represents the perforation rate that develops as a result of production only, and can be computed as described above.

As known in the art, the wells in a reservoir may be completed and brought on-line at different times. This creates difficulties in imposing well constraints in the Laplace domain, requiring that the problem of layer cross-flow be solved in the time domain. On the other hand, wellbore storage effects only affect the pressure behavior associated with cross-flow during a short time after completion of the well. For this reason, the wellbore storage effect is neglected in the solution of the cross-flow problem according to embodiments of this invention, as will be described below.

The well constraints associated with the cross-flow problem are described by:

$$\sum_{j \subset w} q_j^{xf}(t) = 0 \tag{19a}$$

$$\sum_{j=0}^{n} \int_0^t P_{ij}^{prf}(t-\tau) \frac{dq_j^{xf}(\tau)}{d\tau} d\tau - \tag{19b}$$

$$\sum_{j=0}^{n} \int_0^t P_{i+1,j}^{prf}(t-\tau) \frac{dq_j^{xf}(\tau)}{d\tau} d\tau = [p_i^0 - p_{i+1}^0]\theta(t-t_0)$$

Equation (19a) requires that all of the cross-flow rates of the perforations belonging to the same well sum to zero. Equation (19b) describes the physical condition of cross-flow caused by different initial layer pressures, where any two perforations i and i+1, belonging to the same well, produce against the same bottomhole well pressure. The initial layer pressures at perforations i and i+1 are given by $p_i^0$ and $p_{i+1}^0$, respectively; the term $\theta(t-t_0)$ in equation (19b) forces these initial layer pressures to drive the cross-flow beginning from time $t_0$ at which the well is completed and placed in operation. This function $\theta$ is merely the step-function:

$$\theta(t) = \begin{cases} 0, & \text{for } t < t_0 \\ 1, & \text{for } t > t_0 \end{cases} \tag{19c}$$

One equation (19a) and m−1 equations (19b) exist for a given well, where m is the number of perforations in that well that connect to layers that have different initial pressures. These m equations are solved to determine the cross-flow rates $q_j^{xf}(t)$ of these perforations. The solution algorithm here is similar to that described earlier for the perforation-level superposition problem. The problem is formulated as a least-squares fit problem of minimizing the residuals (difference between the left-hand side and right-hand side) of equations (19a) and (19b), at the sequence of time nodes $t_k$.

Comparison with Measured Behavior

Following the calculations described above, it is contemplated that the flowing bottomhole pressure in each well, and the rate contributions of each perforation in each well, are computed as functions of time. These model-derived predictions of downhole pressures and rates can be compared directly with the pressure and rate measurements over time that are acquired during field production. This allows the reservoir model to be calibrated to the observed reservoir behavior over a long period of time, beginning from field startup. The dynamic reservoir behavior, in terms of its observed evolution of well bottomhole pressures and rates over this long period of time, is influenced by reservoir properties, interaction between wells, the volumes associated with different parts of reservoir, and the architecture and connectivity of the reservoir. Because the reservoir models developed in this calibrated manner, according to embodiments of this invention, accurately represent these reservoir complexities and account for the effects of these complexities in simulation, this invention provides the ability to understand and reconstruct reservoir properties and reservoir architecture, through accurate calibration of the reservoir model to the observed dynamic reservoir behavior.

Accordingly, the user of the system and methods according to embodiments of this invention can directly compare the actual downhole pressure measurements over time with the estimated downhole pressure for the same well and perforation, and determine whether the reservoir model used to create the estimates of downhole pressure over time is sufficiently accurate. This comparison of downhole pressure measurements with model estimates can, of course, easily be performed at multiple well locations, and various depths. To the extent that discrepancies remain between the estimated downhole pressure and the actual measurements, expert users, such as reservoir engineers, can adjust or modify the reservoir model, and readily re-calculate the downhole pressure measurements. The adjustments or modifications to the model may include changing the shape, size, or location of various formation regions in the model; adding or deleting regions; combining or separating regions of a formation; adding, modifying, or removing connections among regions; changing parameters within one or more formation regions; and the like. According to this invention, the re-evaluation of the modified model, even despite such significant changes to the regions and connections defining the modeled reservoir, is rapid, as compared with conventional reservoir modeling approaches such as the numerical approaches of finite element or finite difference models. In effect, embodiments of this invention enable a truly interactive "explorer" of reservoir architecture and connectivity.

Upon the estimated pressures from the reservoir model adequately matching the measured downhole pressure, in the judgment of the human user, the model can be used to evaluate other parameters concerning the reservoir. These other parameters include an estimate of the allocation of flow rates from among the perforations of a well, such allocation often being an important parameter in understanding and economically managing the reservoir. As evident from the foregoing description, these perforation flow rate allocations are calculated as part of the overall method and process, and as such are readily available.

Implementation in an Embodiment of the Invention

Given this description of the theory of operation of embodiments of this invention, a description of embodiments of this invention as implemented into the system of FIG. 2, and the like, will now be described. It is contemplated that those skilled in the art having reference to this specification, particularly in light of the theory of operation described above, will be readily capable of incorporating the necessary calculations and operations into a computerized modeling and verification system, such as system 20 shown in FIG. 2 and described above, by way of the appropriate computer program instructions. As such, the following description of the embodiments of this invention will be presented by way of flow charts and the like that elaborate on certain of the system operations described above in connection with FIG. 3.

As discussed above, it is contemplated that those computer program instructions, by way of which this embodiment of the invention is realized, can be stored within system 20, for example within system memory 24 and program memory 34, and retrieved and executed by computational resources such as central processing unit 25 and server 30, respectively. Those computer instructions may be in the form of one or more executable programs, or in the form of source code or higher-level code from which one or more executable programs are derived, assembled, interpreted or compiled. Any one of a number of computer languages or protocols may be used, depending on the manner in which the desired operations are to be carried out. For example, these computer instructions may be written in a conventional high level language, either as a conventional linear computer program or arranged for execution in an object-oriented manner. These instructions may also be embedded within a higher-level application. It is contemplated that those skilled in the art having reference to this description will be readily able to realize, without undue experimentation, this embodiment of the invention in a suitable manner for the desired installations.

As described above in connection with FIG. 3, a human user such as a reservoir engineer operates system 20 to construct a model of the reservoir to be explored according to an embodiment of the invention, in process 38. The defining of the reservoir model by way of the elements of regions, connections, wells, and perforations, and the attributes of those elements will be best performed, in process 38, by the user referring to sources of extrinsic information regarding the reservoir, as received and retrieved in process 36 described above. That extrinsic information includes seismic and other surveys of the geography and sub-surface geology of the production field, well logs, core samples, well tests, and other analysis tools and techniques applied to pre-production and production operations.

Figure 7A:
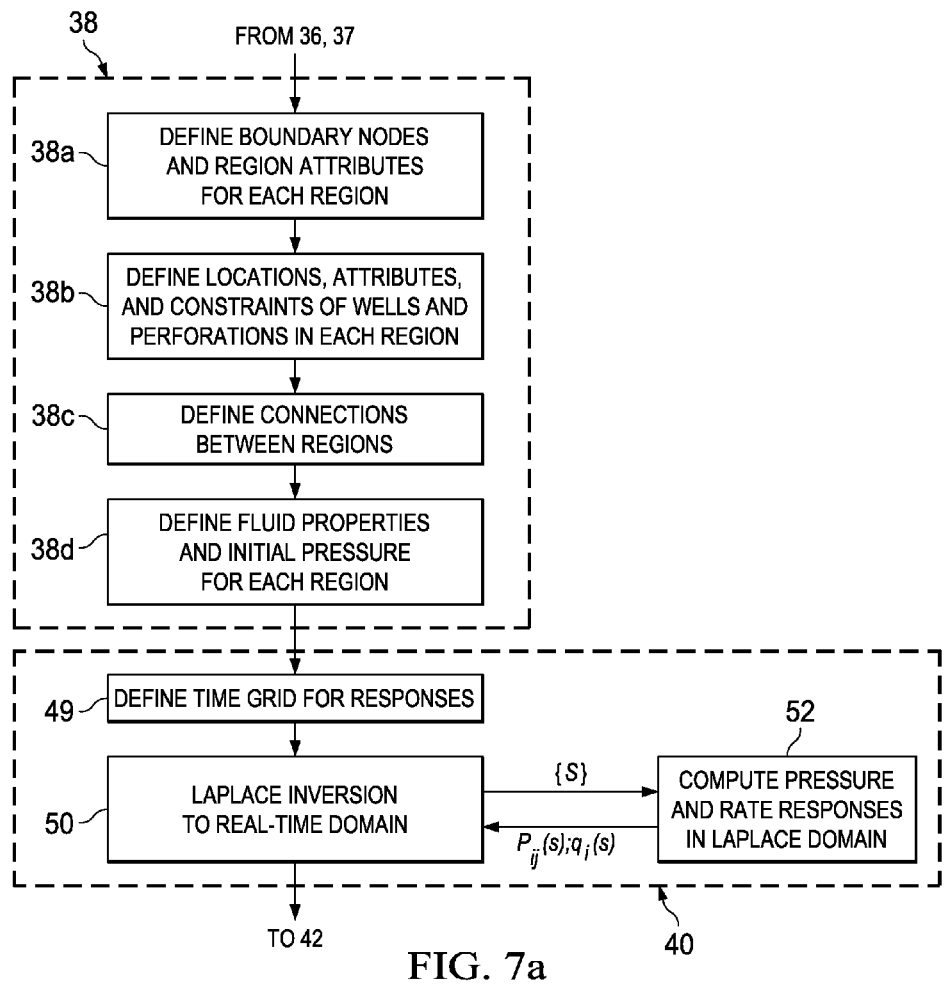
FIGS. 7a through 7d are flow diagrams illustrating the operation of deriving pressure interference responses, in the method of FIG. 3 according to embodiments of the invention.

FIG. 7a illustrates, in more detail, an example of process 38 according to embodiments of this invention, in which the user operates system 20 to interactively define the reservoir model, for example by way of an input device and graphical user interface at workstation 21. In process 38a, reservoir regions in the model are defined by way of their boundary nodes and region attributes. In one example of process 38a, a reservoir map is imported into and displayed by workstation 21 (FIG. 2), and the user interactively distributes nodes along each reservoir region boundary by way of a pointing device and the appropriate capabilities of a graphical user interface, operating on that reservoir map. The number of nodes distributed along the boundary is chosen to provide sufficiently accurate definition of the boundary, and the ratio of the scale of the monitor screen to that of the map is used to translate the boundary description from the screen to field coordinates. Along with this boundary description, the user defines various attributes such as net thickness, rock permeability, porosity, water saturation, rock compressibility for each region, in process 38a. In process 38b, the user interactively defines the location of those wells that are located inside of the region, by defining coordinates of a well perforation, which is a connection between the well and the region. Also in process 38b, the user can define attributes associated with these perforations such as skin factor and wellbore radius, attributes associated with the well as a whole, such as values of wellbore storage and turbulence coefficients, and any operational constraints to be imposed on the wells. Such well operational constraints may be defined in the form of well flow rate as a function of time, or bottomhole flowing pressure as a function of time. In process 38c, the user operates workstation 21 to describe the connections between regions in the reservoir, including identification of the parts of region boundaries associated with each connection, and attributes associated with each region connection such as the coefficients of resistivity corresponding to each side of the connection (e.g., as described above relative to equation 5b). In process 38d according to this example, the user also defines the initial reservoir pressure for each region network in the model, and defines reservoir fluid properties such as formation volume factor, fluid viscosity, and fluid compressibility. In the case of a gas reservoir, gas fluid properties are defined as functions of pressure, including viscosity, z-factor, and pseudo-pressure as functions of pressure. Of course, the specific order in which sub-processes 38a through 38d are performed within process 38 is not important, and can vary from that shown in FIG. 7a if desired.

Figure 7B:
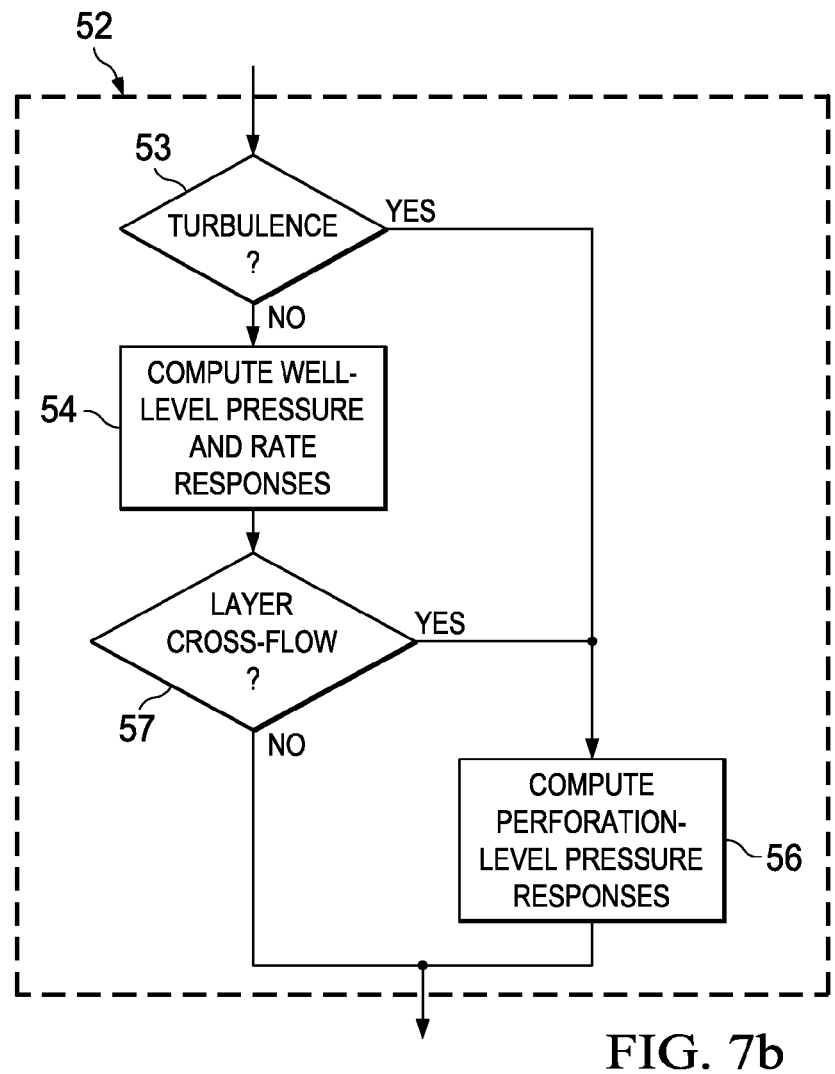

As discussed above in connection with FIG. 3 and as shown in FIG. 7a, upon definition and construction of the model by way of its elements in process 38, process 40 is then performed, by way of which system 20 calculates time-domain pressure interference responses $P_{ij}(t)$ among the perforations in the defined model. In a general sense, according to embodiments of the invention, system 20 carries out process 40 at each time node on a time grid that covers the time period of interest. In process 49, the time grid is defined by the user. Inversion process 50 essentially loops through the time nodes of this time grid; for each time node $t_i$, process 50 determines a set of values of the Laplace variable s at which the fluid flow problem is to be solved in Laplace space, and passes those values to process 52, which computes the appropriate pressure and rate responses in the Laplace domain and passes the results back to process 50. For the pressure interference responses $P_{ij}(s)$ computed in process 40, these responses are either expressed at the well level, reflecting pressure interference responses at one well to unit-rate production at another well, or at the perforation level, or both. Typically, inversion process 50 will call Laplace computing process 52 several times in each loop, with the appropriately selected values of the Laplace variable, depending on the desired accuracy with which the responses are to be calculated. Inversion process 50 then combines the results obtained from process 52, and performs Laplace inversion (e.g., according to the Stephest inversion algorithm) into the real-time domain, for superposition as shown in FIG. 3 (and as will be described in detail below). FIG. 7b illustrates Laplace computing process 52, which utilizes the theory of operation described above in this specification, and which will now be described in further detail.

FIG. 7b illustrates the generalized operation of process 52 by way of which the pressure and rate responses are computed, according to embodiments of this invention. As discussed above, these responses are computed on the well level if conditions allow, or on the perforation level if required; FIG. 7b shows the decision tree for identifying the level on which those responses are to be computed. As evident from the above description relative to FIG. 7a, process 52 is called multiple times by inversion process 50; as such, it is contemplated that this decision tree shown in FIG. 7b may be executed only a single time for a given model. However, the decision tree illustration of FIG. 7b is useful to illustrate the manner in which the proper interference level is determined. As shown in FIG. 7b, decision 53 is first performed by system 20 to determine whether the turbulence effect is believed to be significant according to the current reservoir model. If so (decision 53 is yes), perforation level response are computed in process 56. In the case with no turbulence (decision 53 is no), then well-level pressure and rate responses are computed in process 54. However, even in the absence of turbulence, perforation-level pressure responses may be necessary if cross-flow among perforations within the same well is present. Decision 57 is executed for those models with multiple region networks, to compare initial pressures of those regions. If different initial pressures are present (decision 57 is yes), a condition exists for a cross-flow through wells caused by those different initial pressures, and perforation-level responses are computed in process 56, in addition to the well-level responses computed in process 54. If different initial layer pressures are not present (decision 57), or upon completion of process 56 to compute the perforation-level responses as necessary, process 52 is complete and the results are passed back to inversion process 50.

Figure 7C:
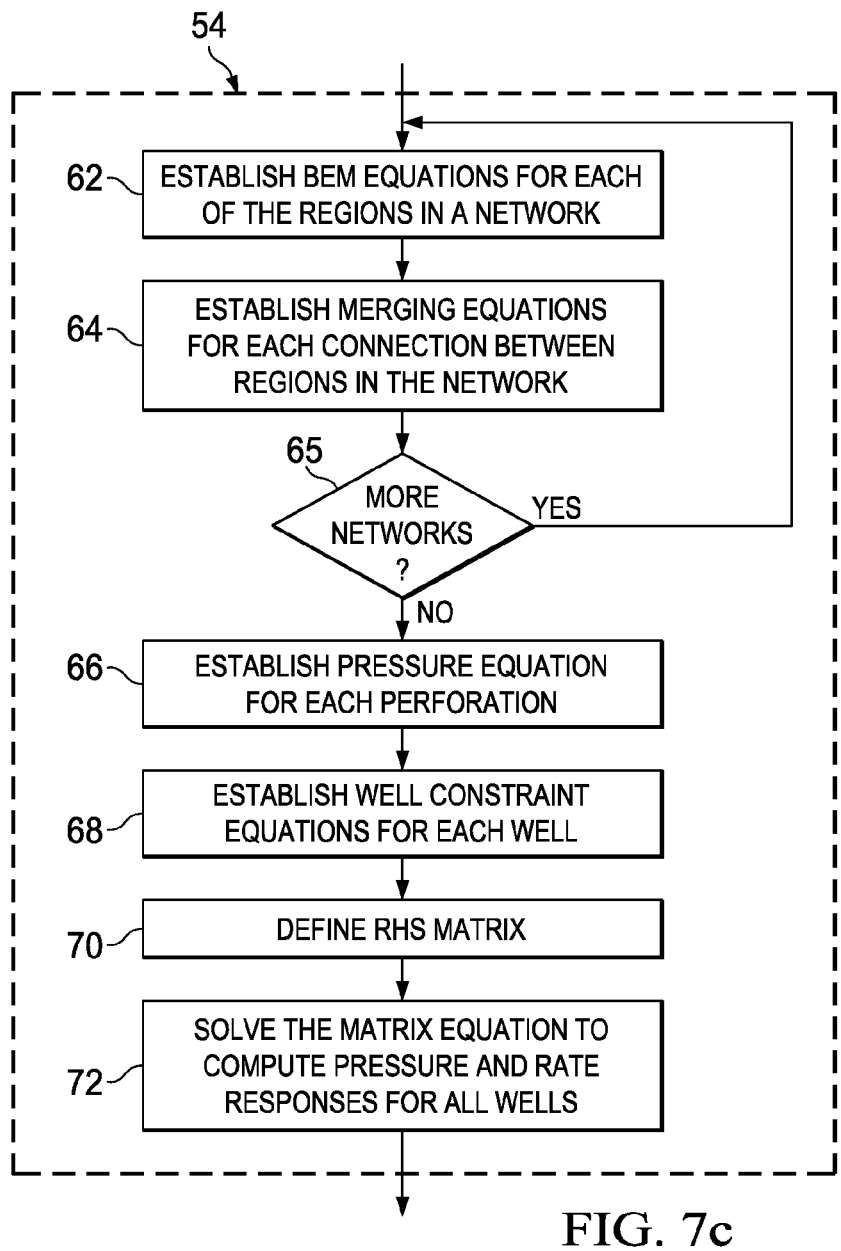

FIG. 7c illustrates, in further detail, an example of an implementation of process 54 by system 20, in computing well-level pressure and rate responses. As described above in connection with the theory of operation of this invention, the computation of pressure and rate responses reduces to a matrix equation that combines several groups of equations discussed above. In order to be solved, this matrix equation (i.e., the equations making up that matrix equation) must be set up, or established, by retrieving and calculating the necessary coefficients and parameters involved in those equations, in a manner that is specified by or results from the definition of the reservoir model in process 38. In process 62, system 20 sets up the boundary-element equations (16), for each boundary node of each region in a given network of regions in the model, where a network of regions corresponds to those reservoir regions that are interconnected with one another. In process 64, system 20 sets up the appropriate merging equations (4) and (5b), for every respective pair of the boundary nodes corresponding to each connection defined in the model for that network. Decision 65 determines whether additional networks remain to be established by processes 62, 64; if so (decision 65 is yes), processes 62, 64 are repeated as necessary for those networks. Process 66 sets up pressure equation (15a) for each perforation in the model, while process 68 sets up the constraints defined by equations (12) and (12a), formulated for every well in the model. As a result of the processes 62, 64, 66, and 68 in FIG. 7c, the necessary equations for assembly of a global matrix M are derived. In process 70, the right-hand-side matrix E defined by equation (12f.1) is defined.

As such, and as described above, the problems of computing interference pressure responses between wells, and of computing the perforation rate contributions associated with unit-rate production of wells, reduces to the matrix problem:

$$M \cdot y = E \qquad (20)$$

Vector y of unknowns includes the pressure at each boundary node of every region of the model, the normal pressure derivative at the boundary nodes of all connections between regions, the rate contributions of each well perforation, and the pressure at each perforation in the model. Each column in right-hand side matrix E corresponds to the condition of one and only well producing at unit rate, with all other wells closed. As such, solving matrix equation (20) with $n_w$ columns of right-hand side vectors in matrix E, one column for each of the $n_w$ wells in the model, will produce $n_w$ solution vectors y. Each solution vector y thus contains the corresponding pressure interference responses at each well, for the specific case of unit-rate production from one of the wells. The solution and computation of these solution vectors y for all wells in the model is performed by system 20 in process 72, using conventional matrix and linear algebra techniques and algorithms, as will be known by those skilled in the art having reference to this specification. As evident from this description, the computation of all of these pressure interference responses is especially efficient because only one inversion of matrix M is required. Upon completion of this instance of computation process 52 as called within process 40 (FIG. 7a), all of the terms of the well-level interference response matrix $P_{ij}^{wl}$ are produced.

Figure 7D:
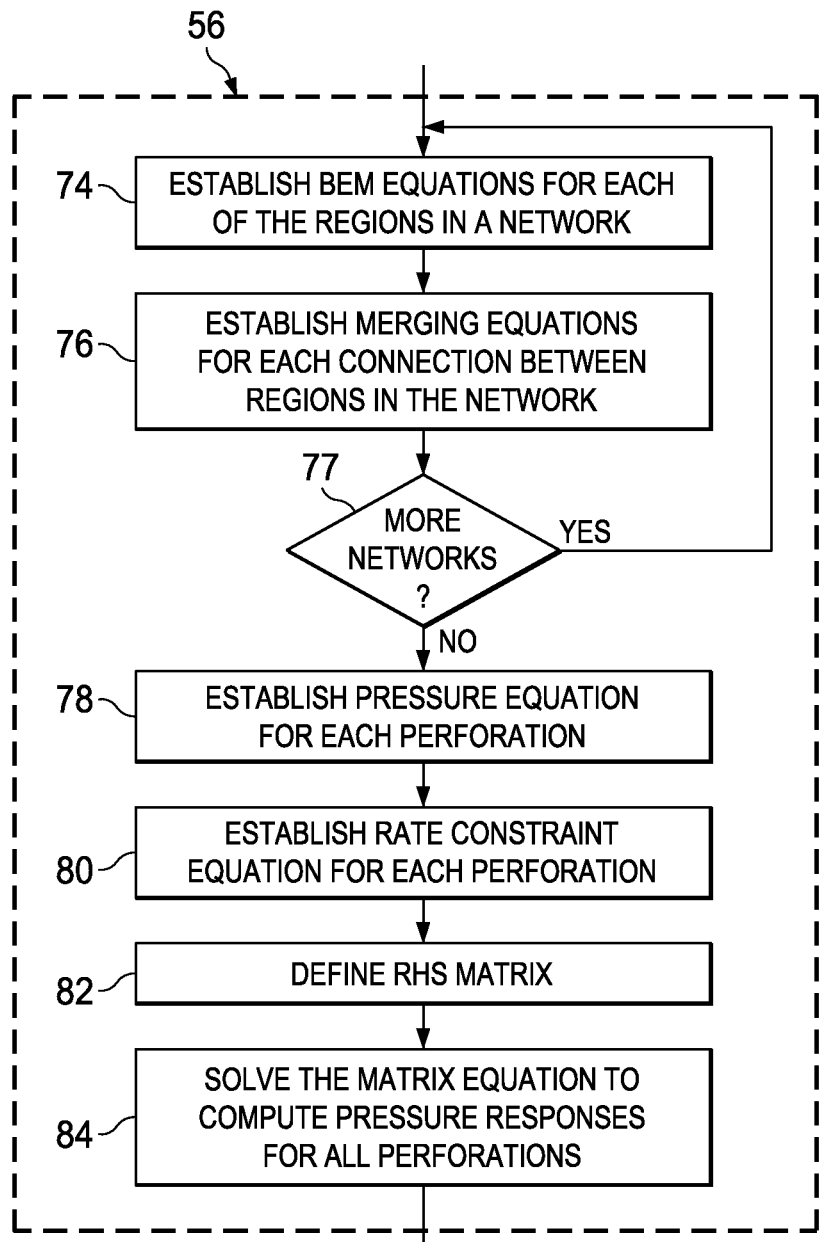

Similarly, as shown in FIG. 7d, perforation-level pressure interference response computation process 56 is performed by system 20, in embodiments of this invention, by way of a somewhat similar manner. While the computation of perforation-level pressure interference responses is also reduced in process 56 to one global matrix equation (20), as in process 54, the matrices M and E used in process 56 differ from those used in process 54. Processes 74, 76, and 78 of process 56 shown in FIG. 7d set up the boundary element equations for boundary nodes of model regions, the equations for region connections, and the pressure equations for perforations, identically to the respective processes 62, 64, and 66 of process 54 shown in FIG. 7c. Process 80 defines the pressure equation for each perforation, and process 82 defines the perforation rate constraints, both on a perforation level, namely for the condition in which only one perforation produces at unit rate flow while the flow rates of other perforations are zero. The resulting set of perforation constraint equations is presented in the matrix form as:

$$\sum_{k=1}^{n} \delta_{ik} q_k = \frac{1}{s} \delta_{ij} \qquad (21)$$

where n is the total number of perforations, and $\delta_{ij}$ follows the Kronecker notation:

$$\delta_{ij} = \begin{cases} 1, & \text{for } i = j \\ 0, & \text{for } i \neq j \end{cases}$$

The right-hand side of equation (21) provides the only non-zero entries in the right-hand side matrix E of equation (20). This matrix E has n columns, one for each producing perforation. Vector y of unknowns in equation (20) includes the pressure at each boundary node of every region of the model, the normal pressure derivative at the boundary nodes of all connections between regions, the rate contribution of each perforation, and the pressure at each perforation in the model. The n solution vectors y that are recovered in solving matrix equation (20) with n columns of right-hand side vectors in matrix E, one column for each of the n perforations in the model, thus produces n solution vectors y. Each solution vector y thus contains the corresponding pressure interference responses at each perforation, for the specific case of unit-rate production from one of the perforations. In this perforation-level process 56, the solution and computation of these solution vectors y for all perforations in the model is performed by system 20 in process 84, using conventional matrix and linear algebra techniques and algorithms, as will be known by those skilled in the art having reference to this specification. As in the well-level process 54, the computation of all of these pressure interference responses in process 56 is especially efficient because only one inversion of matrix M is required. Upon completion of this instance of computation process 52 as called within process 40 (FIG. 7a), all of the terms of the perforation-level interference response matrix $P_{ij}^{prf}$ are produced.

Referring back to FIG. 7a, after the derivation of the Laplace domain pressure interference responses $P_{ij}(s)$ in process 52, whether at the well or perforation level, system 20 converts these interference responses to time domain pressure interference responses $P_{ij}(t)$, in process 50. System 20 is now ready to apply the measured well flow rates for the wells in the production field to these pressure interference responses, so that a time-domain estimate of the downhole pressure $p_i(t)$ can be derived for one or more wells of interest, over at least a portion of the time period corresponding to those pressure and well rate measurements. Superposition of the measured time-varying flow rates $Q_i(t)$ from the multiple wells in the production field allows evaluation of the pressure changes caused by flow from those wells that are in sub-surface fluid communication with the wells of interest, to arrive at an estimate of downhole pressure based on the reservoir model. This superposition is performed in process 42 (FIG. 3), following the approach that is most efficient for the particular physical conditions of the wells, as will now be described in connection with FIG. 8. For each well in the model, process 42 also allocates the measured well rate $Q_i(t)$ into several components $q_j(t)$, each representing the rate contribution of an individual perforation j.

Figure 8:
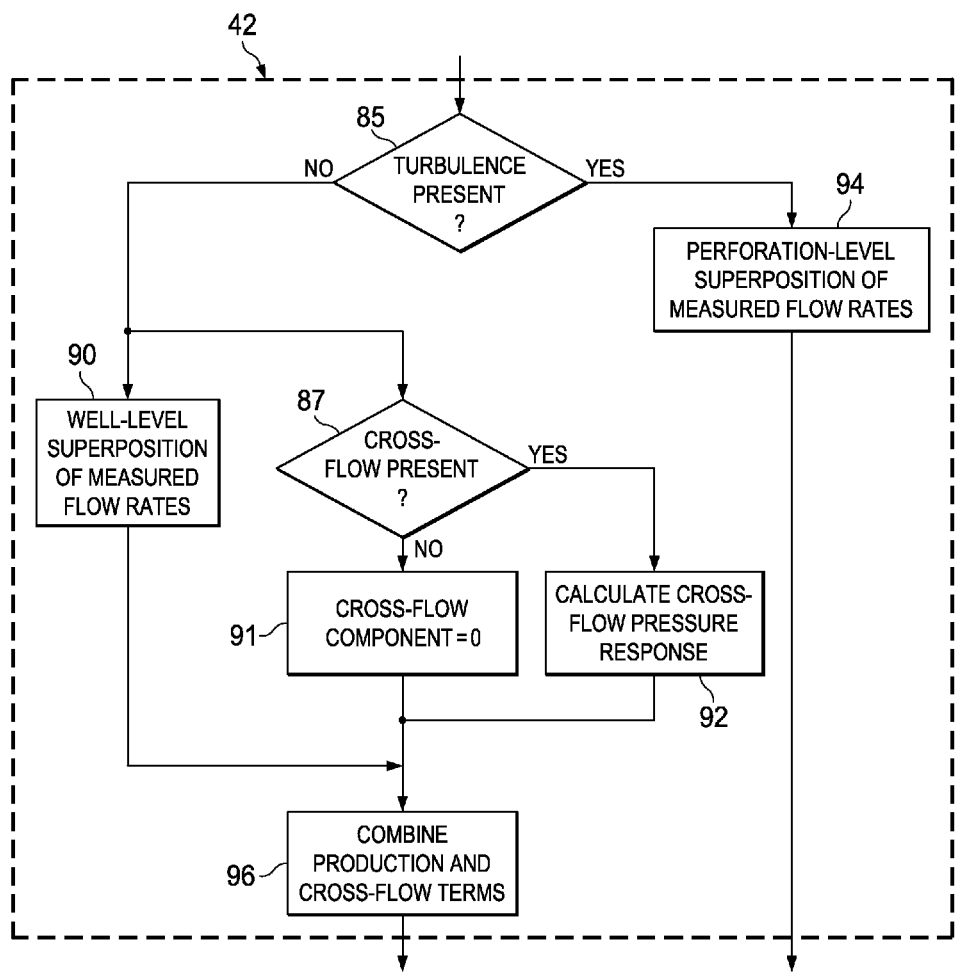
FIG. 8 is a flow diagram illustrating the selection of well-level or perforation level superposition in the method of FIG. 3 according to embodiments of the invention.

FIG. 8 illustrates the overall decision and calculation process within superposition process 42. According to embodiments of this invention, all computations in process 42 are performed in the time domain (rather than in the Laplace domain). As described above in connection with the theory of operation of this invention, in the case in which the turbulence effect is negligible, the more robust and computationally efficient method of well level superposition is used, otherwise perforation-level superposition is required. This determination is made, in process 42 illustrated in FIG. 8, by system 20 executing decision 85; it is contemplated that decision 85 can be readily performed by interrogating the parameters of the reservoir model as established by the user in process 38 (FIG. 3) or by reference to the result of previous decision 53 (FIG. 7b).

If decision 85 determines that the turbulence effect is not significant, then superposition can be performed using well-level pressure and rate interference responses that were computed previously for this model in process 40. This well-level superposition accounts only for the pressure and rate changes in the well caused by production. Process 90 in FIG. 8 represents this well-level superposition, which will now be described in more detail with reference to FIG. 9a.

Figure 9A:
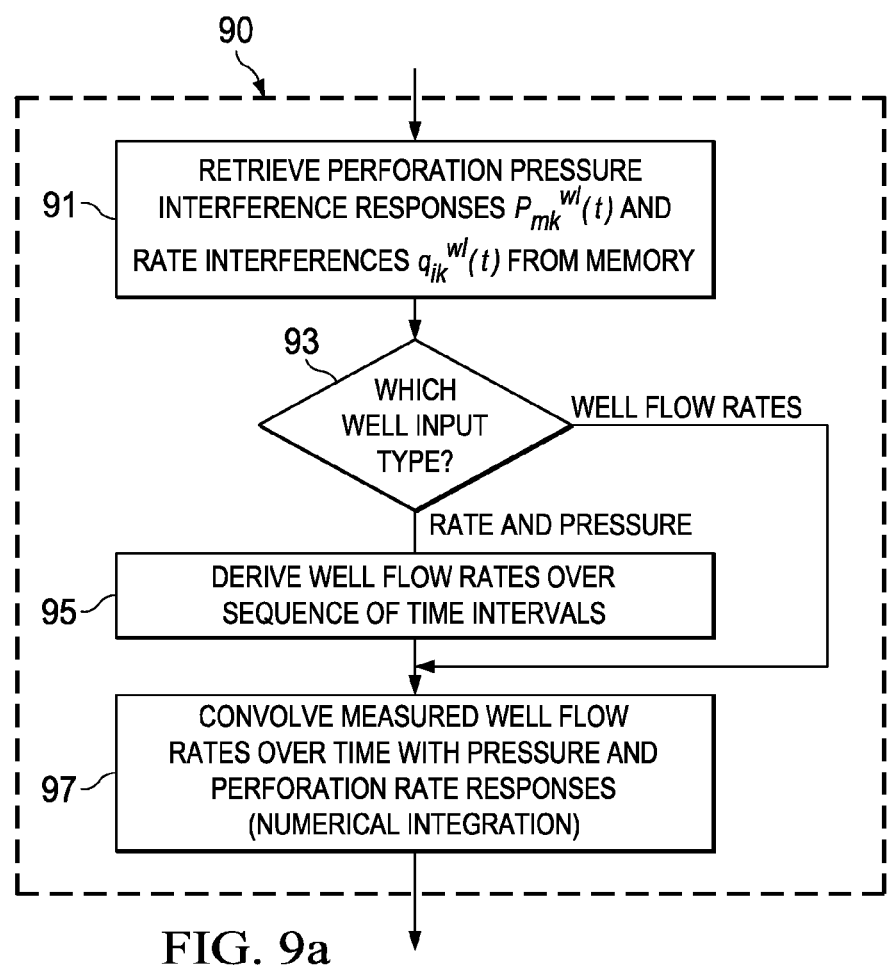
FIGS. 9a and 9b are flow diagrams illustrating the operation of the method of FIG. 8 in superposition of well flow rates to pressure interference responses, in the method of FIG. 3 according to embodiments of the invention.

As shown in FIG. 9a, well-level superposition process 90 uses pressure interference responses $P_{mk}^{wl}(t)$ and perforation rate responses $q_{ij}^{wl}(t)$ t to well flow rates $Q_j(t)$; these responses are retrieved from memory in process 91. It is contemplated that the flow rate history for wells in the field may be directly available as well flow rates over time, for example in those cases in which each well in the production field is being operated at a specified flow rates. In those cases in which the well flow rates are not directly available over the time period of interest, the bottomhole pressure measurements may be used to derive the well flow rate. The manner in which process 90 is executed by system 20 depends on the type of well flow rate inputs that are available, which in the example of FIG. 9a is determined by system 20 in decision 93, by querying the available measurements acquired by processes 31, 33 (FIG. 3) and stored in library 32 or some other memory resource in system 20 (FIG. 2).

If the wells produce at specified rates $Q_j(t)$ over time or if the well flow rate history is otherwise known or well-behaved (decision 93 determines "well flow rates" as the input type), the calculations involved in well-level superposition process 90 are straightforward. As described above, equations (14a) and (14b) express the pressure and rate interference responses for each perforation, as derived by system 20 in its execution of processes 50 and 52 described above in connection with FIGS. 7a and 7b:

$$p_m(t) = p_0 - \sum_{k=1}^{n_w} \int_0^t P_{mk}^{wl}(t-\tau)Q_k(\tau)d\tau \text{ and} \quad (14a)$$

$$q_i(t) = \sum_{k=1}^{n_w} \int_0^t q_{ik}^{wl}(t-\tau)\frac{d}{d\tau}Q_k(\tau)d\tau \quad (14b)$$

These response functions, which were retrieved by system 20 in process 91 of FIG. 9a, are then convolved by system 20 in process 97 with the known or specified well flow rates $Q_j(t)$ over the time period of interest, using conventional numerical integration techniques. It is contemplated that those skilled in the art having reference to this specification will be readily able to implement the appropriate computer programs executable by system 20 to perform this integration. Typically, as a result of process the pressure for each well in the model and the rates for each perforation of the well will be evaluated by system 20 in process 97.

On the other hand, the more general case of well-level superposition is indicated by the typical production operation in which wells are operated to produce at specified flow rates during some time periods, and at specified bottomhole pressures during other time periods. When a well is producing at a specified bottomhole pressure, the rate of the well is not directly available to the superposition process and must therefore be determined from the available pressure data, which complicates the execution of this embodiment of the invention in performing well-level superposition process 90. As such, if the well input types include bottomhole pressure measurements (decision 93 returns "rate and pressure"), process 95 is then executed by system 20 to derive the well flow rates from the bottomhole pressure measurements and any available rate measurements.

In process 95 according to this embodiment of the invention, the overall time span of the simulation is divided into a sequence of time intervals, or "well control periods". During each well control period, each well in the model is operated at either a specified rate or at a specified pressure, and process 95 will reconstruct well bottomhole pressure for some wells, and well rate for other wells, on a sequence of these well control periods. Process 95 operates sequentially on these well control periods, so that by the time that computations associated with a specific well control period are performed, the rates of all the wells in the model prior to that well control period will either be known or reconstructed already. The well rates and well pressures during this control period are reconstructed on a sequence of time nodes $t_m^q$ and $t_m^P$, respectively. The time nodes $t_m^q$ correspond to the times of specified well rate, and the time nodes $t_k^P$ are typically defined to coincide with the times of bottomhole pressure measurements. For a well m operated at a specified bottomhole pressure, the pressure at the time node $t_k^P$ follows equation (14a). Rewriting this equation (14a) as suitable for this time sequence case:

$$p_m(t_k^P) = p_0 - \sum_{j=1}^{n_w} \int_0^{t_1^q} P_{mj}^{wl}(t_k^P - \tau)\frac{d}{d\tau}Q_j(\tau)\,d\tau - \quad (22)$$

$$\sum_{j=1}^{n_w} \sum_{t_m^q \leq t_k^P} P_{mj}^{wl}(t_k^P - t_m^q)[Q_j(t_m^q) - Q_j(t_{m-1}^q)]$$

The last term in the right-hand side of equation (22) presents the contribution of the convolution integral beginning from the start of the current well control period, and is presented as a sum of terms associated with rate changes during this period. The left-hand side term $p_m(t_k^P)$ is known, because well m is being operated at a specified bottomhole pressure during this well control period. In process 95, the well rates $Q_j(t_m^q)$ in the last term of the right-hand side of equation (22) are determined so that the right-hand side of equation (22), when evaluated, approaches the known value of the left-hand side term $p_m(t_k^P)$, within a desired tolerance. According to embodiments of this invention, a minimization problem is formulated, to minimize the difference between the two sides of equation (22) at the time nodes $t_k^P$, typically as a least-squares fitting problem. For example, an objective function in the form of the sum of squares of residual error of these equations, at time nodes $t_k^P$, for the wells operated at specified bottomhole pressure, is formed and minimized with respect to the well rates $Q_j(t_m^q)$. It is contemplated that those skilled in the art having reference to this specification will be readily able to implement the appropriate computer programs executable by system 20 to perform process 95. Upon solving this minimization problem in process 95, system 20 will have derived all of the rate functions $Q_j(t)$ of the wells in the model, including those wells that are operated at a specified bottomhole pressure during certain current well control period, over the sequence of time nodes $t_m^q$ and $t_m^P$. Following this well rate reconstruction, the bottomhole pressure of the remaining wells that are operated at specified rate is determined by system 20 from equation (14a), and equation (14b) is executed by system 20 to compute the perforation rate contributions for all wells, in process 97 in the manner described above.

In either case, whether a full rate history for all wells, or specified pressure and rate measurements are available, well-level superposition process 90 is complete for the non-turbulent case. At some point in process 42, for this non-turbulent case, decision 87 is performed by system 20 to determine whether layers (region networks) in the model have different initial pressures. As described above, these different initial pressures cause cross-flow through wells to develop, such cross-flow producing additional contributions to the well pressure and perforation rates. If so (decision 87 is yes), the contributions of the cross-flow are computed by system 20 in process 92, applying the perforation-level pressure and rate responses computed by system 20 in process 40, and in the manner described above in connection with the theory of operation, with reference to equations (19a) and (19b). It is contemplated that those skilled in the art having reference to this specification will be readily able to derive the appropriate computer program instructions for the computational resources of system 20 to carry out this evaluation of the cross-flow component. If there is no cross-flow component, because the initial pressures are essential equal (decision 87 is no), then the cross-flow component is set to zero in process 91. Following determination of the cross-flow component, if any, system 20 combines the production and the cross-flow contributions to the well pressure and perforation rates into the final results, in process 96.

Superposition process 42 for the non-turbulent case is then complete. As evident from this description, upon completion of well-level superposition process 90 and the remainder of superposition process 42, the well pressure is computed in process 90 is in the time domain, and can be directly compared (see process 44 of FIG. 3) with pressure measurements obtained by pressure gauges and transducers that are installed downhole in the various wells. As described above, such a comparison enables evaluation of the accuracy of the reservoir model, and can lend insight into the adjustment of that model that may be required to improved its accuracy with real-time measurements.

Referring back to FIG. 8, in the case of a significant turbulence effect in any of the wells (decision 85 is yes), the alternative method of superposition at the perforation level is indicated. In this embodiment of the invention, perforation-level superposition is realized by way of computer program instructions that, when executed, compute bottomhole pressures $p_j(t)$ of the wells and the rate contributions of individual well perforations $q_k(t)$, given the perforation-level interference responses $P_{ij}^{prf}(t)$ and well rates $Q_j(t)$. This perforation-level superposition is executed by system 20 in process 94, using the perforation-level pressure interference responses $P_{ij}^{prf}(t)$ computed in process 40. As will become apparent from the following description of process 93, with reference to FIG. 9b, this superposition approach is more complicated than that of process 90 because of the well constraints to be enforced, such as the constraint that all well perforations produce against the same well flowing pressure.

In the case of a well producing at a specified rate $Q_w(t)$, the rate contributions of individual perforations of the well are determined from equations (18) and (18a), as described above. As evident from that description, equations (18) and (18a) are non-linear with respect to the perforation rates $q_i(t)$; in embodiments of this invention, these non-linear equations are solved using an iterative procedure. On each iteration, the turbulence term $\overline{D}q_i^2(t)$ is approximated as:

$$\overline{D}q_i^2(t) = \overline{D}q_i'(t)q_i(t) \quad (23)$$

where $q_i'(t)$ refers to the rate of perforation i from the previous iteration. Use of this expression for the turbulence term linearizes equation (18a):

$$\sum_{j=0}^{n} \int_0^t \frac{dP_{ij}^{prf}(\tau)}{d\tau} q_j(t-\tau)\,d\tau + \overline{D}q_i^2(t) - \quad (23a)$$

-continued $$\sum_{j=0}^{n} \int_{0}^{t} \frac{dP_{i+1,j}^{prf}(\tau)}{d\tau} q_j(t-\tau)d\tau - \overline{D}q'_{i+1}q_{i+1} = 0$$

As discussed above in connection with the theory of operation of this invention, the convolution integral of equation (23a) is evaluated by piece-wise approximation of the function as integrated, for example as a sequence of line segments between points in time at which the flow rates change. In that approximation, the pressure derivative in equation (18) is approximated according to equation (17c). In an embodiment of this invention, this piece-wise approximation approach is carried out by system 20 iteratively solving a system of equations (18) and (18a), and satisfying the rate and pressure constraints at each of a series of points of an appropriately defined time grid, as will now be described in connection with FIG. 9b.

Figure 9B:
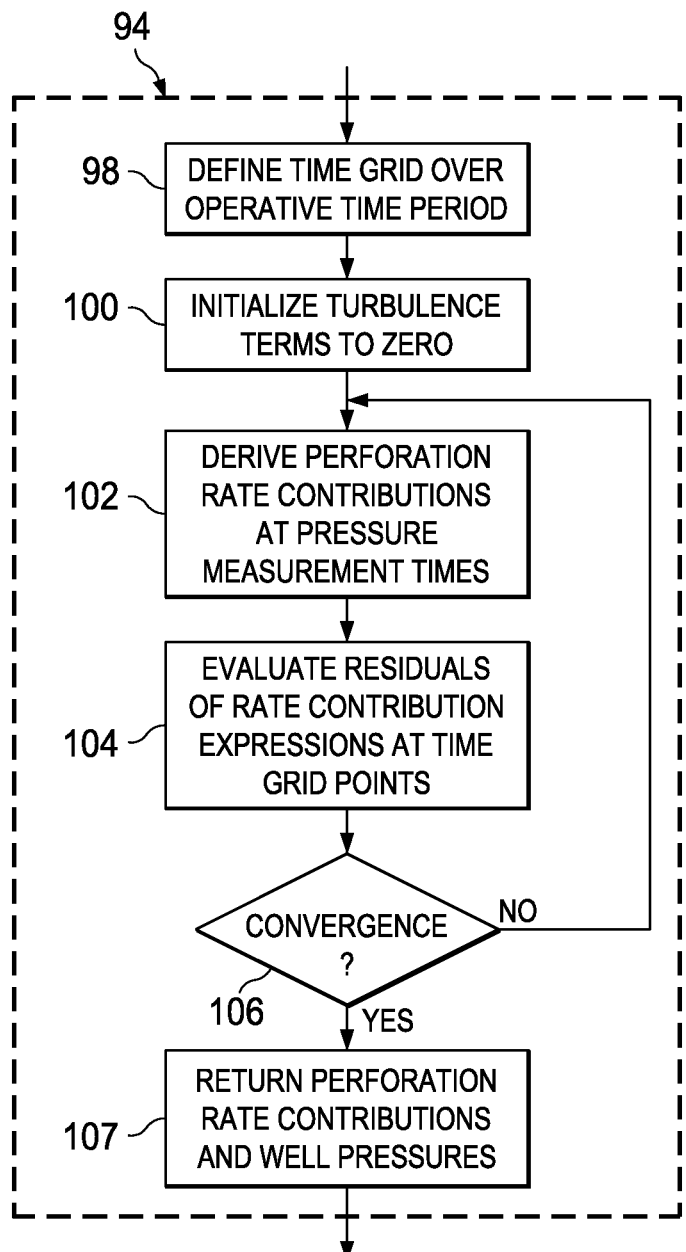

As shown in FIG. 9b, perforation-level superposition process 94 begins with process 98, in which system 20 defines the time grid for which reconstruction of perforation rate functions is to be performed, for example by way of time nodes corresponding to the times at which downhole pressure measurements were obtained (process 33 of FIG. 3). As mentioned above, this time grid has to be synchronized with the times of well rate changes, and it should also have a sufficient number of time nodes to accurately reconstruct the rate changes of the after-flow associated with wellbore storage effect. Prior to the iterative procedure, system 20 executes process 100 to initialize to zero the "previous iteration" perforation rate functions, which are reflective of turbulence near the wellbore. Next, iterative procedure 102 is applied to equation (18) and the linearized equation (23a):

$$\sum_{j \subset w} q_j(t) - \frac{24C_w}{B} \frac{dp_i(t)}{dt} = Q_w(t) \qquad (18)$$

$$\sum_{j=0}^{n} \int_{0}^{t} \frac{dP_{ij}^{prf}(\tau)}{d\tau} q_j(t-\tau)d\tau + \overline{D}q_i^2(t) - \qquad (23a)$$

$$\sum_{j=0}^{n} \int_{0}^{t} \frac{dP_{i+1,j}^{prf}(\tau)}{d\tau} q_j(t-\tau)d\tau - \overline{D}q'_{i+1}q_{i+1} = 0$$

to reconcile the perforation rate contributions $q_j(t)$ at each node $t_k$ of the time grid defined in process 98, using the measured well flow rates and bottomhole pressure measurements as obtained in processes 31, 33 and as retrieved from library 32 or some other memory resource in system 20. It is contemplated that process 102 can be performed by conventional approaches of minimizing an objective function, such as the sum of squares of residual errors in equations (18) and (23a), to produce updated rates of well perforations at the times at which pressure measurements were made, and are stored in the appropriate memory resource of system 20, for example replacing the perforation rate values from the previous iterations. In process 104, these updated rates are compared against the perforation rates calculated in the previous iteration of process 102, and the difference from one iteration to another is quantified for purposes of determining whether a convergence criterion has been satisfied (decision 106). If not (decision 106 is no), another iteration of processes 102, 104, and decision 106, is executed by system 20. Upon convergence being reached (decision 106 is yes), the rate contributions of individual well perforations $q_k(t)$ are settled to a solution, and the bottomhole pressures $p_j(t)$ of the wells at these rate contributions are made available, in process 107. Perforation-level superposition process 94 is complete.

The above description of perforation-level superposition process 94 is presented in terms of a single well case, for clarity of the description. In practice, multiple wells will be producing and will be included in the model. In such a multi-well case, the well constraints defined by equations (18) and (18a) are enforced for all the wells involved at the same time. It is contemplated that this will be implemented inside of process 102 where the objective function is generalized to include the corresponding squares of residual errors of the constraint equations for all wells. In either case, it is contemplated that those skilled in the art having reference to this specification will be readily able to implement the appropriate computer program instructions for execution by the computational resources of system 20, in order to effect this perforation-level superposition.

Again, upon completion of perforation-level superposition process 94 and the remainder of superposition process 42, downhole pressures are computed and retained in the time domain, and can be directly compared (see process 44 of FIG. 3) with pressure measurements obtained by pressure gauges and transducers that are installed downhole in the various wells. As described above, such a comparison enables evaluation of the accuracy of the reservoir model, and can lend insight into the adjustment of that model that may be required to improve its accuracy with real-time measurements.

As evident from the foregoing, other information beyond downhole pressure is also available from the model. In particular, the flow rates from individual perforations within a multiple-perforation well are necessarily calculated according to this embodiment of the invention, and provide important information to the user or operator of the production field regarding how to allocate measured well production among the various formations. These and other types of information are either generated by the model directly, or are easily available by way of conventional calculations and techniques, as known in the art.

An Applied Example

Referring now to FIGS. 10a through 10i, an example of the application of a method according to an embodiment of the invention will now be described. As will be evident from this example, the method according to embodiments of this invention is very useful in rapidly and interactively developing and evaluating a reservoir model by simulating the behavior of that model in order to derive, among other things, a simulation of the downhole pressure over time at each well, for comparison with the massive amount of downhole pressure measurement data over time that is typically available from modern production fields. In this way, a reservoir model can be developed that is sufficiently accurate so that its simulated downhole pressure behavior resembles that actually measured in practice. The model is then available for use in accurately deriving information regarding the reservoir behavior relative to parameters that are not directly measured, including perforation-level flow rates over time, and for use in simulating proposed reservoir development actions such as secondary recovery processes, well placement, and the like. The overall development and exploitation of the reservoir can therefore be intelligently optimized.

Figure 10A:
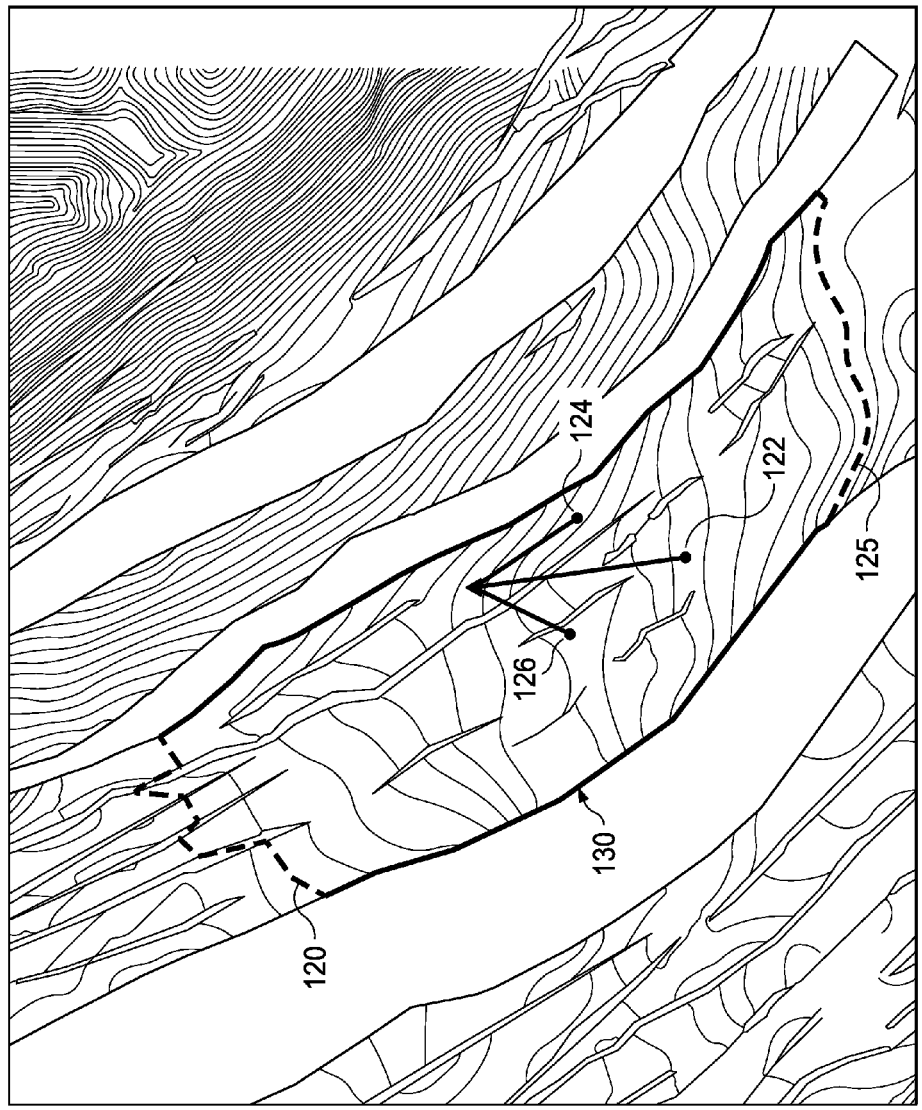
Figure 10B:
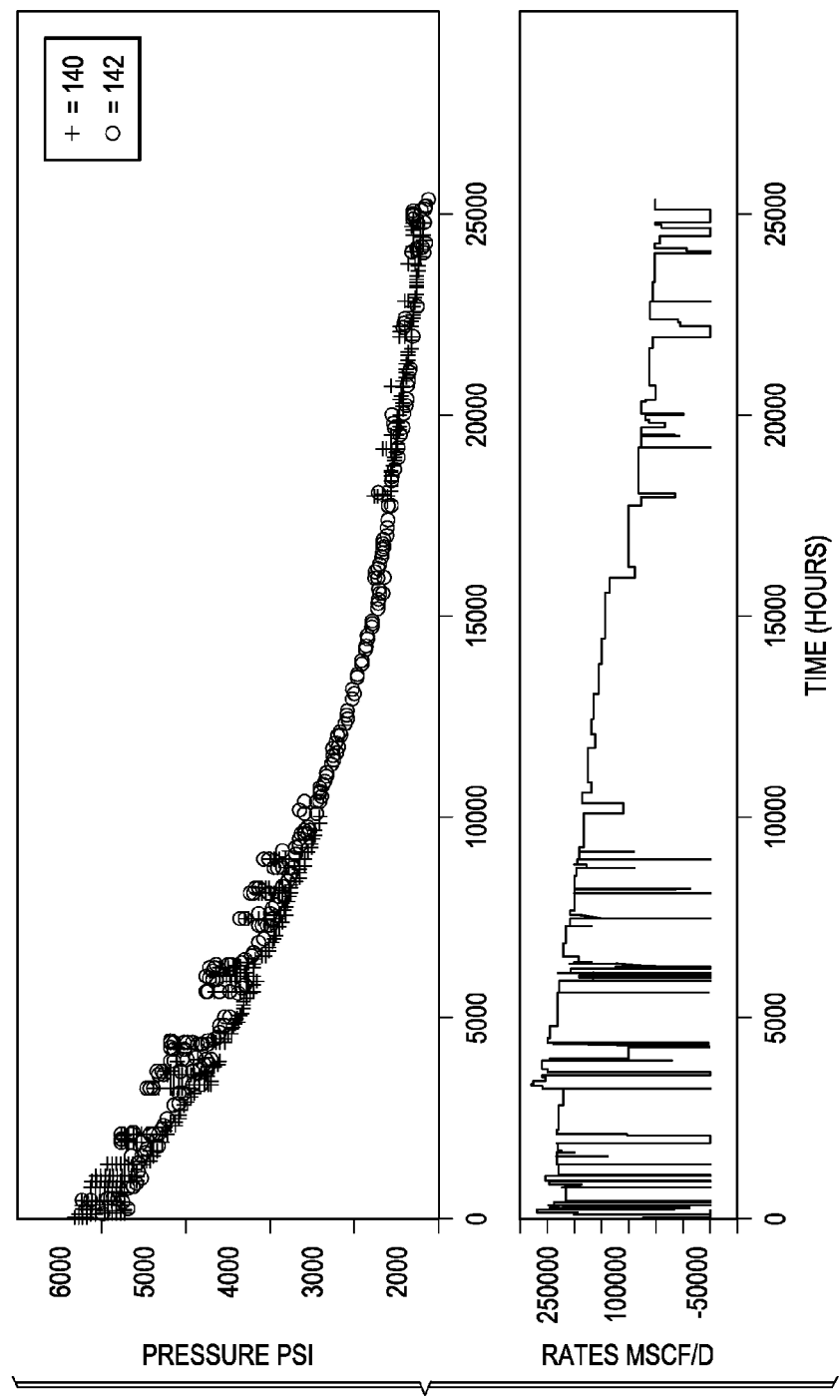
Figure 10C:
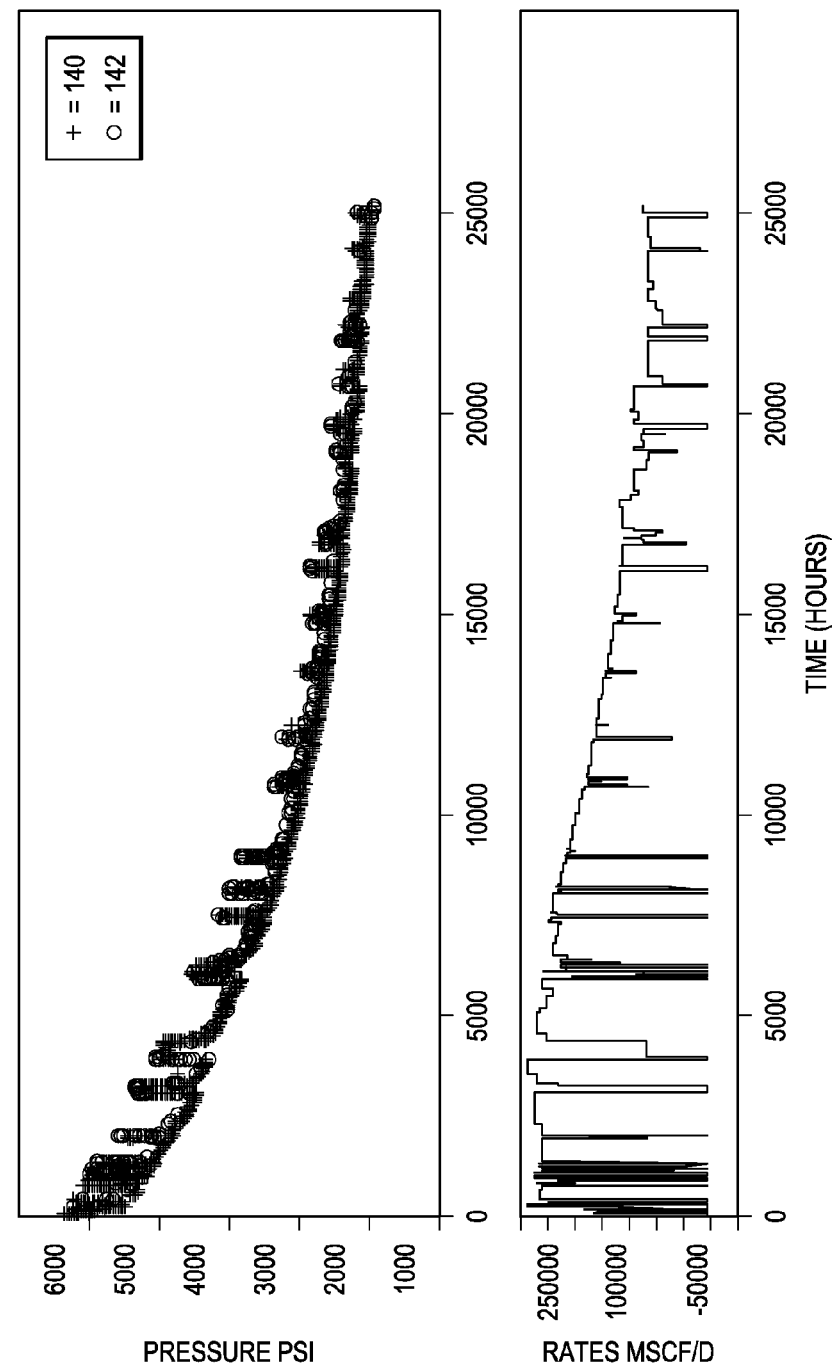
Figure 10D:
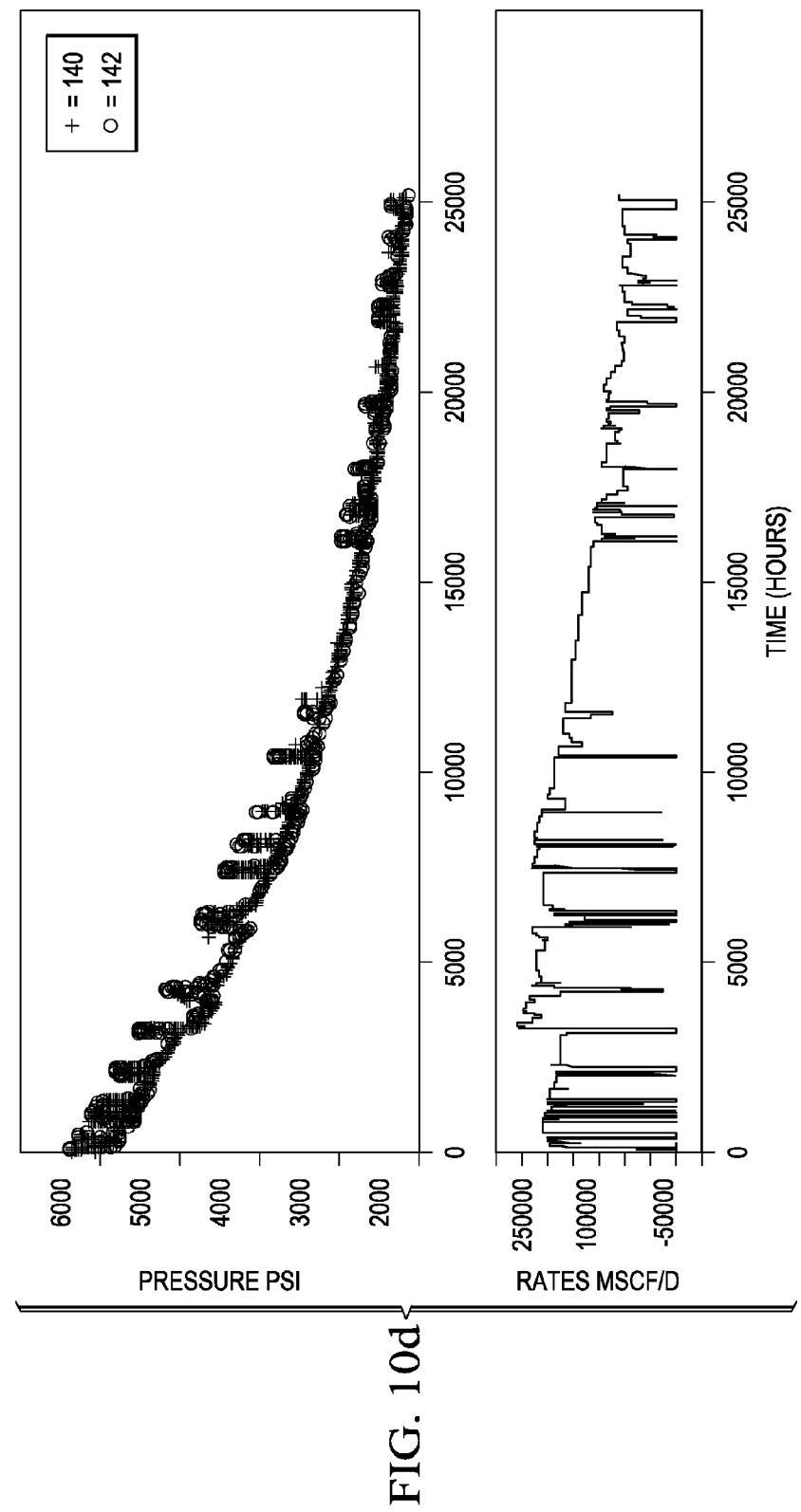

FIG. 10a is an example of a map, in plan view, of an offshore gas field 130 that includes three producing wells 122, 124, 126. The map of FIG. 10a is based on seismic prospecting and other conventional techniques. In this example, major faults on the east and west sides constrain the reservoir area to a relatively narrow strip. This reservoir formation pinches out to the south, with boundary line 125 indicating an initial estimate of the extent of field 130 in that direction. It is not clear how far that field 130 extends in the northern direction, and whether it is attached to an aquifer on this side beyond boundary line 120, which indicates the expected boundary of the reservoir in the northern direction. For purposes of this example, the reservoir engineering staff has some level of uncertainty about the size of the reservoir and of the volume of gas initially in place. The map of FIG. 10a illustrates a number of minor faults located within the reservoir area of field 130. These faults are aligned along the reservoir and it is not clear whether these faults are sealing, nor is it clear whether these minor faults divide the reservoir into smaller isolated compartments. Each of wells 122, 124, 126 in this field 130 is equipped with a downhole permanent pressure gauge, for which system 20 in this example has retained, in library 32, data corresponding to downhole pressure measurements obtained during the entire production history of slightly over three years. Records of the pressure data for well 122 over this time are presented by data points 140 in FIG. 10b, and the rate data corresponding to those pressure data are shown in the lower portion of FIG. 10b. Similarly, records of the pressure data for wells 124, 126 are over this time are presented by data points 140 in FIGS. 10c, 10d, respectively, with the corresponding rate data shown in the lower portion of each of those Figures. These data represented by data points 140 correspond to the data acquired in processes 31, 33 described above relative to FIG. 3, as processed in the conventional manner in process 35.

Figure 10E:
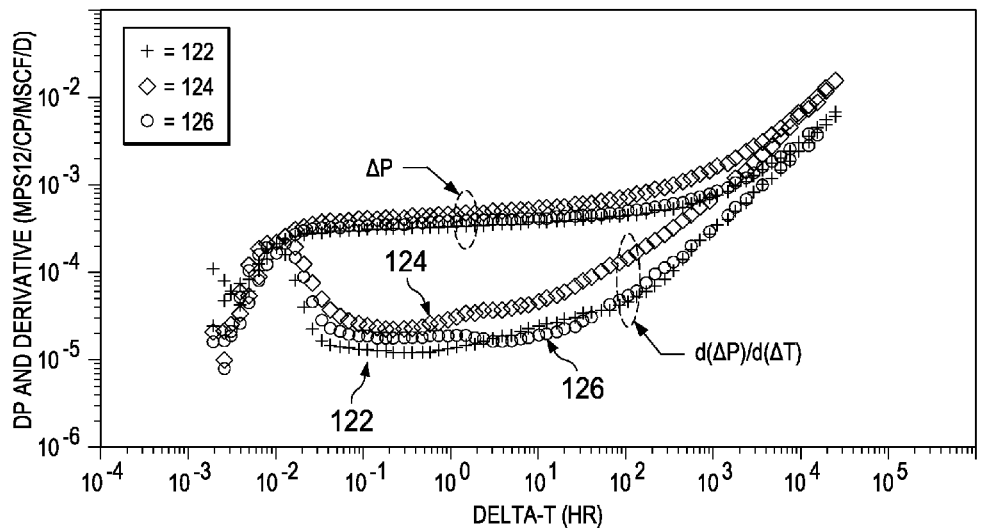

According to this embodiment of the invention, multi-well pressure-rate deconvolution process 37 is applied to the pressure and rate data of wells 122, 124, 126, to produce deconvolved drawdown pressure responses. FIG. 10e illustrates the pressure change and pressure derivative plots for wells 122, 124, 126, as produced by such multi-well deconvolution. As known in the art, the time axis of FIG. 10e is superposition time from the time of an event. Multi-well deconvolution process 37 essentially converts the original rate and pressure data over time into an equivalent, but much simpler, form of unit-rate pressure responses. Each of these responses represents the pressure behavior of the corresponding well in the case that this well would be the only producing well in the field, and is producing at constant unit rate. FIG. 10e presents these responses in the form of what is known in the art of well test analysis as derivative plots. Each of the responses on derivative plot is presented by two curves: a Δp curve, and a derivative curve. The lower three curves in FIG. 10e are the derivative curves for each of the three wells 122, 124, 126. The shapes of these curves reveal very important information about reservoir properties as "viewed" by each well.

In the plots of FIG. 10e, the horizontal derivative behavior that develops at early time following a wellbore storage dominated period reflects the permeability-thickness characteristic of the reservoir formation in the vicinity of the respective well. According to FIG. 10e, the permeability-thickness is larger in the vicinity of well 122 and noticeably smaller near well 124. Later in superposition time, the derivatives begin to increase and eventually develop a linear trend with unit slope at later time. This increasing derivative behavior at late time is caused by reservoir boundaries and internal barriers to flow. Each of the derivative curves in FIG. 10e reflects the same reservoir boundary and barrier configuration as it is "viewed" by each well. A unit-slope asymptotic trend at late time is interpreted as the sign of a closed reservoir. Hence, one can conclude that each of wells 122, 124, 126 produces from a closed reservoir compartment, as each exhibits an asymptotic unit-slope in its derivative curve. The fact that the derivatives for well 122 and well 126 converge to the same trend is an indication that these wells produce from the same reservoir compartment. The unit-slope derivative trend at late time for well 124 develops earlier in time, which serves as evidence that well 124 produces from a separate reservoir compartment of smaller size than the others. This conclusion is supported in some way by the reservoir map in FIG. 10a, which shows a large fault that runs along the reservoir over most of its length. One can conclude that the dynamic pressure behavior in wells 122, 124, 126 during the production history of field 130 indicates that this fault is sealing and that the fault divides the reservoir in two separate compartments.

In this example of an embodiment of the invention, as carried out according to FIG. 3, the map of FIG. 10a along with the data acquired over time and processed by way of process 35 and multi-well deconvolution process 37, allow the user of system 20 to create an initial reservoir model, in process 38. FIG. 10f illustrates the result of such a reservoir model generated via process 38, as directed to the reservoir portion of field 130 of FIG. 10a and including the locations of wells 122, 124, 126. In this example, the reservoir area is divided into seven regions 130a through 130g; in the judgment of the reservoir engineer at this stage of the process, this number of regions is selected to provide the necessary flexibility in representing the variation of permeability-thickness characteristics across field 130 that are indicated by the drawdown pressure responses from multi-well deconvolution process 37 (FIG. 10e). Internal boundaries 133, 135, 137, 139, 141 in the model of FIG. 10f illustrate connections between regions 130a through 130g. As described above, for those points at which three or more regions intersect (e.g., the point at which regions 130b, 130c, 130e intersect), an infinitesimally small triangle and the appropriate two-region connection nodes can be created, to avoid the underspecified condition of three reservoirs meeting at that point.

Figure 10G:
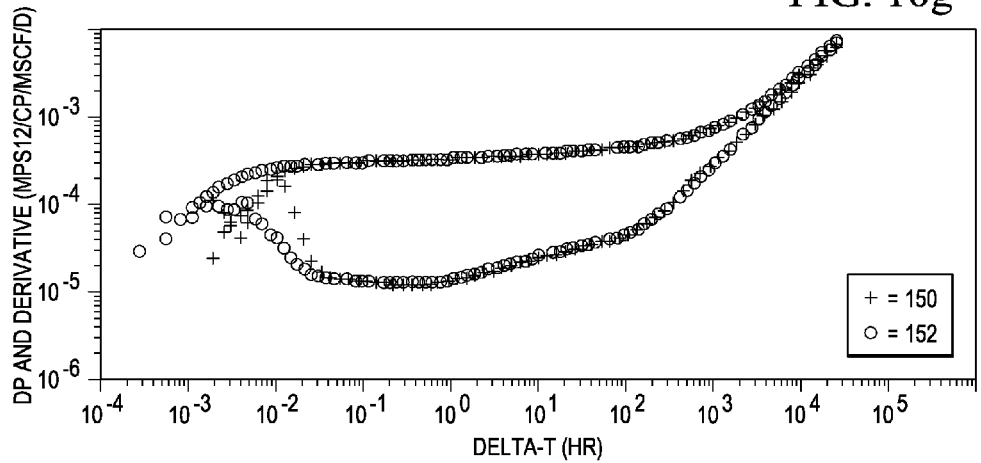
Figure 10H:
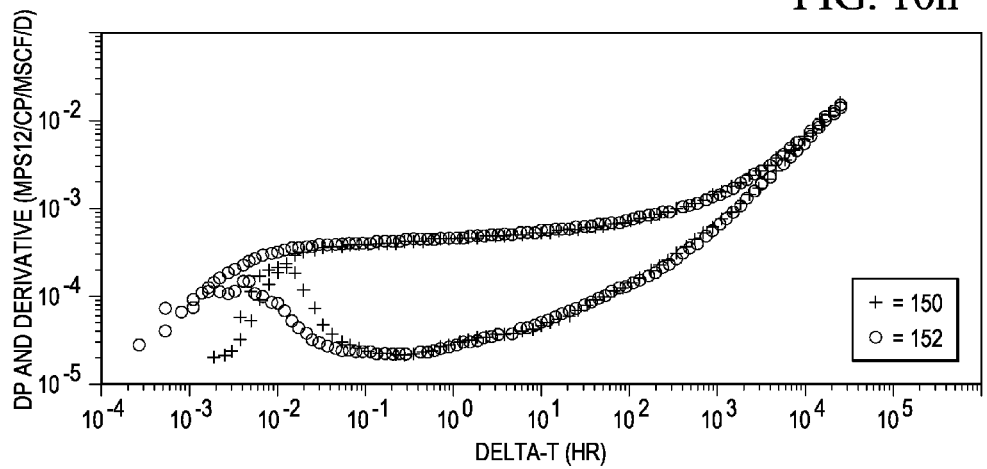
Figure 10I:
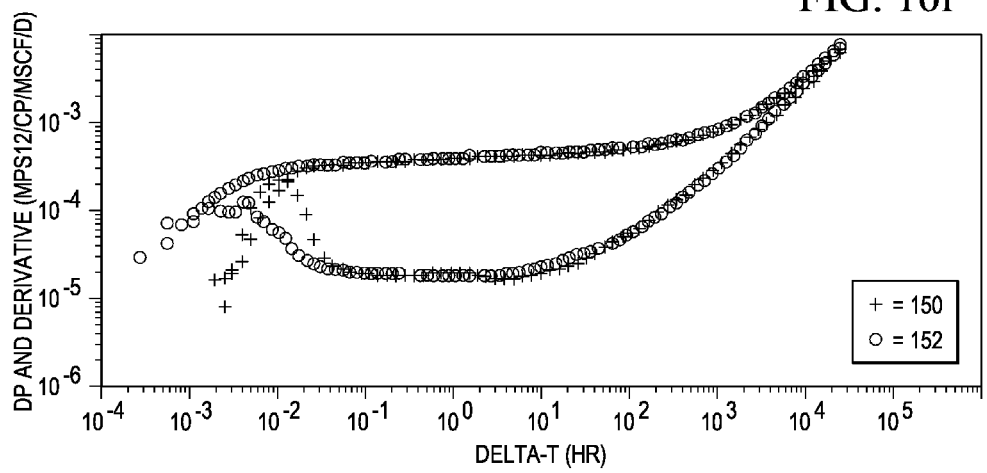

As described above relative to FIG. 3, after calculation of the pressure interference responses in process 40, unit-rate drawdown pressure responses are generated for each of wells 122, 124, 126, and are compared against those from multi-well deconvolution process 38, in decision 41. In the example of the model illustrated in FIG. 10f, the simulated unit-rate drawdown responses for wells 122, 124, 126 are shown in FIGS. 10g, 10h, 10i, respectively, by way of data points 152; the drawdown responses from multi-well deconvolution process 38 for these wells are shown in FIGS. 10g, 10h, 10i by data points 150. The very early pressure behavior, in superposition time, is dominated by wellbore storage, and therefore has no bearing on the model; as such, no special attempt need be made to accurately reproduce this behavior in the reservoir model. By application of adjustment of the model via decision 41 and process 46, and repetition of process 40 upon the adjusted model, matching of the transient responses can be performed. This ability of the model to honor the pressure responses in each of wells 122, 124, 126 is an indication that the model correctly represents the reservoir architecture and its plumbing. The reservoir engineer or other user thus has confidence that the model developed in process 38, as modified by process 46, represents the major behavioral characteristics of the reservoir.

As described above, the next step in the analysis according to embodiments of this invention is the superposition of the simulated responses with actual well rates, and construction of the pressure solution for entire production history for each of the wells, as performed in superposition process 42 of FIG.

3. The results of these computations for wells 122, 124, 126 are presented in FIGS. 10b, 10c, 10d, respectively, by data points 142. Comparison of these simulated results with the actual pressure measurements shown in FIGS. 10b, 10c, 10d by data points 140, can then be performed in process 44. In this example, to the extent that the simulated pressure behavior during production periods mismatched the actual data, adjustment of the turbulence coefficients in the reservoir model for each of wells 122, 124, 126 was performed, in the iteration loop of processes 44 and 46 of FIG. 3. As described above, the particular model parameters that are to be modified in process 46 in light of comparison process 44, and the extent and nature of that modification, is within the judgment of the reservoir engineer or other user of system 20.

In this example of FIGS. 10a through 10i, the analysis of dynamic pressure behavior during the entire production history of the field confirms that the reservoir model developed in this example is consistent with the reservoir size and shape as it is defined by the map. Various conclusions can be drawn from this model. For example, in this case, it is unlikely that the reservoir is attached to an aquifer because there is no indication of additional pressure support that would result from aquifer.

Additional processing, such as the allocation of rate history among the various perforations within each of wells 122, 124, 126 can now be performed by the user, if desired. The verified model can now also be used to evaluate potential reservoir development ideas, with a high level of confidence that the model is representative of the sub-surface conditions.

IN CONCLUSION

In conclusion, it is contemplated that embodiments of this invention will provide an efficient computerized system and method for allowing reservoir engineers and other personnel to interactively develop and validate a reservoir model, with the validation of the model being made relative to the vast amount of downhole well measurements that are currently available in modern oil and gas production fields. Indeed, it is contemplated that embodiments of this invention will enable that interactive model development and validation over the long production times, and complex changes in flow rates, that are actually experienced in real-world production fields. Embodiments of this invention are contemplated to be useful even for reservoirs that are relatively complex, including formations that are interrupted and connected by way of faults and other sub-surface complications. These embodiments of the invention are further contemplated to be able to account for such complex effects as wellbore turbulence, cross-flow among formations that have differing initial pressures, and the like.

Those skilled in the art will recognize, from the foregoing description of the theory of operation of the invention, that the reservoir modeling and verification process according to embodiments of the invention will be better suited for some applications. More specifically, it is contemplated that the accuracy of this approach to modeling and verification of the reservoir will be best achieved for relatively young reservoirs (i.e., in early stages of production), and more specifically for such reservoirs that produce in the state of a single hydrocarbon phase flow in the reservoir (i.e., either oil or gas, but not both). It is contemplated that the modeling and verification approach according to embodiments of this invention can provide important information regarding reservoir description that could be used for simulation of later stages in the reservoir life when multiphase flow conditions develop by using the simulation tools that are appropriate for this condition.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of interactively deriving and validating a computerized model of a hydrocarbon reservoir with downhole measurements from one or more wells in the earth, comprising:
   receiving data corresponding to downhole pressure measurements acquired over time at a wellbore of at least one well of interest, and corresponding flow rates from a plurality of wells including the well of interest;
   defining a reservoir model corresponding to inputs from a user identifying attributes of a hydrocarbon reservoir, the attributes comprising shapes and properties of formation regions, connections between formation regions, locations of wells into the formation regions, boundary nodes for each formation region, and initial pressures for each formation region;
   operating a computer to evaluate pressure interference responses among a plurality of wells in the reservoir by solving a fluid flow problem for a structure corresponding to the identified reservoir attributes, comprising the steps of:
      defining a system of equations comprised of equations of pressure and normal pressure derivative at each boundary node of each formation region and at each well within each formation region, and of merging conditions at boundary nodes that are in common with at least two adjacent formation regions in the reservoir model; and
      for each of the plurality of wells, solving the system of equations to determine a pressure response at that well in response to unit flow rate at one of the plurality of wells;
   operating a computer to superpose the data corresponding to measured flow rates from the plurality of wells to the evaluated pressure interference responses to calculate a simulated downhole pressure at the at least one well of interest over time;
   for at least one well of interest, comparing the simulated downhole pressure at the well of interest over time with data corresponding to the downhole pressure measurements acquired over time at that well of interest;
   after the comparing step, receiving inputs from a user modifying the reservoir attributes, the modified attribute corresponding to at least one of a shape of a formation region or a connection between formation regions; and
   then repeating the operating and comparing steps for the structure corresponding to the modified reservoir attributes.

2. A method of interactively deriving and validating a computerized model of a hydrocarbon reservoir with downhole measurements from one or more wells in the earth, comprising:
   receiving data corresponding to downhole pressure measurements acquired over time at a wellbore of at least one well of interest, and corresponding flow rates from a plurality of wells including the well of interest;

operating a computer to perform multi-well pressure-rate deconvolution on the received downhole pressure and flow rate data to construct a deconvolved pressure interference response to constant unit-rate production at each of the plurality of wells; and receiving inputs from a user identifying attributes of a hydrocarbon reservoir, the attributes comprising shapes and properties of formation regions, connections between formation regions, and locations of wells into the formation regions;

operating a computer to evaluate pressure interference responses among a plurality of wells in the reservoir by solving a fluid flow problem for a structure corresponding to the identified reservoir attributes;

iteratively modifying the reservoir attributes by:
comparing the evaluated pressure interference responses with corresponding deconvolved pressure responses;
responsive to the comparing of the evaluated pressure interference responses and corresponding deconvolved pressure interference responses, receiving inputs from a user modifying reservoir attributes corresponding to at least one of a shape of a formation region or a connection between formation regions; and
then repeating the steps of operating the computer to evaluate pressure interference responses and comparing the evaluated pressure interference responses with corresponding deconvolved pressure interference responses;

then operating a computer to superpose the data corresponding to measured flow rates from the plurality of wells to the evaluated pressure interference responses to calculate a simulated downhole pressure at the at least one well of interest over time;

for at least one well of interest, comparing the simulated downhole pressure at the well of interest over time with data corresponding to the downhole pressure measurements acquired over time at that well of interest;

after the comparing step, receiving inputs from a user modifying the reservoir attributes, the modified attribute corresponding to at least one of a shape of a formation region or a connection between formation regions; and then repeating the operating and comparing steps for the structure corresponding to the modified reservoir attributes.

3. The method of claim 2, wherein the step of iteratively modifying the reservoir attributes is performed until a variance between the evaluated pressure interference responses and corresponding deconvolved interference pressure responses is within a tolerance criterion.

4. The method of claim 1, wherein the identified reservoir attributes further comprise a plurality of perforations, each perforation corresponding to an intersection of one of the wells and one of the formation regions, at least one of the wells including the well of interest having more than one perforation;

wherein the step of operating the computer to evaluate pressure interference responses comprises calculating a pressure interference response at each perforation in response to a unit flow rate at each perforation by:
defining a system of equations comprised of equations of pressure and normal pressure derivative at each boundary node of each formation region and at each perforation within each formation region, and of merging conditions at boundary nodes that are in common with at least two adjacent formation regions in the reservoir model; and
for each of the plurality of perforations, solving the system of equations to determine a pressure response at that perforation in response to unit flow rate at one of the plurality of perforations.

5. The method of claim 4, wherein the step of operating the computer to evaluate pressure interference responses further comprises:
from the calculated pressure interference responses, for each of a plurality of perforations, deriving a well-level pressure interference response to a unit flow rate from each of the plurality of wells.

6. The method of claim 5, wherein the step of operating a computer to superpose the data comprises:
convolving the measured flow rates from the plurality of wells with the well-level pressure interference responses to derive a predicted pressure at the well of interest.

7. The method of claim 5, further comprising:
from the calculated pressure interference responses, for each of a plurality of perforations, deriving a well-level rate response to a unit flow rate from each of the plurality of wells; and
convolving the measured flow rates from the plurality of wells with the well-level rate responses to derive perforation flow rates for each of the perforations at the well of interest.

8. A computer system, comprising:
an interface for receiving measurement data corresponding to measurements from one or more hydrocarbon wells;
an input device for receiving inputs from a user of the system;
one or more central processing units coupled to the interface and to the input device, for executing program instructions; and
program memory, coupled to the one or more central processing units, for storing a computer program including program instructions that, when executed by the one or more central processing units, cause the computer system to perform a plurality of operations interactively deriving and validating a computerized model of a hydrocarbon reservoir with downhole measurements from one or more wells in the earth, the plurality of operations comprising:
receiving measurement data via the interface, the measurement data corresponding to downhole pressure measurements acquired over time at a wellbore of at least one well of interest, and corresponding to flow rates from a plurality of wells including the well of interest;
defining a reservoir model corresponding to inputs from a user identifying attributes of a hydrocarbon reservoir, the attributes comprising shapes and properties of formation regions, connections between formation regions, locations of wells into the formation regions, boundary nodes for each formation region, and initial pressures for each formation region;
evaluating pressure interference responses among a plurality of wells in the reservoir by solving a fluid flow problem for a structure corresponding to the identified reservoir attributes, comprising the operations of:
defining a system of equations comprised of equations of pressure and normal pressure derivative at each boundary node of each formation region and at each well within each formation region, and of merging conditions at boundary nodes that are in common with at least two adjacent formation regions in the reservoir model; and for each of the plurality of wells, solving the system of equations to determine a pressure response at that well in response to unit flow rate at one of the plurality of wells;

superposing the data corresponding to measured flow rates from the plurality of wells to the evaluated pressure interference responses to calculate a simulated downhole pressure at the at least one well of interest over time;

for at least one well of interest, comparing the simulated downhole pressure at the well of interest over time with data corresponding to the downhole pressure measurements acquired over time at that well of interest;

after the comparing operation, receiving inputs from a user modifying the reservoir attributes, the modified attribute corresponding to at least one of a shape of a formation region or a connection between formation regions; and then repeating the evaluating, superposing, and comparing operations for the structure corresponding to the modified reservoir attributes.

9. A computer system of comprising:

an interface for receiving measurement data corresponding to measurements from one or more hydrocarbon wells;

an input device for receiving inputs from a user of the system;

one or more central processing units coupled to the interface and to the input device, for executing program instructions; and program memory, coupled to the one or more central processing units, for storing a computer program including program instructions that, when executed by the one or more central processing units, cause the computer system to perform a plurality of operations interactively deriving and validating a computerized model of a hydrocarbon reservoir with downhole measurements from one or more wells in the earth, the plurality of operations comprising:

receiving measurement data via the interface, the measurement data corresponding to downhole pressure measurements acquired over time at a wellbore of at least one well of interest, and corresponding to flow rates from a plurality of wells including the well of interest;

performing multi-well pressure-rate deconvolution on the received downhole pressure and flow rate data to construct a deconvolved pressure interference response to constant unit-rate production at each of the plurality of wells;

receiving measurement data via the interface, the measurement data corresponding to downhole pressure measurements acquired over time at a wellbore of at least one well of interest, and corresponding to flow rates from a plurality of wells including the well of interest;

receiving inputs from a user identifying attributes of a hydrocarbon reservoir, the attributes comprising shapes and properties of formation regions, connections between formation regions, and locations of wells into the formation regions;

evaluating pressure interference responses among a plurality of wells in the reservoir by solving a fluid flow problem for a structure corresponding to the identified reservoir attributes;

iteratively modifying the reservoir attributes by:

comparing the evaluated pressure interference responses with corresponding deconvolved pressure interference responses;

responsive to the comparing of the evaluated pressure interference responses and corresponding deconvolved pressure interference responses, receiving inputs from a user modifying reservoir attributes corresponding to at least one of a shape of a formation region or a connection between formation regions; and then repeating the evaluating of pressure interference responses and comparing the evaluated pressure responses with corresponding deconvolved pressure interference responses;

then superposing the data corresponding to measured flow rates from the plurality of wells to the evaluated pressure interference responses to calculate a simulated downhole pressure at the at least one well of interest over time;

for at least one well of interest, comparing the simulated downhole pressure at the well of interest over time with data corresponding to the downhole pressure measurements acquired over time at that well of interest;

after the comparing operation, receiving inputs from a user modifying the reservoir attributes, the modified attribute corresponding to at least one of a shape of a formation region or a connection between formation regions; and then repeating the operating and comparing operations for the structure corresponding to the modified reservoir attributes.

10. The system of claim 9, wherein the evaluating of pressure interference responses and comparing the evaluated pressure interference responses with corresponding deconvolved pressure interference responses is performed until a variance between the evaluated pressure interference responses and corresponding deconvolved pressure interference responses is within a tolerance criterion.

11. The system of claim 8, wherein the identified reservoir attributes further comprise a plurality of perforations, each perforation corresponding to an intersection of one of the wells and one of the formation regions, at least one of the wells including the well of interest having more than one perforation;

wherein the evaluating operation comprises calculating a pressure interference response at each perforation in response to a unit flow rate at each perforation by:

defining a system of equations comprised of equations of pressure and normal pressure derivative at each boundary node of each formation region and at each perforation within each formation region, and of merging conditions at boundary nodes that are in common with at least two adjacent formation regions in the reservoir model; and for each of the plurality of perforations, solving the system of equations to determine a pressure response at that perforation in response to unit flow rate at one of the plurality of perforations.

12. The system of claim 11, wherein the evaluating operation further comprises:

from the calculated pressure interference responses, for each of a plurality of perforations, deriving a well-level pressure interference response to a unit flow rate from each of the plurality of wells.

13. The system of claim 12, wherein the superposing operation comprises:
  convolving the measured flow rates from the plurality of wells with the well-level pressure interference responses to derive a predicted pressure at the well of interest.

14. The system of claim 12, wherein the plurality of operations further comprises:
  from the calculated pressure interference responses, for each of a plurality of perforations, deriving a well-level rate response to a unit flow rate from each of the plurality of wells; and
  convolving the measured flow rates from the plurality of wells with the well-level rate responses to derive perforation flow rates for each of the perforations at the well of interest.

15. A non-transitory machine-readable storage medium storing a computer program that, when executed on a computer system, causes the computer system to perform a plurality of operations interactively deriving and validating a computerized model of a hydrocarbon reservoir with downhole measurements from one or more wells in the earth, the plurality of operations comprising:
  receiving measurement data corresponding to downhole pressure measurements acquired over time at a wellbore of at least one well of interest, and corresponding to flow rates from a plurality of wells including the well of interest;
  defining a reservoir model corresponding to inputs from a user identifying attributes of a hydrocarbon reservoir, the attributes comprising shapes and properties of formation regions, connections between formation regions, and locations of wells into the formation regions;
  evaluating pressure interference responses among a plurality of wells in the reservoir by solving a fluid flow problem for a structure corresponding to the identified reservoir attributes, comprising the operations of:
    defining a system of equations comprised of equations of pressure and normal pressure derivative at each boundary node of each formation region and at each well within each formation region, and of merging conditions at boundary nodes that are in common with at least two adjacent formation regions in the reservoir model; and
    for each of the plurality of wells, solving the system of equations to determine a pressure response at that well in response to unit flow rate at one of the plurality of wells;
  superposing the data corresponding to measured flow rates from the plurality of wells to the evaluated pressure interference responses to calculate a simulated downhole pressure at the at least one well of interest over time;
  for at least one well of interest, comparing the simulated downhole pressure at the well of interest over time with data corresponding to the downhole pressure measurements acquired over time at that well of interest;
  after the comparing operation, receiving inputs from a user modifying the reservoir attributes, the modified attribute corresponding to at least one of a shape of a formation region or a connection between formation regions; and
  then repeating the evaluating, superposing, and comparing operations for the structure corresponding to the modified reservoir attributes.

16. A non-transitory machine-readable storage medium storing a computer program that, when executed on a computer system, causes the computer system to perform a plurality of operations interactively deriving and validating a computerized model of a hydrocarbon reservoir with downhole measurements from one or more wells in the earth, the plurality of operations comprising:
  receiving measurement data via the interface, the measurement data corresponding to downhole pressure measurements acquired over time at a wellbore of at least one well of interest, and corresponding to flow rates from a plurality of wells including the well of interest;
  performing multi-well pressure-rate deconvolution on the received downhole pressure and flow rate data to construct a deconvolved pressure interference response to constant unit-rate production at each of the plurality of wells;
  receiving measurement data corresponding to downhole pressure measurements acquired over time at a wellbore of at least one well of interest, and corresponding to flow rates from a plurality of wells including the well of interest;
  receiving inputs from a user identifying attributes of a hydrocarbon reservoir, the attributes comprising shapes and properties of formation regions, connections between formation regions, and locations of wells into the formation regions;
  evaluating pressure interference responses among a plurality of wells in the reservoir by solving a fluid flow problem for a structure corresponding to the identified reservoir attributes;
  iteratively modifying the reservoir attributes by:
    comparing the evaluated pressure interference responses with corresponding deconvolved pressure interference responses;
    responsive to the comparing of the evaluated pressure interference responses and corresponding deconvolved pressure interference responses, receiving inputs from a user modifying reservoir attributes corresponding to at least one of a shape of a formation region or a connection between formation regions; and
    then repeating the evaluating of pressure interference responses and comparing the evaluated pressure interference responses with corresponding deconvolved pressure interference responses;
  then superposing the data corresponding to measured flow rates from the plurality of wells to the evaluated pressure interference responses to calculate a simulated downhole pressure at the at least one well of interest over time;
  for at least one well of interest, comparing the simulated downhole pressure at the well of interest over time with data corresponding to the downhole pressure measurements acquired over time at that well of interest;
  after the comparing operation, receiving inputs from a user modifying the reservoir attributes, the modified attribute corresponding to at least one of a shape of a formation region or a connection between formation regions; and
  then repeating the operating and comparing operations for the structure corresponding to the modified reservoir attributes.

17. The non-transitory machine-readable storage medium of claim 16, wherein the evaluating of pressure interference responses and comparing the evaluated pressure interference responses with corresponding deconvolved pressure interference responses is performed until a variance between the evaluated pressure interference responses and corresponding deconvolved pressure interference responses is within a tolerance criterion.

18. The non-transitory machine-readable storage medium of claim 15, wherein the identified reservoir attributes further comprise a plurality of perforations, each perforation corresponding to an intersection of one of the wells and one of the formation regions, at least one of the wells including the well of interest having more than one perforation;

wherein the evaluating operation comprises calculating a pressure interference response at each perforation in response to a unit flow rate at each perforation by:

defining a system of equations comprised of equations of pressure and normal pressure derivative at each boundary node of each formation region and at each perforation within each formation region, and of merging conditions at boundary nodes that are in common with at least two adjacent formation regions in the reservoir model; and for each of the plurality of perforations, solving the system of equations to determine a pressure response at that perforation in response to unit flow rate at one of the plurality of perforations.

19. The non-transitory machine-readable storage medium of claim 18, wherein the evaluating operation further comprises:

from the calculated pressure interference responses, for each of a plurality of perforations, deriving a well-level pressure interference response to a unit flow rate from each of the plurality of wells.

20. The non-transitory machine-readable storage medium of claim 19, wherein the superposing operation comprises:

convolving the measured flow rates from the plurality of wells with the well-level pressure interference responses to derive a predicted pressure at the well of interest.

21. The non-transitory machine-readable storage medium of claim 19, wherein the plurality of operations further comprises:

from the calculated pressure interference responses, for each of a plurality of perforations, deriving a well-level rate response to a unit flow rate from each of the plurality of wells; and convolving the measured flow rates from the plurality of wells with the well-level rate responses to derive perforation flow rates for each of the perforations at the well of interest.

* * * * *